(12) United States Patent
Eitschberger et al.

(10) Patent No.: US 12,332,034 B2
(45) Date of Patent: *Jun. 17, 2025

(54) INITIATOR HEAD WITH CIRCUIT BOARD

(71) Applicant: DynaEnergetics Europe GmbH, Troisdorf (DE)

(72) Inventors: Christian Eitschberger, Munich (DE); Sascha Thieltges, Siegburg (DE); Dimitri Riesen, Troisdorf (DE)

(73) Assignee: DynaEnergetics Europe GmbH, Troisdorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/590,253

(22) Filed: Feb. 28, 2024

(65) Prior Publication Data

US 2024/0200915 A1 Jun. 20, 2024

Related U.S. Application Data

(63) Continuation of application No. 17/783,065, filed as application No. PCT/EP2020/085622 on Dec. 10, 2020, now Pat. No. 11,946,728.
(Continued)

(51) Int. Cl.
 *F42B 3/08* (2006.01)
 *H05K 5/00* (2025.01)
 (Continued)

(52) U.S. Cl.
 CPC ............ *F42B 3/08* (2013.01); *H05K 5/0026* (2013.01); *H05K 5/0247* (2013.01); *E21B 43/1185* (2013.01); *F42B 3/103* (2013.01)

(58) Field of Classification Search
 CPC ......... F42B 3/08; F42B 3/103; H05K 5/0026; F21B 43/1185
 (Continued)

(56) References Cited

U.S. PATENT DOCUMENTS 214,754 A 4/1879 Brock et al.
2,216,359 A 10/1940 Spencer
(Continued)

FOREIGN PATENT DOCUMENTS

CA 288787 A 4/1929
CA 2021396 A1 1/1991
(Continued)

OTHER PUBLICATIONS

US 11,274,530 B2, 03/2022, Eitschberger et al. (withdrawn)
(Continued)

*Primary Examiner* — Samir Abdosh
(74) *Attorney, Agent, or Firm* — Womble Bond Dickinson (US) LLP

(57) ABSTRACT

An initiator head may include a housing extending in an axial direction, a circuit board provided in an interior space of the housing, a line-in terminal provided on a first side of the housing in the axial direction and accessible from an exterior of the housing, and a fuse displaced from the circuit board in the axial direction. A thickness direction of the circuit board may be substantially parallel with the axial direction. The line-in terminal may be in electrical communication with the circuit board. The fuse may be in electrical communication with the circuit board. The circuit board may be configured to activate the fuse in response to a control signal received at the line-in terminal.

20 Claims, 10 Drawing Sheets

Related U.S. Application Data

(60) Provisional application No. 63/003,222, filed on Mar. 31, 2020, provisional application No. 63/001,766, filed on Mar. 30, 2020, provisional application No. 62/945,942, filed on Dec. 10, 2019.

(51) Int. Cl.
  *H05K 5/02* (2006.01)
  *E21B 43/1185* (2006.01)
  *F42B 3/103* (2006.01)

(58) Field of Classification Search
  USPC ...................................................... 102/202.9
  See application file for complete search history.

(56) References Cited

U.S. PATENT DOCUMENTS

| | | |
|---|---|---|
| 2,228,873 A | 1/1941 | Hardt et al. |
| 2,264,450 A | 12/1941 | Mounce |
| 2,308,004 A | 1/1943 | Hart |
| 2,326,406 A | 8/1943 | Lloyd |
| 2,358,466 A | 9/1944 | Miller |
| 2,418,486 A | 4/1947 | Smylie |
| 2,543,814 A | 3/1951 | Thompson et al. |
| 2,598,651 A | 5/1952 | Spencer |
| 2,637,402 A | 5/1953 | Baker et al. |
| 2,640,547 A | 6/1953 | Baker et al. |
| 2,649,046 A | 8/1953 | Oliver |
| 2,655,993 A | 10/1953 | Lloyd |
| 2,681,114 A | 6/1954 | Conrad |
| 2,692,023 A | 10/1954 | Conrad |
| 2,695,064 A | 11/1954 | Ragan et al. |
| 2,696,259 A | 12/1954 | Greene |
| 2,708,408 A | 5/1955 | Sweetman |
| 2,734,456 A | 2/1956 | Sweetman |
| 2,742,856 A | 4/1956 | Fieser et al. |
| 2,742,857 A | 4/1956 | Turechek |
| 2,755,863 A | 7/1956 | Stansbury et al. |
| 2,761,384 A | 9/1956 | Sweetman |
| 2,766,690 A | 10/1956 | Lebourg |
| 2,785,631 A | 3/1957 | Blanchard |
| 2,815,816 A | 12/1957 | Baker |
| 2,821,136 A | 1/1958 | Castel |
| 2,873,675 A | 2/1959 | Lebourg |
| 2,889,775 A | 6/1959 | Owen |
| 2,906,339 A | 9/1959 | Griffin |
| 2,946,283 A | 7/1960 | Udry |
| 2,979,904 A | 4/1961 | Royer |
| 2,982,210 A | 5/1961 | Andrew et al. |
| 2,996,591 A | 8/1961 | Thomas |
| 3,024,843 A | 3/1962 | Dean |
| 3,036,636 A | 5/1962 | Clark |
| 3,040,659 A | 6/1962 | Mcculleugh |
| 3,055,430 A | 9/1962 | Campbell |
| 3,076,507 A | 2/1963 | Sweetman |
| 3,080,005 A | 3/1963 | Porter |
| RE25,407 E | 6/1963 | Lebourg |
| 3,094,166 A | 6/1963 | Mccullough |
| 3,125,024 A | 3/1964 | Hicks et al. |
| 3,128,702 A | 4/1964 | Christopher |
| 3,154,632 A | 10/1964 | Browne |
| 3,158,680 A | 11/1964 | Lovitt et al. |
| 3,170,400 A | 2/1965 | Nelson |
| 3,173,992 A | 3/1965 | Boop |
| 3,186,485 A | 6/1965 | Owen |
| RE25,846 E | 8/1965 | Campbell |
| 3,208,378 A | 9/1965 | Boop |
| 3,209,692 A | 10/1965 | George |
| 3,211,093 A | 10/1965 | Mccullough et al. |
| 3,211,222 A | 10/1965 | Myers |
| 3,220,480 A | 11/1965 | Myers |
| 3,233,674 A | 2/1966 | Kurt |
| 3,244,232 A | 4/1966 | Myers |
| 3,246,707 A | 4/1966 | Bell |
| 3,264,989 A | 8/1966 | Rucker |
| 3,264,994 A | 8/1966 | Kurt |
| 3,298,437 A | 1/1967 | Conrad |
| 3,320,884 A | 5/1967 | Kowalick et al. |
| 3,327,792 A | 6/1967 | Boop |
| 3,374,735 A | 3/1968 | Moore |
| 3,398,803 A | 8/1968 | Kurt et al. |
| 3,414,071 A | 12/1968 | Alberts |
| 3,415,321 A | 12/1968 | Venghiattis |
| 3,498,376 A | 3/1970 | Sizer et al. |
| 3,504,723 A | 4/1970 | Cushman et al. |
| 3,565,188 A | 2/1971 | Hakala |
| D222,469 S | 10/1971 | Flummer |
| 3,621,916 A | 11/1971 | Smith, Jr. |
| 3,630,284 A | 12/1971 | Fast et al. |
| 3,650,212 A | 3/1972 | Bauer |
| 3,659,658 A | 5/1972 | Brieger |
| 3,712,376 A | 1/1973 | Young et al. |
| D227,763 S | 7/1973 | Hand |
| 3,762,470 A | 10/1973 | Eggleston |
| 3,859,921 A | 1/1975 | Stephenson |
| 4,003,433 A | 1/1977 | Goins |
| 4,007,790 A | 2/1977 | Henning |
| 4,007,796 A | 2/1977 | Boop |
| 4,034,673 A | 7/1977 | Schneider, Jr. |
| 4,039,239 A | 8/1977 | Cobaugh et al. |
| 4,058,061 A | 11/1977 | Mansur, Jr. et al. |
| 4,064,935 A | 12/1977 | Mohaupt |
| 4,071,096 A | 1/1978 | Dines |
| 4,080,898 A | 3/1978 | Gieske |
| 4,080,902 A | 3/1978 | Goddard et al. |
| 4,084,147 A | 4/1978 | Mlyniec et al. |
| 4,085,397 A | 4/1978 | Yagher |
| 4,100,978 A | 7/1978 | Boop |
| 4,107,453 A | 8/1978 | Erixon |
| 4,132,171 A | 1/1979 | Pawlak et al. |
| 4,140,188 A | 2/1979 | Vann |
| 4,172,421 A | 10/1979 | Regalbuto |
| 4,182,216 A | 1/1980 | DeCaro |
| 4,191,265 A | 3/1980 | Bosse-Platiere |
| 4,208,966 A | 6/1980 | Hart |
| 4,216,721 A | 8/1980 | Marziano et al. |
| 4,220,087 A | 9/1980 | Posson |
| 4,234,768 A | 11/1980 | Boop |
| 4,250,960 A | 2/1981 | Chammas |
| 4,261,263 A | 4/1981 | Coultas et al. |
| 4,266,613 A | 5/1981 | Boop |
| 4,269,120 A | 5/1981 | Brede et al. |
| 4,284,235 A | 8/1981 | Diermayer et al. |
| 4,290,486 A | 9/1981 | Regalbuto |
| 4,291,623 A * | 9/1981 | Robinson ............ E21B 43/1185 86/22 |
| 4,306,628 A | 12/1981 | Adams, Jr. et al. |
| 4,312,273 A | 1/1982 | Camp |
| 4,317,413 A | 3/1982 | Strandli et al. |
| 4,319,526 A | 3/1982 | DerMott |
| 4,345,646 A | 8/1982 | Terrell |
| 4,363,529 A | 12/1982 | Loose |
| 4,387,773 A | 6/1983 | McPhee |
| 4,393,946 A | 7/1983 | Pottier et al. |
| 4,429,741 A | 2/1984 | Hyland |
| 4,430,939 A | 2/1984 | Harrold |
| 4,485,741 A | 12/1984 | Moore et al. |
| 4,491,185 A | 1/1985 | McClure |
| 4,496,008 A | 1/1985 | Pottier et al. |
| 4,512,418 A | 4/1985 | Regalbuto et al. |
| 4,523,649 A | 6/1985 | Stout |
| 4,523,650 A | 6/1985 | Sehnert et al. |
| 4,530,396 A | 7/1985 | Mohaupt |
| 4,534,423 A | 8/1985 | Regalbuto |
| 4,541,486 A | 9/1985 | Wetzel et al. |
| 4,566,544 A | 1/1986 | Bagley et al. |
| 4,574,892 A | 3/1986 | Grigar et al. |
| 4,576,233 A | 3/1986 | George |
| 4,583,602 A | 4/1986 | Ayers |
| 4,598,775 A | 7/1986 | Vann et al. |
| 4,609,056 A | 9/1986 | Colle, Jr. et al. |
| 4,609,057 A | 9/1986 | Walker et al. |
| 4,617,997 A | 10/1986 | Jennings, Jr. |

(56) References Cited

U.S. PATENT DOCUMENTS

| | | |
|---|---|---|
| 4,619,320 A | 10/1986 | Adnyana et al. |
| 4,620,591 A | 11/1986 | Terrell et al. |
| 4,621,396 A | 11/1986 | Walker et al. |
| 4,629,001 A | 12/1986 | Miller et al. |
| 4,640,354 A | 2/1987 | Boisson |
| 4,643,097 A | 2/1987 | Chawla et al. |
| 4,650,009 A | 3/1987 | McClure et al. |
| 4,655,138 A | 4/1987 | Regalbuto et al. |
| 4,657,089 A | 4/1987 | Stout |
| 4,660,910 A | 4/1987 | Sharp et al. |
| 4,670,729 A | 6/1987 | Oh |
| 4,678,044 A | 7/1987 | Luke et al. |
| 4,730,793 A | 3/1988 | Thurber, Jr. et al. |
| 4,744,424 A | 5/1988 | Lendermon et al. |
| 4,747,201 A | 5/1988 | Donovan et al. |
| 4,753,170 A | 6/1988 | Regalbuto et al. |
| 4,762,067 A | 8/1988 | Barker et al. |
| 4,766,813 A | 8/1988 | Winter et al. |
| 4,769,734 A | 9/1988 | Heinemeyer et al. |
| 4,776,393 A | 10/1988 | Forehand et al. |
| 4,790,383 A | 12/1988 | Savage et al. |
| 4,796,708 A | 1/1989 | Lembcke |
| 4,800,815 A | 1/1989 | Appledorn et al. |
| 4,830,120 A | 5/1989 | Stout |
| 4,840,231 A | 6/1989 | Berzin et al. |
| 4,852,494 A | 8/1989 | Williams |
| 4,852,647 A | 8/1989 | Mohaupt |
| 4,869,171 A | 9/1989 | Abouav |
| 4,884,506 A | 12/1989 | Guerreri |
| 4,889,183 A | 12/1989 | Sommers et al. |
| 4,919,050 A | 4/1990 | Dobrinski et al. |
| 4,986,183 A | 1/1991 | Jacob et al. |
| 5,001,981 A | 3/1991 | Shaw |
| 5,006,833 A | 4/1991 | Marlowe et al. |
| 5,024,270 A | 6/1991 | Bostick |
| 5,027,708 A | 7/1991 | Gonzalez et al. |
| 5,038,682 A | 8/1991 | Marsden |
| 5,052,489 A | 10/1991 | Carisella et al. |
| 5,060,573 A | 10/1991 | Montgomery et al. |
| 5,070,788 A | 12/1991 | Carisella et al. |
| 5,088,413 A | 2/1992 | Huber |
| 5,090,321 A | 2/1992 | Abouav |
| 5,090,324 A | 2/1992 | Bocker et al. |
| 5,105,742 A | 4/1992 | Sumner |
| 5,115,865 A | 5/1992 | Carisella et al. |
| 5,119,729 A | 6/1992 | Nguyen |
| 5,155,293 A | 10/1992 | Barton |
| 5,155,296 A | 10/1992 | Michaluk |
| 5,159,145 A | 10/1992 | Carisella et al. |
| 5,159,146 A | 10/1992 | Carisella et al. |
| 5,165,489 A | 11/1992 | Langston |
| 5,191,936 A | 3/1993 | Edwards et al. |
| 5,204,491 A | 4/1993 | Aureal et al. |
| 5,216,197 A | 6/1993 | Huber et al. |
| 5,322,019 A | 6/1994 | Hyland |
| 5,323,684 A | 6/1994 | Umphries |
| 5,347,929 A | 9/1994 | Lerche et al. |
| 5,358,418 A | 10/1994 | Carmichael |
| 5,366,013 A | 11/1994 | Edwards et al. |
| 5,392,851 A | 2/1995 | Arend |
| 5,392,860 A | 2/1995 | Ross |
| 5,436,791 A | 7/1995 | Turano et al. |
| 5,447,202 A | 9/1995 | Littleford |
| 5,479,860 A | 1/1996 | Ellis |
| 5,503,077 A | 4/1996 | Motley |
| 5,511,620 A | 4/1996 | Baugh et al. |
| 5,540,154 A | 7/1996 | Wilcox et al. |
| 5,551,346 A | 9/1996 | Walters et al. |
| 5,551,520 A | 9/1996 | Bethel et al. |
| 5,564,499 A | 10/1996 | Willis et al. |
| 5,571,986 A | 11/1996 | Snider et al. |
| 5,603,384 A | 2/1997 | Bethel et al. |
| 5,648,635 A | 7/1997 | Lussier et al. |
| 5,671,899 A | 9/1997 | Nicholas et al. |
| 5,673,760 A | 10/1997 | Brooks et al. |
| 5,703,319 A | 12/1997 | Fritz et al. |
| 5,732,869 A | 3/1998 | Hirtl |
| 5,756,926 A | 5/1998 | Bonbrake et al. |
| 5,775,426 A | 7/1998 | Snider et al. |
| 5,778,979 A | 7/1998 | Burleson et al. |
| 5,785,130 A | 7/1998 | Wesson et al. |
| 5,803,175 A | 9/1998 | Myers, Jr. et al. |
| 5,816,343 A | 10/1998 | Markel et al. |
| 5,820,402 A | 10/1998 | Chiacchio et al. |
| 5,823,266 A | 10/1998 | Burleson et al. |
| 5,837,925 A | 11/1998 | Nice |
| 5,859,383 A | 1/1999 | Davison et al. |
| 5,911,277 A | 6/1999 | Hromas et al. |
| 5,984,006 A | 11/1999 | Read et al. |
| 5,992,289 A | 11/1999 | George et al. |
| D418,210 S | 12/1999 | Roesch |
| 6,006,833 A | 12/1999 | Burleson et al. |
| 6,012,525 A | 1/2000 | Burleson et al. |
| 6,056,058 A | 5/2000 | Gonzalez |
| 6,070,662 A | 6/2000 | Ciglenec et al. |
| 6,082,450 A | 7/2000 | Snider et al. |
| 6,085,659 A | 7/2000 | Beukes et al. |
| 6,112,666 A | 9/2000 | Murray et al. |
| 6,148,263 A | 11/2000 | Brooks et al. |
| 6,164,375 A | 12/2000 | Carisella |
| 6,173,651 B1 | 1/2001 | Pathe et al. |
| 6,263,283 B1 | 7/2001 | Snider et al. |
| 6,269,875 B1 | 8/2001 | Harrison, III et al. |
| 6,272,782 B1 | 8/2001 | Dittrich et al. |
| 6,295,912 B1 | 10/2001 | Burleson et al. |
| 6,298,915 B1 | 10/2001 | George |
| 6,305,287 B1 | 10/2001 | Capers et al. |
| 6,333,699 B1 | 12/2001 | Zierolf |
| 6,349,767 B2 | 2/2002 | Gissler |
| 6,354,374 B1 | 3/2002 | Edwards et al. |
| 6,378,438 B1 | 4/2002 | Lussier et al. |
| 6,385,031 B1 | 5/2002 | Lerche et al. |
| 6,386,108 B1 | 5/2002 | Brooks et al. |
| 6,408,758 B1 | 6/2002 | Duguet |
| 6,412,388 B1 | 7/2002 | Frazier |
| 6,412,415 B1 | 7/2002 | Kothari et al. |
| 6,414,905 B1 | 7/2002 | Owens et al. |
| 6,418,853 B1 | 7/2002 | Duguet et al. |
| 6,419,044 B1 | 7/2002 | Tite et al. |
| 6,435,096 B1 | 8/2002 | Watson |
| 6,439,121 B1 | 8/2002 | Gillingham |
| 6,467,387 B1 | 10/2002 | Espinosa et al. |
| 6,467,415 B2 | 10/2002 | Menzel et al. |
| 6,474,931 B1 | 11/2002 | Austin et al. |
| 6,487,973 B1 | 12/2002 | Gilbert, Jr. et al. |
| 6,497,285 B2 | 12/2002 | Walker |
| 6,502,736 B2 | 1/2003 | Dittrich et al. |
| 6,506,083 B1 | 1/2003 | Bickford et al. |
| 6,508,176 B1 | 1/2003 | Badger et al. |
| 6,557,474 B1 * | 5/2003 | Morte ............... F42B 3/103 361/247 |
| 6,582,251 B1 | 6/2003 | Burke et al. |
| 6,595,290 B2 * | 7/2003 | George ............ E21B 43/116 166/255.2 |
| 6,618,237 B2 | 9/2003 | Eddy et al. |
| 6,651,747 B2 | 11/2003 | Chen et al. |
| 6,659,180 B2 | 12/2003 | Moss |
| 6,675,896 B2 | 1/2004 | George |
| 6,702,009 B1 | 3/2004 | Drury et al. |
| 6,719,061 B2 | 4/2004 | Muller et al. |
| 6,739,265 B1 | 5/2004 | Badger et al. |
| 6,742,602 B2 | 6/2004 | Trotechaud |
| 6,752,083 B1 | 6/2004 | Lerche et al. |
| 6,763,883 B2 | 7/2004 | Green et al. |
| 6,773,312 B2 | 8/2004 | Bauer et al. |
| 6,779,605 B2 | 8/2004 | Jackson |
| 6,837,310 B2 | 1/2005 | Martin |
| 6,843,317 B2 | 1/2005 | Mackenzie |
| 6,851,471 B2 | 2/2005 | Barlow et al. |
| 6,851,476 B2 | 2/2005 | Gray et al. |
| 6,880,637 B2 | 4/2005 | Myers, Jr. et al. |
| 6,918,334 B2 | 7/2005 | Trotechaud |
| 6,938,689 B2 | 9/2005 | Farrant et al. |
| 7,013,977 B2 | 3/2006 | Nordaas |

(56) References Cited

U.S. PATENT DOCUMENTS

| | | |
|---|---|---|
| 7,044,230 B2 | 5/2006 | Starr et al. |
| 7,066,261 B2 | 6/2006 | Vicente et al. |
| 7,066,280 B2 | 6/2006 | Sullivan et al. |
| 7,086,481 B2 | 8/2006 | Hosie et al. |
| 7,093,664 B2 | 8/2006 | Todd et al. |
| 7,104,323 B2 | 9/2006 | Cook et al. |
| 7,107,908 B2 | 9/2006 | Forman et al. |
| 7,128,162 B2 | 10/2006 | Quinn |
| D532,947 S | 11/2006 | Muscarella |
| 7,168,494 B2 | 1/2007 | Starr et al. |
| 7,182,625 B2 | 2/2007 | Machado et al. |
| 7,193,527 B2 | 3/2007 | Hall |
| 7,226,303 B2 | 6/2007 | Shaikh |
| 7,228,906 B2 | 6/2007 | Snider et al. |
| 7,234,521 B2 | 6/2007 | Shammai et al. |
| 7,237,626 B2 | 7/2007 | Gurjar et al. |
| 7,243,722 B2 | 7/2007 | Oosterling et al. |
| 7,278,482 B2 | 10/2007 | Azar |
| 7,278,491 B2 | 10/2007 | Scott |
| 7,306,038 B2 | 12/2007 | Challacombe |
| 7,347,278 B2 | 3/2008 | Lerche et al. |
| 7,347,279 B2 | 3/2008 | Li et al. |
| 7,350,448 B2 | 4/2008 | Bell et al. |
| 7,353,879 B2 | 4/2008 | Todd et al. |
| 7,357,083 B2 | 4/2008 | Takahara et al. |
| 7,364,451 B2 | 4/2008 | Ring et al. |
| 7,387,162 B2 | 6/2008 | Mooney, Jr. et al. |
| 7,428,932 B1 | 9/2008 | Wintill et al. |
| 7,431,075 B2 | 10/2008 | Brooks et al. |
| 7,441,601 B2 | 10/2008 | George et al. |
| 7,455,104 B2 | 11/2008 | Duhon et al. |
| 7,487,827 B2 | 2/2009 | Tiernan |
| 7,493,945 B2 | 2/2009 | Doane et al. |
| 7,510,017 B2 | 3/2009 | Howell et al. |
| 7,533,722 B2 | 5/2009 | George et al. |
| 7,540,758 B2 | 6/2009 | Ho |
| 7,565,927 B2 | 7/2009 | Gerez et al. |
| 7,568,429 B2 | 8/2009 | Hummel et al. |
| 7,574,960 B1 | 8/2009 | Dockery et al. |
| 7,588,080 B2 | 9/2009 | McCoy |
| 7,591,212 B2 | 9/2009 | Myers, Jr. et al. |
| 7,604,062 B2 | 10/2009 | Murray |
| 7,640,857 B2 | 1/2010 | Kneisl |
| 7,647,978 B2 | 1/2010 | Scott |
| 7,698,982 B2 | 4/2010 | Bell |
| 7,721,650 B2 | 5/2010 | Barton et al. |
| 7,726,396 B2 | 6/2010 | Briquet et al. |
| 7,735,578 B2 | 6/2010 | Loehr et al. |
| 7,748,457 B2 | 7/2010 | Walton et al. |
| 7,752,971 B2 | 7/2010 | Loehr |
| 7,762,172 B2 | 7/2010 | Li et al. |
| 7,762,331 B2 | 7/2010 | Goodman et al. |
| 7,762,351 B2 | 7/2010 | Vidal |
| 7,775,279 B2 | 8/2010 | Marya et al. |
| 7,778,006 B2 | 8/2010 | Stewart et al. |
| 7,779,926 B2 | 8/2010 | Turley et al. |
| 7,789,153 B2 | 9/2010 | Prinz et al. |
| 7,810,430 B2 | 10/2010 | Chan et al. |
| 7,896,077 B2 | 3/2011 | Behrmann et al. |
| 7,901,247 B2 | 3/2011 | Ring |
| 7,905,290 B2 | 3/2011 | Schicks |
| 7,908,970 B1 | 3/2011 | Jakaboski et al. |
| 7,929,270 B2 | 4/2011 | Hummel et al. |
| 7,934,453 B2 | 5/2011 | Moore |
| 7,980,874 B2 | 7/2011 | Finke et al. |
| 8,028,624 B2 | 10/2011 | Mattson |
| 8,056,632 B2 | 11/2011 | Goodman |
| 8,066,083 B2 | 11/2011 | Hales et al. |
| 8,069,789 B2 | 12/2011 | Hummel et al. |
| 8,074,737 B2 | 12/2011 | Hill et al. |
| 8,079,296 B2 | 12/2011 | Barton et al. |
| 8,091,477 B2 | 1/2012 | Brooks et al. |
| 8,127,846 B2 | 3/2012 | Hill et al. |
| 8,136,439 B2 | 3/2012 | Bell |
| 8,141,434 B2 | 3/2012 | Kippersund et al. |
| 8,141,639 B2 | 3/2012 | Gartz et al. |
| 8,151,882 B2 | 4/2012 | Grigar et al. |
| 8,157,022 B2 | 4/2012 | Bertoja et al. |
| 8,165,714 B2 | 4/2012 | Mier et al. |
| 8,181,718 B2 | 5/2012 | Burleson et al. |
| 8,182,212 B2 | 5/2012 | Parcell |
| 8,186,259 B2 | 5/2012 | Burleson et al. |
| 8,186,425 B2 | 5/2012 | Smart et al. |
| 8,230,788 B2 | 7/2012 | Brooks et al. |
| 8,230,946 B2 | 7/2012 | Crawford et al. |
| 8,256,337 B2 | 9/2012 | Hill et al. |
| 8,322,426 B2 | 12/2012 | Wright et al. |
| 8,336,437 B2 | 12/2012 | Barlow et al. |
| 8,336,635 B2 | 12/2012 | Greenlee et al. |
| 8,388,374 B2 | 3/2013 | Grek et al. |
| 8,395,878 B2 | 3/2013 | Stewart et al. |
| 8,397,741 B2 | 3/2013 | Bisset |
| 8,413,727 B2 | 4/2013 | Holmes |
| 8,443,915 B2 | 5/2013 | Storm, Jr. et al. |
| 8,451,137 B2 | 5/2013 | Bonavides et al. |
| 8,468,944 B2 | 6/2013 | Givens et al. |
| 8,474,533 B2 | 7/2013 | Miller et al. |
| D689,590 S | 9/2013 | Brose |
| 8,561,683 B2 | 10/2013 | Wood et al. |
| 8,576,090 B2 | 11/2013 | Lerche et al. |
| 8,596,378 B2 | 12/2013 | Mason et al. |
| 8,661,978 B2 | 3/2014 | Backhus et al. |
| 8,678,666 B2 | 3/2014 | Scadden et al. |
| 8,684,083 B2 | 4/2014 | Torres et al. |
| 8,689,868 B2 | 4/2014 | Lerche et al. |
| 8,695,506 B2 | 4/2014 | Lanclos |
| 8,746,144 B2 | 6/2014 | Givens et al. |
| 8,752,486 B2 | 6/2014 | Robertson et al. |
| 8,770,271 B2 | 7/2014 | Fielder et al. |
| 8,770,301 B2 | 7/2014 | Bell |
| D712,013 S | 8/2014 | Mather et al. |
| 8,807,003 B2 | 8/2014 | Le et al. |
| 8,807,206 B2 | 8/2014 | Walker |
| 8,833,441 B2 | 9/2014 | Fielder et al. |
| 8,863,665 B2 * | 10/2014 | DeVries ............... F42C 19/12 |
| | | 102/206 |
| 8,869,887 B2 | 10/2014 | Deere et al. |
| 8,875,787 B2 | 11/2014 | Tassaroli |
| 8,875,796 B2 | 11/2014 | Hales et al. |
| 8,881,816 B2 | 11/2014 | Glenn et al. |
| 8,881,836 B2 | 11/2014 | Ingram |
| 8,884,778 B2 | 11/2014 | Lerche et al. |
| 8,943,943 B2 | 2/2015 | Tassaroli |
| 8,960,093 B2 | 2/2015 | Preiss et al. |
| 8,960,288 B2 | 2/2015 | Sampson |
| 8,991,489 B2 | 3/2015 | Redlinger et al. |
| 9,065,201 B2 | 6/2015 | Borgfeld et al. |
| 9,080,405 B2 | 7/2015 | Carisella |
| 9,080,433 B2 | 7/2015 | Lanclos et al. |
| 9,145,763 B1 | 9/2015 | Sites, Jr. |
| 9,145,764 B2 | 9/2015 | Burton et al. |
| 9,181,790 B2 | 11/2015 | Mace et al. |
| 9,194,219 B1 | 11/2015 | Hardesty et al. |
| 9,206,675 B2 | 12/2015 | Hales et al. |
| 9,284,168 B2 | 3/2016 | Mau et al. |
| 9,284,819 B2 | 3/2016 | Tolman et al. |
| 9,284,824 B2 | 3/2016 | Fadul et al. |
| 9,285,199 B2 | 3/2016 | Beikoff |
| 9,297,242 B2 | 3/2016 | Zhang et al. |
| 9,317,038 B2 | 4/2016 | Ozick et al. |
| 9,328,559 B2 | 5/2016 | Schwarz et al. |
| 9,347,755 B2 | 5/2016 | Backhus et al. |
| 9,359,863 B2 | 6/2016 | Streich et al. |
| 9,383,237 B2 | 7/2016 | Wiklund et al. |
| 9,476,272 B2 | 10/2016 | Carisella et al. |
| 9,476,289 B2 | 10/2016 | Wells |
| 9,482,069 B2 | 11/2016 | Powers |
| 9,488,024 B2 | 11/2016 | Hoffman et al. |
| 9,494,021 B2 | 11/2016 | Parks et al. |
| 9,523,265 B2 | 12/2016 | Upchurch et al. |
| 9,523,271 B2 | 12/2016 | Bonavides et al. |
| 9,556,676 B2 | 1/2017 | Konduc et al. |
| 9,581,422 B2 | 2/2017 | Preiss et al. |
| 9,587,439 B2 | 3/2017 | Lamik-Thonhauser et al. |

(56) References Cited

U.S. PATENT DOCUMENTS

| | | |
|---|---|---|
| 9,587,466 B2 | 3/2017 | Burguieres et al. |
| 9,593,548 B2 | 3/2017 | Hill et al. |
| 9,598,942 B2 | 3/2017 | Wells et al. |
| 9,605,937 B2 | 3/2017 | Eitschberger et al. |
| 9,677,363 B2 | 6/2017 | Schacherer et al. |
| 9,689,223 B2 | 6/2017 | Schacherer et al. |
| 9,689,240 B2 | 6/2017 | LaGrange et al. |
| 9,695,673 B1 | 7/2017 | Latiolais |
| 9,702,211 B2 | 7/2017 | Tinnen |
| 9,709,373 B2 | 7/2017 | Hikone et al. |
| 9,726,005 B2 | 8/2017 | Hallundbaek et al. |
| 9,732,561 B2 | 8/2017 | Carter, Jr. |
| 9,771,769 B2 | 9/2017 | Baker et al. |
| 9,784,549 B2 | 10/2017 | Eitschberger |
| 9,822,618 B2 | 11/2017 | Eitschberger |
| 9,835,006 B2 | 12/2017 | George et al. |
| 9,835,428 B2 | 12/2017 | Mace et al. |
| 9,879,501 B2 | 1/2018 | Hammer et al. |
| 9,903,192 B2 | 2/2018 | Entchev et al. |
| 9,903,695 B1 | 2/2018 | Goodman et al. |
| 10,018,018 B2 | 7/2018 | Cannon et al. |
| 10,036,236 B1 | 7/2018 | Sullivan et al. |
| 10,047,592 B2 | 8/2018 | Burgos et al. |
| 10,066,921 B2 | 9/2018 | Eitschberger |
| 10,077,626 B2 | 9/2018 | Xu et al. |
| 10,077,641 B2 | 9/2018 | Rogman et al. |
| 10,138,691 B2 | 11/2018 | Kos et al. |
| 10,138,713 B2 | 11/2018 | Tolman et al. |
| 10,151,180 B2 | 12/2018 | Robey et al. |
| 10,151,181 B2 | 12/2018 | Lopez et al. |
| 10,167,691 B2 | 1/2019 | Zhang et al. |
| 10,188,990 B2 * | 1/2019 | Burmeister ............ B01D 61/20 |
| 10,190,398 B2 | 1/2019 | Goodman et al. |
| 10,196,868 B2 | 2/2019 | Layden |
| 10,208,573 B2 | 2/2019 | Kaenel et al. |
| 10,267,611 B2 | 4/2019 | Lownds et al. |
| 10,273,788 B2 | 4/2019 | Bradley et al. |
| 10,287,873 B2 | 5/2019 | Filas et al. |
| 10,352,136 B2 | 7/2019 | Goyeneche |
| 10,352,144 B2 | 7/2019 | Entchev et al. |
| 10,365,079 B2 | 7/2019 | Harrington et al. |
| 10,400,558 B1 * | 9/2019 | Shahinpour ............ F42B 3/192 |
| 10,422,195 B2 | 9/2019 | LaGrange et al. |
| 10,428,595 B2 | 10/2019 | Bradley et al. |
| 10,458,213 B1 | 10/2019 | Eitschberger et al. |
| 10,472,938 B2 | 11/2019 | Parks et al. |
| D873,373 S | 1/2020 | Hartman et al. |
| 10,689,955 B1 | 6/2020 | Mauldin et al. |
| D892,278 S | 8/2020 | Eitschberger |
| 10,794,122 B2 | 10/2020 | Kitchen et al. |
| 10,844,696 B2 | 11/2020 | Eitschberger et al. |
| 10,845,178 B2 | 11/2020 | Eitschberger et al. |
| 10,900,335 B2 | 1/2021 | Knight et al. |
| 11,306,556 B2 | 4/2022 | Price |
| 11,834,934 B2 | 12/2023 | Prisbell et al. |
| 11,946,728 B2 * | 4/2024 | Eitschberger ........ H05K 5/0026 |
| 2002/0020320 A1 | 2/2002 | Lebaudy et al. |
| 2002/0062991 A1 | 5/2002 | Farrant et al. |
| 2002/0129940 A1 | 9/2002 | Yang et al. |
| 2003/0000411 A1 | 1/2003 | Cernocky et al. |
| 2003/0001753 A1 | 1/2003 | Cernocky et al. |
| 2004/0083919 A1 * | 5/2004 | Hosey ................... F42B 3/121 |
| | | 102/202.9 |
| 2004/0141279 A1 | 7/2004 | Amano et al. |
| 2004/0211862 A1 | 10/2004 | Elam |
| 2004/0216632 A1 | 11/2004 | Finsterwald |
| 2004/0216633 A1 | 11/2004 | Kash |
| 2005/0011390 A1 | 1/2005 | Jennings |
| 2005/0115441 A1 | 6/2005 | Mauldin |
| 2005/0139352 A1 | 6/2005 | Mauldin |
| 2005/0178282 A1 | 8/2005 | Brooks et al. |
| 2005/0183610 A1 | 8/2005 | Barton et al. |
| 2005/0186823 A1 | 8/2005 | Ring et al. |
| 2005/0194146 A1 | 9/2005 | Barker et al. |
| 2005/0202720 A1 | 9/2005 | Burke et al. |
| 2005/0218260 A1 | 10/2005 | Corder et al. |
| 2005/0229805 A1 | 10/2005 | Myers et al. |
| 2005/0257710 A1 | 11/2005 | Monetti et al. |
| 2006/0081374 A1 | 4/2006 | Bland et al. |
| 2006/0189208 A1 | 8/2006 | Shaikh |
| 2007/0084336 A1 | 4/2007 | Neves |
| 2007/0125540 A1 | 6/2007 | Gerez et al. |
| 2007/0158071 A1 | 7/2007 | Mooney, Jr. et al. |
| 2007/0267195 A1 | 11/2007 | Grigar et al. |
| 2008/0047456 A1 | 2/2008 | Li et al. |
| 2008/0047716 A1 | 2/2008 | McKee et al. |
| 2008/0073081 A1 | 3/2008 | Frazier et al. |
| 2008/0110612 A1 | 5/2008 | Prinz et al. |
| 2008/0134922 A1 | 6/2008 | Grattan et al. |
| 2008/0149338 A1 | 6/2008 | Goodman et al. |
| 2008/0173204 A1 | 7/2008 | Anderson et al. |
| 2008/0173240 A1 | 7/2008 | Furukawahara et al. |
| 2008/0264639 A1 | 10/2008 | Parrott et al. |
| 2008/0314591 A1 | 12/2008 | Hales et al. |
| 2009/0050322 A1 | 2/2009 | Hill et al. |
| 2009/0159285 A1 | 6/2009 | Goodman |
| 2009/0272519 A1 | 11/2009 | Green et al. |
| 2009/0272529 A1 | 11/2009 | Crawford |
| 2009/0301723 A1 | 12/2009 | Gray |
| 2009/0308589 A1 | 12/2009 | Bruins et al. |
| 2010/0000789 A1 | 1/2010 | Barton et al. |
| 2010/0012774 A1 | 1/2010 | Fanucci et al. |
| 2010/0024674 A1 | 2/2010 | Peeters et al. |
| 2010/0065302 A1 | 3/2010 | Nesbitt |
| 2010/0089643 A1 | 4/2010 | Vidal |
| 2010/0096131 A1 | 4/2010 | Hill et al. |
| 2010/0107917 A1 | 5/2010 | Moser |
| 2010/0132946 A1 | 6/2010 | Bell et al. |
| 2010/0163224 A1 | 7/2010 | Strickland |
| 2010/0230104 A1 | 9/2010 | Nölke et al. |
| 2010/0252323 A1 | 10/2010 | Goodman et al. |
| 2010/0286800 A1 | 11/2010 | Lerche et al. |
| 2010/0300750 A1 | 12/2010 | Hales et al. |
| 2010/0307773 A1 | 12/2010 | Tinnen et al. |
| 2011/0024116 A1 | 2/2011 | McCann et al. |
| 2011/0042069 A1 | 2/2011 | Bailey et al. |
| 2011/0056362 A1 | 3/2011 | Yang et al. |
| 2011/0301784 A1 | 12/2011 | Oakley et al. |
| 2012/0006217 A1 | 1/2012 | Anderson |
| 2012/0085538 A1 | 4/2012 | Guerrero et al. |
| 2012/0094553 A1 | 4/2012 | Fujiwara et al. |
| 2012/0160483 A1 | 6/2012 | Carisella |
| 2012/0199031 A1 | 8/2012 | Lanclos |
| 2012/0199352 A1 | 8/2012 | Lanclos et al. |
| 2012/0241169 A1 | 9/2012 | Hales et al. |
| 2012/0242135 A1 | 9/2012 | Thomson et al. |
| 2012/0247769 A1 | 10/2012 | Schacherer et al. |
| 2012/0247771 A1 | 10/2012 | Black et al. |
| 2012/0298361 A1 | 11/2012 | Sampson |
| 2013/0008639 A1 | 1/2013 | Tassaroli et al. |
| 2013/0008669 A1 | 1/2013 | Deere et al. |
| 2013/0043074 A1 | 2/2013 | Tassaroli |
| 2013/0062055 A1 | 3/2013 | Tolman et al. |
| 2013/0098257 A1 | 4/2013 | Goodridge et al. |
| 2013/0118342 A1 | 5/2013 | Tassaroli |
| 2013/0153205 A1 | 6/2013 | Borgfeld et al. |
| 2013/0168083 A1 | 7/2013 | McCarter et al. |
| 2013/0199843 A1 | 8/2013 | Ross |
| 2013/0220613 A1 | 8/2013 | Brooks et al. |
| 2013/0248174 A1 | 9/2013 | Dale et al. |
| 2013/0256464 A1 | 10/2013 | Belik et al. |
| 2014/0033939 A1 | 2/2014 | Priess et al. |
| 2014/0053750 A1 | 2/2014 | Lownds et al. |
| 2014/0060839 A1 | 3/2014 | Wang et al. |
| 2014/0131035 A1 | 5/2014 | Entchev et al. |
| 2014/0138090 A1 | 5/2014 | Hill et al. |
| 2014/0166370 A1 | 6/2014 | Silva |
| 2014/0318766 A1 | 10/2014 | Bishop |
| 2015/0075783 A1 | 3/2015 | Angman et al. |
| 2015/0136422 A1 | 5/2015 | Rodgers |
| 2015/0176386 A1 | 6/2015 | Castillo et al. |
| 2015/0226044 A1 | 8/2015 | Ursi et al. |
| 2015/0260496 A1 | 9/2015 | Backhus et al. |
| 2015/0330192 A1 | 11/2015 | Rogman et al. |

(56) References Cited

U.S. PATENT DOCUMENTS

| | | |
|---|---|---|
| 2015/0356403 A1 | 12/2015 | Storm, Jr. |
| 2016/0040520 A1 | 2/2016 | Tolman et al. |
| 2016/0050724 A1 | 2/2016 | Moon et al. |
| 2016/0061572 A1 | 3/2016 | Eitschberger et al. |
| 2016/0069163 A1 | 3/2016 | Tolman et al. |
| 2016/0084048 A1 | 3/2016 | Harrigan et al. |
| 2016/0160568 A1 | 6/2016 | Randall |
| 2016/0168961 A1 | 6/2016 | Parks et al. |
| 2016/0186511 A1 | 6/2016 | Coronado et al. |
| 2016/0273902 A1 | 9/2016 | Eitschberger |
| 2016/0281466 A1 | 9/2016 | Richards |
| 2016/0333675 A1 | 11/2016 | Wells et al. |
| 2016/0356132 A1 | 12/2016 | Burmeister et al. |
| 2016/0365667 A1 | 12/2016 | Mueller et al. |
| 2017/0030693 A1 | 2/2017 | Preiss et al. |
| 2017/0032653 A1 | 2/2017 | Crawford et al. |
| 2017/0044865 A1 | 2/2017 | Sabins et al. |
| 2017/0052011 A1 | 2/2017 | Parks et al. |
| 2017/0145798 A1 | 5/2017 | Robey et al. |
| 2017/0211363 A1 | 7/2017 | Bradley et al. |
| 2017/0241244 A1 | 8/2017 | Barker et al. |
| 2017/0268320 A1 | 9/2017 | Angman et al. |
| 2017/0268860 A1 | 9/2017 | Eitschberger |
| 2017/0276465 A1 | 9/2017 | Parks et al. |
| 2017/0298716 A1 | 10/2017 | McConnell et al. |
| 2017/0314372 A1 | 11/2017 | Tolman et al. |
| 2017/0328134 A1 | 11/2017 | Sampson et al. |
| 2018/0030334 A1 | 2/2018 | Collier et al. |
| 2018/0080300 A1 | 3/2018 | Angstmann et al. |
| 2018/0094910 A1 | 4/2018 | Ashton et al. |
| 2018/0119529 A1 | 5/2018 | Goyeneche |
| 2018/0120066 A1 | 5/2018 | Khatiwada et al. |
| 2018/0135398 A1 | 5/2018 | Entchev et al. |
| 2018/0148995 A1 | 5/2018 | Burky et al. |
| 2018/0202789 A1 | 7/2018 | Parks et al. |
| 2018/0202790 A1 | 7/2018 | Parks et al. |
| 2018/0209251 A1 | 7/2018 | Robey et al. |
| 2018/0231361 A1 | 8/2018 | Wicks et al. |
| 2018/0274311 A1 | 9/2018 | Zsolt |
| 2018/0274342 A1 | 9/2018 | Sites |
| 2018/0274356 A1 | 9/2018 | Hazel |
| 2018/0299239 A1* | 10/2018 | Eitschberger .......... H05K 5/069 |
| 2018/0306010 A1 | 10/2018 | Von Kaenel et al. |
| 2018/0318770 A1 | 11/2018 | Eitschberger et al. |
| 2018/0363424 A1 | 12/2018 | Schroeder et al. |
| 2019/0040722 A1 | 2/2019 | Yang et al. |
| 2019/0048693 A1 | 2/2019 | Henke et al. |
| 2019/0049225 A1 | 2/2019 | Eitschberger |
| 2019/0085685 A1 | 3/2019 | McBride |
| 2019/0106962 A1 | 4/2019 | Lee et al. |
| 2019/0128657 A1 | 5/2019 | Harrington et al. |
| 2019/0153827 A1 | 5/2019 | Goyeneche |
| 2019/0162056 A1 | 5/2019 | Sansing |
| 2019/0195054 A1 | 6/2019 | Bradley et al. |
| 2019/0211655 A1 | 7/2019 | Bradley et al. |
| 2019/0219375 A1 | 7/2019 | Parks et al. |
| 2019/0284889 A1 | 9/2019 | LaGrange et al. |
| 2019/0292887 A1 | 9/2019 | Austin et al. |
| 2019/0301261 A1 | 10/2019 | Anthony et al. |
| 2019/0316449 A1 | 10/2019 | Schultz et al. |
| 2019/0338612 A1 | 11/2019 | Holodnak et al. |
| 2019/0366272 A1 | 12/2019 | Eitschberger et al. |
| 2020/0048996 A1 | 2/2020 | Anthony et al. |
| 2020/0063537 A1 | 2/2020 | Langford et al. |
| 2020/0072029 A1 | 3/2020 | Anthony et al. |
| 2020/0088011 A1 | 3/2020 | Eitschberger et al. |
| 2020/0199983 A1 | 6/2020 | Preiss et al. |
| 2020/0217635 A1 | 7/2020 | Eitschberger |
| 2020/0248535 A1 | 8/2020 | Goyeneche |
| 2020/0256168 A1 | 8/2020 | Knight et al. |
| 2020/0284104 A1 | 9/2020 | Holmberg et al. |
| 2020/0284126 A1* | 9/2020 | Mauldin ............... E21B 43/119 |
| 2020/0332630 A1 | 10/2020 | Davis et al. |
| 2021/0363863 A1 | 11/2021 | Eitschberger |
| 2022/0258103 A1* | 8/2022 | Eitschberger ............. F42B 3/10 |

FOREIGN PATENT DOCUMENTS

| | | |
|---|---|---|
| CA | 2003166 A1 | 5/1991 |
| CA | 2821506 A1 | 1/2015 |
| CA | 2824838 A1 | 2/2015 |
| CA | 2941648 A1 | 9/2015 |
| CA | 2888787 A1 | 10/2015 |
| CA | 2821506 C | 3/2020 |
| CN | 85107897 A | 9/1986 |
| CN | 2661919 | 12/2004 |
| CN | 2821154 | 9/2006 |
| CN | 2823549 | 10/2006 |
| CN | 1284750 C | 11/2006 |
| CN | 101397890 A | 4/2009 |
| CN | 101691837 B | 4/2010 |
| CN | 101178005 B | 10/2010 |
| CN | 201620848 U | 11/2010 |
| CN | 201764910 U | 3/2011 |
| CN | 102878877 A | 1/2013 |
| CN | 103993861 A | 8/2014 |
| CN | 104449977 A | 4/2015 |
| CN | 205577894 U | 9/2016 |
| CN | 105822223 B | 3/2017 |
| CN | 104481492 B | 6/2019 |
| DE | 102005031673 A1 | 3/2006 |
| DE | 102007007498 | 10/2015 |
| EP | 0088516 A1 | 9/1983 |
| EP | 0207749 A2 | 1/1987 |
| EP | 132330 B1 | 9/1988 |
| EP | 0216527 B1 | 11/1990 |
| EP | 0416915 A2 | 3/1991 |
| EP | 0180520 B1 | 5/1991 |
| EP | 332287 B1 | 7/1992 |
| EP | 679859 A2 | 11/1995 |
| EP | 0482969 B1 | 8/1996 |
| EP | 694157 B1 | 8/2001 |
| EP | 1473437 A2 | 11/2004 |
| EP | 2702349 B1 | 11/2015 |
| EP | 2310616 B1 | 10/2017 |
| EP | 3077612 B1 | 5/2020 |
| GB | 2065750 B | 6/1983 |
| GB | 2383236 B | 1/2004 |
| GB | 2404291 A | 1/2005 |
| JP | 2003329399 A | 11/2003 |
| RU | 2087693 C1 | 8/1997 |
| RU | 7852 U1 | 10/1998 |
| RU | 2204706 C1 | 5/2003 |
| RU | 30160 U1 | 6/2003 |
| RU | 2221141 C1 | 1/2004 |
| RU | 2295694 C2 | 3/2007 |
| RU | 2312981 C2 | 12/2007 |
| RU | 93521 U1 | 4/2010 |
| RU | 98047 U1 | 9/2010 |
| RU | 100552 U1 | 12/2010 |
| RU | 2434122 C2 | 11/2011 |
| RU | 2439312 C1 | 1/2012 |
| RU | 2561828 C2 | 9/2015 |
| RU | 2633904 C1 | 10/2017 |
| WO | 1988002056 A1 | 3/1988 |
| WO | 9721067 A1 | 6/1997 |
| WO | 9745696 A1 | 12/1997 |
| WO | 1998046965 A1 | 10/1998 |
| WO | 9905390 A1 | 2/1999 |
| WO | 1999005390 A1 | 2/1999 |
| WO | 2000020821 A1 | 4/2000 |
| WO | 0123827 A1 | 4/2001 |
| WO | 0133029 A3 | 5/2001 |
| WO | 0159401 A1 | 8/2001 |
| WO | 2001059401 A1 | 8/2001 |
| WO | 2001096807 A2 | 12/2001 |
| WO | 2002099356 A2 | 12/2002 |
| WO | 2009091422 A2 | 7/2009 |
| WO | 2009142957 A1 | 11/2009 |
| WO | 2009091422 A3 | 3/2010 |
| WO | 2010104634 A2 | 9/2010 |
| WO | 2011160099 A1 | 12/2011 |
| WO | 2012006357 A2 | 1/2012 |
| WO | 2012135101 A2 | 10/2012 |
| WO | 2012106640 A3 | 11/2012 |

(56) References Cited

FOREIGN PATENT DOCUMENTS

| | | | |
|---|---|---|---|
| WO | 2012149584 A1 | 11/2012 | |
| WO | 2014046670 A1 | 3/2014 | |
| WO | 2014089194 A1 | 6/2014 | |
| WO | 2014178725 A1 | 11/2014 | |
| WO | 2015006869 A1 | 1/2015 | |
| WO | 2015028204 A2 | 3/2015 | |
| WO | 2015134719 A1 | 9/2015 | |
| WO | WO-2015169667 A2 * | 11/2015 | .......... E21B 43/1185 |
| WO | 2016100064 A1 | 6/2016 | |
| WO | 2016100269 A1 | 6/2016 | |
| WO | 2017041772 A1 | 3/2017 | |
| WO | 2017125745 A1 | 7/2017 | |
| WO | 2018009223 A1 | 1/2018 | |
| WO | 2018213768 A1 | 11/2018 | |
| WO | 2019147294 A1 | 8/2019 | |
| WO | 2019148009 A2 | 8/2019 | |
| WO | 2020112983 A1 | 6/2020 | |
| WO | 2020200935 A1 | 10/2020 | |
| WO | 2021025716 A1 | 2/2021 | |
| WO | 2021116336 A1 | 6/2021 | |
| WO | 2021116338 A1 | 6/2021 | |
| WO | 2021122797 A1 | 6/2021 | |

OTHER PUBLICATIONS

State Intellectual Property Office, P.R. China; First Office Action for CN App. No. 201480047092.7; issued on Apr. 24, 2017.
State Intellectual Property Office, P.R. China; First Office Action with full translation for CN App. No. 201480040456.9; issued Mar. 29, 2017; 12 pages (English translation 17 pages).
State Intellectual Property Office, P.R. China; Notification to Grant Patent Right for Chinese App. No. 201580011132.7; issued Apr. 3, 2019; 2 pages (Eng. Translation 2 pages).
State Intellectual Property Office, P.R. China; Notification to Grant Patent Right for CN App. No. 201480040456.9; Jun. 12, 2018; 2 pages (English translation 2 pages).
State Intellectual Property Office, P.R. China; Second Office Action for CN App. No. 201480040456.9; issued Nov. 29, 2017; 5 pages (English translation 1 page).
State Intellectual Property Office, P.R. China; Second Office Action for CN App. No. 201480047092.7; issued Jan. 4, 2018; 3 pages.
Stifel; Why the Big Pause? Balancing Long-Term Value with Near-Term Headwinds. Initiating Coverage of Oilfield Svcs and Equipment; dated Sep. 10, 2018; 207 pages.
SWM International, LLC and Nextier Completion Solutions Inc; Petitioner's Reply to Patent Owner's Response to Petition for Case No. PGR2021-00097; dated Jul. 29, 2022; 36 pages.
SWM International, LLC and Nextier Completion Solutions LLC; Petitioner's Preliminary Reply to Patent Owner's Preliminary Response for Case No. PGR2021-00097; dated Nov. 15, 2021; 11 pages.
SWM International, LLC and Nextier Oil Completion Solutions, LLC; Petition for Post Grant Review PGR No. 2021-00097; dated Jul. 20, 2021; 153 pages.
SWM International, LLC; Defendant's P.R. 3-3 and 3-4 Preliminary Invalidity Contentions; dated Aug. 4, 2021; 28 pages.
SWM International, LLC; Defendant's P.R. 4-1 Disclosure of Proposed Terms and Claim Elements for Construction for Civil Action No. 3:21-cv-00192-M; dated Aug. 24, 2021; 5 pages.
SWM International, LLC; Ex. A-1 Invalidity of U.S. Pat. No. 10,844,697 Over the SafeJet System; dated Aug. 4, 2021; 15 pages.
SWM International, LLC; Ex. A-1A Invalidity of U.S. Pat. No. 10,844,697 Over the SafeJet System in view of Backhus; dated Aug. 4, 2021; 4 pages.
SWM International, LLC; Ex. A-1B Invalidity of U.S. Pat. No. 10,844,697 Over the SafeJet System in view of Harrigan; dated Aug. 4, 2021; 3 pages.
SWM International, LLC; Ex. A-2 Invalidity of U.S. Pat. No. 10,844,697 Over Goodman; dated Aug. 4, 2021; 11 pages.
SWM International, LLC; Ex. A-2A Invalidity of U.S. Pat. No. 10,844,697 Over Goodman in view of Backhus; dated Aug. 4, 2021; 3 pages.
SWM International, LLC; Ex. A-2B Invalidity of U.S. Pat. No. 10,844,697 Over Goodman in view of Harrigan; dated Aug. 4, 2021; 3 pages.
SWM International, LLC; Ex. A-3 Invalidity of U.S. Pat. No. 10,844,697 Over Harrigan; dated Aug. 4, 2021; 13 pages.
SWM International, LLC; Ex. A-4 Invalidity of U.S. Pat. No. 10,844,697 Over Burton; dated Aug. 4, 2021; 11 pages.
SWM International, LLC; Ex. A-5 Invalidity of U.S. Pat. No. 10,844,697 Over Rogman; dated Aug. 4, 2021; 10 pages.
SWM International; Drawing of SafeJet System; dated Jul. 20, 2021; 1 page.
SWM International; Photographs of SafeJet System; dated Jul. 20, 2021; 9 pages.
Tolteq; iSeries MWD System; dated 2021; 9 pages.
U.S. Patent Trial and Appeal Board, Institution of Inter Partes Review of U.S. Pat. No. 9,581,422, Case IPR2018-00600,Aug. 21, 2018, 9 pages.
UK Examination Report of United Kingdom Patent Application No. GB1600085.3, which is in the same family as U.S. Pat. No. 9,702,680 issued Jul. 11, 2017, mailed Mar. 9, 2016, 1 pg.
United States District Court for the Northern District of Texas Dallas Division; Memorandum Opinion and Order in Civil Action No. 3:21-cv-00188-M; Mar. 23, 2022; 35 pages (order is redacted to protect confidential information; redacted order has not yet been filed by the Court).
United States District Court for the Northern District of Texas Dallas Division; Memorandum Opinion and Order in Civil Action No. 3:21-cv-00192-M; Mar. 23, 2022; 34 pages (order is redacted to protect confidential information; redacted order has not yet been filed by the Court).
United States District Court for the Southern District of Texas Houston Division, Case 4:19-cv-01611 for U.S. Pat. No. 9,581,422B2, Plaintiff's Complaint and Exhibits, dated May 2, 2019, 26 pgs.
United States District Court for the Southern District of Texas Houston Division, Case 4:19-cv-01611 for U.S. Pat. No. 9,581,422B2, Defendant's Answers, Counterclaims and Exhibits, dated May 28, 2019, 135 pgs.
United States District Court for the Southern District of Texas Houston Division, Case 4:19-cv-01611 for U.S. Pat. No. 9,581,422B2, Plaintiffs' Motion to Dismiss and Exhibits, dated Jun. 17, 2019, 63 pgs.
United States District Court for the Southern District of Texas; Joint Claim Construction Statement for Civil Action No. 3:20-cv-00376; dated Jul. 8, 2021; 14 pages.
United States District Court for the Southern District of Texas; Joint Claim Construction Statement for Civil Action No. 4:20-cv-02123; dated Aug. 27, 2021; 14 pages.
United States District Court for the Southern District of Texas; Memorandum Opinion and Order for Civil Action No. H-20-2123; dated Sep. 19, 2022; 115 pages.
United States District Court for the Western District of Texas; Order Granting in Part & Denying on Part Defendants' Motion to Dismiss for Improper Venue or to Transfer Venue Pursuant to 28 U.S.C. § 1404(a) for Civil Action No. 6:20-CV-01110-ADA; dated Aug. 5, 2021; 16 pages.
United States District Court Southern District of Texas Houston and Galveston Divisions; Seventh Supplemental Order; Sep. 17, 2020; 3 pages.
United States Patent and Trademark Office, Case IPR2018-00600 for U.S. Pat. No. 9,581,422 B2, Reply in Support of Patent Owner's Motion to Amend, dated Mar. 21, 2019, 15 pgs.
United States Patent and Trademark Office, Case IPR2018-00600 for U.S. Pat. No. 9,581,422 B2, Decision of Precedential Opinion Panel, Granting Patent Owner's Request for Hearing and Granting Patent Owner's Motion to Amend, dated Jul. 6, 2020, 27 pgs.
United States Patent and Trademark Office, Case IPR2018-00600 for U.S. Pat. No. 9,581,422 B2, DynaEnergetics GmbH & Co. KG's Patent Owner Preliminary Response, dated May 22, 2018, 47 pgs.

(56) References Cited

OTHER PUBLICATIONS

United States Patent and Trademark Office, Case IPR2018-00600 for U.S. Pat. No. 9,581,422 B2, Order Granting Precedential Opinion Panel, Paper No. 46, dated Nov. 7, 2019, 4 pgs.
United States Patent and Trademark Office, Case IPR2018-00600 for U.S. Pat. No. 9,581,422 B2, Patent Owner's Motion to Amend, dated Dec. 6, 2018, 53 pgs.
United States Patent and Trademark Office, Case IPR2018-00600 for U.S. Pat. No. 9,581,422 B2, Patent Owner's Opening Submission to Precedential Opinion Panel, dated Dec. 20, 2019, 21 pgs.
United States Patent and Trademark Office, Case IPR2018-00600 for U.S. Pat. No. 9,581,422 B2, Patent Owner's Request for Hearing, dated Sep. 18, 2019, 19 pgs.
United States Patent and Trademark Office, Case IPR2018-00600 for U.S. Pat. No. 9,581,422 B2, Patent Owner's Responsive Submission to Precedential Opinion Panel, dated Jan. 6, 2020, 16 pgs.
United States Patent and Trademark Office, Case IPR2018-00600 for U.S. Pat. No. 9,581,422 B2, Patent Owner's Sur-reply, dated Mar. 21, 2019, 28 pgs.
United States Patent and Trademark Office, Case IPR2018-00600 for U.S. Pat. No. 9,581,422 B2, Petitioner's Additional Briefing to the Precedential Opinion Panel, dated Dec. 20, 2019, 23 pgs.
United States Patent and Trademark Office, Case IPR2018-00600 for U.S. Pat. No. 9,581,422 B2, Petitioner's Opposition to Patent Owner's Motion to Amend, dated Mar. 7, 2019, 30 pgs.
United States Patent and Trademark Office, Case IPR2018-00600 for U.S. Pat. No. 9,581,422 B2, Petitioner's Reply Briefing to the Precedential Opinion Panel, dated Jan. 6, 2020, 17 pgs.
United States Patent and Trademark Office, Case IPR2018-00600 for U.S. Pat. No. 9,581,422 B2, Petitioner's Reply in Inter Partes Review of U.S. Pat. No. 9,581,422, dated Mar. 7, 2019, 44 pgs.
United States Patent and Trademark Office, Final Office Action of U.S. Appl. No. 16/359,540, dated Aug. 14, 2019, 9 pages.
*GR Energy Operating GP LLC, GR Energy Services Management, LP and GR Energy Services, LLC*; Exhibit W U.S. Pat. No. 10,844,697 vs *SafeJet System*; dated Aug. 30, 2021; 17 pages.
GR Energy Operating GP LLC, GR Energy Services Management, LP and GR Energy Services, LLC; GR Energy's Preliminary Invalidity Contentions for Civil Action No. 6:21-cv-00085-ADA; dated Aug. 30, 2021; 18 pages.
GR Energy Services Operating GP LLC, GR Energy Services Management, LP and GR Energy Services, LLC; GR Energy's Opening Claim Construction Brief; dated Oct. 18, 2021; 23 pages.
Guedes, Carlos; Signed Response Authenticating Documents for Civil Action No. 3-20-cv-000376; dated Jul. 13, 2021; 20 pages.
H-1 Perforating Gun System; Exhibit No. 1022 of PGR No. 2021-00089; dated May 1, 2020; 6 pages.
Halliburton Wireline & Perforating; Velocity Perforating System Plug and Play Guns for Pumpdown Operations; dated Mar. 2021; 8 pages.
Halliburton, Maxfire Electronic Firing Systems, Nov. 2014, 7 pgs., https://www.halliburton.com/content/dam/ps/public/lp/contents/Brochures/web/MaxFire.pdf.
Halliburton; Wireline and Perforating Advances in Perforating; dated Nov. 2012; 12 pages.
Hawes, Erik C.; SWM and NexTier Stipulation Letter; dated Jul. 20, 2021; 2 pages.
Heard, Preston; Declaration for PGR2021-00078; dated Aug. 19, 2021; 5 pages.
Horizontal Wireline Services, LLC and Allied Wireline Services, LLC; Defendants' Opening Claim Construction Brief; dated Oct. 18, 2021; 27 pages.
Horizontal Wireline Services, LLC and Allied Wireline Services, LLC; Defendants' Preliminary Invalidity Contentions for Civil Action No. 6:21-cv-00349-ADA; dated Aug. 30, 2021; 22 pages.
Horizontal Wireline Services, LLC and Allied Wireline Services, LLC; Exhibit A1 U.S. Pat. No. 5,155,293 to Barton vs. Asserted Claims of U.S. Pat. No. 10,844,697; dated Aug. 30, 2021; 21 pages.
Horizontal Wireline Services, LLC and Allied Wireline Services, LLC; Exhibit A23 Amit Govil, "Selective Perforation: A Game Changer in Perforating Technology—Case Study," 2012 European and West African Perforating Symposium vs. Asserted Claims of U.S. Pat. No. 10,844,697; dated Aug. 30, 2021; 17 pages.
Horizontal Wireline Services, LLC and Allied Wireline Services, LLC; Exhibit A5 U.S. Pat. No. 9,175,553 to Mcann, et al. vs. Asserted Claims of U.S. Pat. No. 10,844,697; dated Aug. 30, 2021; 26 pages.
Horizontal Wireline Services, Presentation of a completion method of shale demonstrated through an example of Marcellus Shale, Pennsylvania, USA, Presented at 2012 International Perforating Symposium (Apr. 26-28, 2012), 17 pages.
Hunting Titan Gun System Catalog; Exhibit No. 1035 of PGR No. 2021-00078; 59 pages.
Hunting Titan Inc.; Petition for Post Grant Review of U.S. Pat. No. 10,429,161; dated Jun. 30, 2020; 109 pages.
Hunting Titan Inc.; Petition for Post Grant Review of U.S. Pat. No. 10,472,938; dated Aug. 12, 2020; 198 pages.
Hunting Titan Ltd,; Defendants' Answer and Counterclaims, Civil Action No. 4:19-cv-01611, consolidated to Civil Action No. 4:17-cv-03784; dated May 28, 2019; 21 pages.
Hunting Titan Ltd.; Petition for Inter Partes Review of U.S. Pat. No. 9,581,422 Case No. IPR2018-00600; dated Feb. 16, 2018; 93 pages.
Hunting Titan Ltd.; Defendants' Answer and Counterclaims, Civil Action No. 6:20-cv-00069; dated Mar. 17, 2020; 30 pages.
Hunting Titan Ltd.; Defendants' Answer to First Amended Complaint and Counterclaims, Civil Action No. 6:20-cv-00069; dated Apr. 6, 2020; 30 pages.
Hunting Titan Ltd.; Defendants' Answer to Second Amended Complaint and Counterclaims, Civil Action No. 6:20-cv-00069; dated May 12, 2020; 81 pages.
Hunting Titan Ltd.; Defendants Invalidity Contentions Pursuant to Patent Rule 3-3, Civil Action No. 4:17-cv-03784; dated Jul. 6, 2018; 29 pages.
Hunting Titan Ltd.; Defendants' Objections and Responses to Plaintiffs' First Set of Interrogatories, Civil Action No. 4:17-cv-03784; dated Jun. 11, 2018.
Hunting Titan Ltd.; Defendants' Opposition to Plaintiffs' Motion to Dismiss and Strike Defendants' Amended Counterclaim and Affirmative Defenses for Unenforceability due to Inequitable Conduct for Civil Action No. 4:17-cv-03784; dated Apr. 24, 2018; 8 pages.
Hunting Titan, Electrical Cable Heads, May 8, 2016, 4 pgs., http://www.hunting-intl.com/media/1967991/ElectricalCableHeads.pdf.
Hunting Titan, H-1 Perforating System, Sep. 1, 2017, 3 pgs., http://www.hunting-intl.com/titan/perforating-guns-and-setting-tools/h-1%C2%AE-perforating-system.
Hunting Titan, Inc., U.S. Appl. No. 62/621,999 titled Cluster Gun System and filed Jan. 25, 2018, which is a priority application of International App. No. PCT/US2019/015255 published as WO2019/148009, Aug. 1, 2019, 7 pages, WIPO.
Hunting Titan, Inc., U.S. Appl. No. 62/627,591 titled Cluster Gun System and filed Feb. 7, 2018, which is a priority application of International App. No. PCT/US2019/015255 published as WO2019/148009, Aug. 1, 2019, 7 pages, WIPO.
Hunting Titan, Inc., U.S. Appl. No. 62/736,298 titled Starburst Cluster Gun and filed Sep. 25, 2018, which is a priority application of International App. No. PCT/US2019/015255 published as International Publication No. WO2019/148009, Aug. 1, 2019, 34 pages, WIPO.
Hunting Titan, Inc.; Defendant Hunting Titan, Inc.'s Opposition to Plaintiff's Motion for Summary Judgement for Civil Action No. 4:20-cv-02123; dated Mar. 30, 2022; 37 pages.
Hunting Titan, Inc.; Defendant Hunting Titan, Inc.'s Opposed Motion for Leave to Amend Invalidity Contentions for Civil Action No. 4:20-cv-02123; dated Nov. 19, 2021; 17 pages.
Hunting Titan, Inc.; Defendant's Answer, Affirmative Defenses, and Counterclaims to Plaintiffs' Second Amended Complaint for Civil Action No. 4:20-cv-02123; dated Sep. 10, 2021; 77 pages.
Hunting Titan, Inc.; Defendant's Final Invalidity Contentions for Civil Action No. 4:20-cv-02123; dated Jan. 7, 2022; 54 pages.
Hunting Titan, Inc.; Defendant's Preliminary Invalidity Contentions for Civil Action No. 4:20-cv-02123; dated Aug. 6, 2021; 52 pages.

(56) References Cited

OTHER PUBLICATIONS

Hunting Titan, Inc.; Defendant's Responsive Claim Construction Brief for Civil Action No. 4:20-cv-02123; dated Oct. 1, 2021; 31 pages.
Hunting Titan, Inc.; Defendant's Supplemental Brief on Claim Construction; dated Nov. 5, 2021; 9 pages.
Hunting Titan, Inc.; Exhibit 1 to Defendant Hunting Titan, Inc.'s Opposed Motion for Leave to Amend Invalidity Contentions for Civil Action No. 4:20-cv-02123; dated Nov. 19, 2021; 64 pages.
Hunting Titan, Inc.; Exhibit 2 to Defendant Hunting Titan, Inc.'s Opposed Motion for Leave to Amend Invalidity Contentions for Civil Action No. 4:20-cv-02123; dated Nov. 19, 2021; 33 pages.
Hunting Titan, Inc.; Exhibit 3 to Defendant Hunting Titan, Inc.'s Opposed Motion for Leave to Amend Invalidity Contentions for Civil Action No. 4:20-cv-02123; dated Nov. 19, 2021; 24 pages.
Hunting Titan, Inc.; Exhibit 4 to Defendant Hunting Titan, Inc.'s Opposed Motion for Leave to Amend Invalidity Contentions for Civil Action No. 4:20-cv-02123; dated Nov. 19, 2021; 9 pages.
Hunting Titan, Inc.; Exhibit 5 to Defendant Hunting Titan, Inc.'s Opposed Motion for Leave to Amend Invalidity Contentions for Civil Action No. 4:20-cv-02123; dated Nov. 19, 2021; 5 pages.
Hunting Titan, Inc.; Exhibit 6 to Defendant Hunting Titan, Inc.'s Opposed Motion for Leave to Amend Invalidity Contentions for Civil Action No. 4:20-cv-02123; dated Nov. 19, 2021; 4 pages.
Hunting Titan, Inc.; Exhibit 7 to Defendant Hunting Titan, Inc.'s Opposed Motion for Leave to Amend Invalidity Contentions for Civil Action No. 4:20-cv-02123; dated Nov. 19, 2021; 6 pages.
Hunting Titan, Inc.; Exhibit A to Defendant's Preliminary Invalidity Contentions, Invalidity of U.S. Pat. No. 10,429,161; dated Aug. 6, 2021; 93 pages.
Hunting Titan, Inc.; Exhibit B to Defendant's Preliminary Invalidity Contentions, Invalidity of U.S. Pat. No. 10,472,938; dated Aug. 6, 2021; 165 pages.
Hunting Titan, Inc.; Exhibit C to Defendant's Final Invalidity Contentions, Invalidity of U.S. Pat. No. 10,429,161; dated Jan. 7, 2022; 3 pages.
Hunting Titan, Inc.; Exhibit D to Defendant's Final Invalidity Contentions, Invalidity of U.S. Pat. No. 10,472,938; dated Jan. 7, 2022; 6 pages.
Czech Patent Office; Notice of Allowance for PV 2022-303 dated Jul. 15, 2024, 1 page.
ControlFire User Manual; Exhibit No. 2005 of PGR No. 2020-00072; 2014; 56 pages.
Core Lab, ZERO180 Gun System Assembly and Arming Procedures—MAN-Z180-000 (R09), Jul. 9, 2020, 38 pages.
Corelab Owen Oil Tools; Expendable Perforating Guns Description; https://www.corelab.com/owen/cms/docs/Canada/10A_erhsc-01.0-c.pdf; 2008; 7 pages.
CoreLab Quick Change Assembly; Exhibit No. 1034 of PGR No. 2021-00078; dated Aug. 2002; 1 page.
Dalia Abdallah et al., Casing Corrosion Measurement to Extend Asset Life, Dec. 31, 2013, 14 pgs., https://www.slb.com/-/media/files/oilfield-review/2-casing-corr-2-english.
Djresource, Replacing Signal and Ground Wire, May 1, 2007, 2 pages, http://www.djresource.eu/Topics/story/110/Technics-SL-Replacing-Signal-and-Ground-Wire/.
drillingmatters.org; Definition of "sub"; dated Aug. 25, 2018; 2 pages.
Dynaenergetics Europe GMBH, OSO Perforating, LLC, SWM International, LLC and Bear Manufacturing, LLC; Joint Claim Construction Statement for Northern District of Texas Civil Action Nos. 3:21-cv-00188, 3:21-cv-00192 and 3:21-cv-00185; dated Sep. 28, 2021; 29 pages.
Dynaenergetics Europe GMBH; Complaint and Demand for Jury Trial for Civil Action No. 4:21-cv-00280; dated Jan. 28, 2021; 55 pages.
Dynaenergetics Europe GMBH; Patent Owner's Preliminary Response for PGR2020-00072; dated Oct. 23, 2020; 108 pages.
Dynaenergetics Europe GMBH; Patent Owner's Preliminary Response for PGR2020-00080; dated Nov. 18, 2020; 119 pages.

Dynaenergetics Europe GMBH; Patent Owner's Preliminary Response for PGR2021-00078; dated Aug. 19, 2021; 114 pages.
Dynaenergetics Europe GMBH; Plaintiff's Preliminary Infringement Contentions for Civil Action No. 6:21-cv-01110; dated Jul. 6, 2021; 6 pages.
Dynaenergetics Europe GMBH; Principal and Response Brief of Cross-Appellant for United States Court of Appeals case No. 2020-2163, -2191; dated Jan. 11, 2021; 95 pages.
Dynaenergetics Europe GMBH; Reply Under 37 C.F.R. §1.111 Amendment Under 37 C.F.R. §1.121 for U.S. Appl. No. 16/585,790; dated Feb. 20, 2020; 18 pages.
Dynaenergetics Europe, GMBH; DynaEnergetics' Preliminary Claim Construction and Extrinsic Evidence for Civil Action No. 4:21-cv-00280; dated Aug. 4, 2021; 10 pages.
Dynaenergetics Europe, GMBH; Patent Owner's Preliminary Response for PGR No. 2021-00097; dated Oct. 29, 2021; 110 pages.
Dynaenergetics Europe; Defendants' Preliminary Infringement Contentions for Civil Action No. 3:20-CV-00376; dated Mar. 25, 2021; 22 pages.
Dynaenergetics Europe; DynaEnergetics Celebrates Grand Opening of DynaStage Manufacturing and Assembly Facilities in Blum, Texas; dated Nov. 16, 2018; 3 pages.
Dynaenergetics Europe; DynaEnergetics Europe GMBH and DynaEnergetics US, Inc.'s Answer to Complaint and Counterclaim Civil Action No. 3:20-cv-000376; dated Mar. 8, 2021; 23 pages.
Dynaenergetics Europe; Exhibit B Invalidity Claim Chart for Civil Action No. 4:19-cv-01611; dated May 2, 2019; 52 pages.
Dynaenergetics Europe; Exhibit C Invalidity Claim Chart for Civil Action No. 4:17-cv-03784; dated Jul. 13, 2020; 114 pages.
Dynaenergetics Europe; Patent Owner's Preliminary Response for PGR No. 2020-00080; dated Nov. 18, 2020; 119 pages.
Dynaenergetics Europe; Plaintiffs' Local Patent Rule 3-1 Infringement Contentions for Civil Action No. 4:19-cv-01611; dated May 25, 2018; 10 Pages.
Dynaenergetics Europe; Plaintiffs' Pending Motion for Reconsideration for Civil Action No. 4:17-cv-03784; dated Jan. 21, 2021; 4 pages.
Dynaenergetics Europe; Plaintiffs' Preliminary Claim Constructions and Identification of Extrinsic Evidence Civil Action No. 4:17-cv-03784; dated Aug. 3, 2018; 9 pages.
Dynaenergetics Europe; Plaintiffs' Preliminary Infringement Contentions, Civil Action No. 6:20-cv-00069-ADA; dated Apr. 22, 2020; 32 pages.
Dynaenergetics Europe; Plaintiff's Preliminary Infringment Contentions Civil Action No. 3:21-cv-00192-M; dated Jun. 18, 2021; 15 pages.
Dynaenergetics Europe; Plaintiffs' Reply in Support of Motion to Dismiss and Strike for Civil Action No. 6:20-cv-00069-ADA; dated Apr. 29, 2020; 15 pages.
Dynaenergetics Europe; Plaintiffs Response to Defendant Hunting Titan Ins' Inoperative First Amended Answer, Affirmative Defenses, and Counterclaims for Civil Action No. 6:20-cv-00069-ADA; dated May 13, 2020.
Dynaenergetics Europe; Plaintiffs' Response to Defendants' Answer to Second Amended Complaint Civil Action No. 6:20-cv-00069-ADA; dated May 26, 2020; 18 pages.
DynaEnergetics exhibition and product briefing; Exhibit 2006 of PGR No. 2020-00072; dated 2013; 15 pages.
Dynaenergetics GMBH & Co. KG, Patent Owner's Response to Hunting Titan's Petition for Inter Parties Review—Case IPR2018-00600, filed Dec. 6, 2018, 73 pages.
Dynaenergetics GmbH & Co. KG; Patent Owner's Precedential Opinion Panel Request for Case IPR2018-00600; Sep. 18, 2019, 2 pg.
Dynaenergetics, DYNAselect Electronic Detonator 0015 SFDE RDX 1.4B, Product Information, Dec. 16, 2011, 1 pg.
Dynaenergetics, DYNAselect Electronic Detonator 0015 SFDE RDX 1.4S, Product Information, Dec. 16, 2011, 1 pg.
Dynaenergetics, DYNAselect Electronic Detonator 0015 TFSFDE RDX 1.4B, Product Information, Apr. 23, 2015, 1 pg.
Dynaenergetics, DYNAselect System, information downloaded from website, Jul. 3, 2013, 2 pages, http://www.dynaenergetics.com/.

(56) References Cited

OTHER PUBLICATIONS

Dynaenergetics, Electronic Top Fire Detonator, Product Information Sheet, Jul. 30, 2013, 1 pg.
Dynaenergetics, Gun Assembly, Product Summary Sheet, May 7, 2004, 1 page.
Dynaenergetics, No Debris Gun System (NDG), Hamburg, Germany, Feb. 6, 2008, 26 pgs.
Dynaenergetics, Selective Perforating Switch, information downloaded from website, Jul. 3, 2013, 2 pages, http://www.dynaenergetics.com/.
Dynaenergetics, Selective Perforating Switch, Product Information Sheet, May 27, 2011, 1 pg.
Dynaenergetics; DynaStage Solution—Factory Assembled Performance-Assured Perforating Systems; 6 pages.
DynaStage Gun System; Exhibit 2009 of PGR No. 2020-00080; dated May 2014; 2 pages.
EP Patent Office—International Searching Authority, PCT Search Report and Written Opinion for PCT Application No. PCT/EP2014/065752, mailed May 4, 2015, 12 pgs.
Eric H. Findlay, Jury Trial Demand in Civil Action No. 6:20-cv-00069-ADA, dated Apr. 22, 2020, 32 pages.
European Patent Office; Invitation to Correct Deficiencies noted in the Written Opinion for European App. No. 15721178.0; issued Dec. 13, 2016; 2 pages.
European Patent Office; Office Action for EP App. No. 15721178.0; issued Sep. 6, 2018; 5 pages.
European Patent Office; Office Action for EP Application No. 20150721178.0; dated Jun. 21, 2022; 4 pages.
United States Patent and Trademark Office, Final Written Decision of Case IPR2018-00600 for U.S. Pat. No. 9,581,422 B2, Paper No. 42, dated Aug. 20, 2019, 31 pgs.
United States Patent and Trademark Office, U.S. Pat. No. 10,472,938; Parks, et al.; Patent granted Nov. 12, 2019; 485 pages.
United States Patent and Trademark Office, Non-Final Office Action of U.S. Appl. No. 16/451,440, dated Oct. 24, 2019, 22 pages.
United States Patent and Trademark Office, Non-Final Office Action of U.S. Appl. No. 14/767,058, dated Jul. 15, 2016, 9 pages.
United States Patent and Trademark Office, Non-Final Office Action of U.S. Appl. No. 15/117,228, dated May 31, 2018, 9 pages.
United States Patent and Trademark Office, Non-Final Office Action of U.S. Appl. No. 15/617,344, dated Jan. 23, 2019, 5 pages.
United States Patent and Trademark Office, Non-Final Office Action of U.S. Appl. No. 15/788,367, dated Oct. 22, 2018, 6 pages.
United States Patent and Trademark Office, Non-Final Office Action of U.S. Appl. No. 15/920,800, dated Dec. 27, 2019, 6 pages.
United States Patent and Trademark Office, Non-Final Office Action of U.S. Appl. No. 15/920,812, dated Dec. 27, 2019, 6 pages.
United States Patent and Trademark Office, Non-Final Office Action of U.S. Appl. No. 15/920,812, dated May 27, 2020, 5 pages.
United States Patent and Trademark Office, Non-Final Office Action of U.S. Appl. No. 16/026,431, dated Jul. 30, 2019, 10 pages.
United States Patent and Trademark Office, Non-Final Office Action of U.S. Appl. No. 16/359,540, dated May 3, 2019, 11 pages.
United States Patent and Trademark Office, Non-Final Office Action of U.S. Appl. No. 16/455,816, dated Nov. 5, 2019, 17 pages.
United States Patent and Trademark Office, Notice of Allowance for U.S. Appl. No. 15/920,800, dated Jul. 7, 2020, 7 pages.
United States Patent and Trademark Office, Notice of Allowance for U.S. Appl. No. 16/585,790, dated Jun. 19, 2020, 16 pages.
United States Patent and Trademark Office, Office Action of U.S. Appl. No. 16/540,484, dated Oct. 4, 2019, 12 pgs.
United States Patent and Trademark Office, Office Action of U.S. Appl. No. 16/585,790, dated Nov. 12, 2019, 9 pgs.
United States Patent and Trademark Office, Office Action of U.S. Appl. No. 16/809,729, dated Jun. 19, 2020, 9 pgs.
United States Patent and Trademark Office, Office Action of U.S. Appl. No. 29/733,080, dated Jun. 26, 2020, 8 pgs.
U.S. Appl. No. 61/733,129, filed Dec. 4, 2012; 10 pages.
U.S. Appl. No. 61/819,196, filed May 3, 2013 ; 10 pages.
United States Patent and Trademark Office, U.S. Pat. No. 438,305A, issued on Oct. 14, 1890 to T.A. Edison, 2 pages.
United States Patent and Trademark Office; Final Office Action of U.S. Appl. No. 16/809,729, dated Nov. 3, 2020; 19 pages.
United States Patent and Trademark Office; Advisory Action Before the Filing of an Appeal Brief for U.S. Appl. No. 16/540,484; mailed on May 19, 2021; 3 pages.
United States Patent and Trademark Office; Application Data Sheet for U.S. Appl. No. 14/888,882; dated Nov. 3, 2015; 9 pages.
United States Patent and Trademark Office; Application Data Sheet for U.S. Appl. No. 61/819,196; dated Jan. 16, 2014; 9 pages.
United States Patent and Trademark Office; Decision Granting Institution of Post-Grant Review 35 U.S.C. § 324 for PGR2021-00078; dated Nov. 1, 2021; 87 pages.
United States Patent and Trademark Office; Ex Parte Quayle Action for U.S. Appl. No. 16/809,729; dated Jun. 20, 2022; 4 pages.
United States Patent and Trademark Office; Ex Parte Quayle Action for U.S. Appl. No. 17/352,728; dated Jun. 20, 2022; 6 pages.
United States Patent and Trademark Office; Final Office Action for U.S. Appl. No. 17/221,219; dated Aug. 24, 2021; 14 pages.
United States Patent and Trademark Office; Final Office Action for U.S. Appl. No. 16/540,484; dated Apr. 27, 2022; 12 pages.
United States Patent and Trademark Office; Final Office Action for U.S. Appl. No. 16/540,484; dated Feb. 19, 2021; 12 pages.
United States Patent and Trademark Office; Final Office Action for U.S. Appl. No. 16/809,729; dated Nov. 18, 2021; 16 pages.
United States Patent and Trademark Office; Final Office Action for U.S. Appl. No. 17/004,966; dated Mar. 12, 2021; 18 pages.
United States Patent and Trademark Office; Final Office Action for U.S. Appl. No. 17/352,728; dated Mar. 9, 2022; 9 pages.
United States Patent and Trademark Office; Final Office Action of U.S. Appl. No. 16/540,484; dated Mar. 30, 2020; 12 pgs.
United States Patent and Trademark Office; U.S. Pat. No. 9,581,422 as of Aug. 23, 2017; Preiss et al; Patent granted Feb. 28, 2017.
United States Patent and Trademark Office; Information Disclosure Statement for U.S. Appl. No. 16/293,508; dated Dec. 10, 2020; 7 pages.
United States Patent and Trademark Office; Non-Final Office Action for U.S. Appl. No. 16/542,890; issued Nov. 4, 2019; 16 pages.
United States Patent and Trademark Office; Non-Final Office Action for U.S. Appl. No. 15/920,812; dated Feb. 3, 2021; 7 pages.
United States Patent and Trademark Office; Non-Final Office Action for U.S. Appl. No. 16/540,484; dated Aug. 9, 2021; 12 pages.
United States Patent and Trademark Office; Non-Final Office Action for U.S. Appl. No. 16/809,729; dated Feb. 3, 2022; 6 pages.
United States Patent and Trademark Office; Non-Final Office Action for U.S. Appl. No. 16/809,729; dated Jun. 22, 2021; 15 pages.
United States Patent and Trademark Office; Non-Final Office Action for U.S. Appl. No. 16/819,270; dated Feb. 10, 2021; 13 pages.
United States Patent and Trademark Office; Non-Final Office Action for U.S. Appl. No. 17/007,574; dated Jan. 29, 2021; 11 pages.
United States Patent and Trademark Office; Non-Final Office Action for U.S. Appl. No. 17/007,574; dated May 6, 2022; 10 pages.
United States Patent and Trademark Office; Non-Final Office Action for U.S. Appl. No. 17/123,972; dated Mar. 3, 2022; 9 pages.
United States Patent and Trademark Office; Non-Final Office Action for U.S. Appl. No. 17/162,579; dated Feb. 28, 2022; 16 pages.
United States Patent and Trademark Office; Non-Final Office Action for U.S. Appl. No. 17/181,280; dated Apr. 19, 2021; 18 pages.
Hunting Titan, Inc; Petitioner's Sur-Reply on Patent Owner's Motion to Amend for IPR No. 2018-00600; dated Apr. 11, 2019; 17 pages.
Hunting Titan, Wireline Hardware, Logging Instruments EBFire, TCB Systems, Gun Systems, Oct. 15, 2015, V.9.1, 72 pgs., http://www.hunting-intl.com/media/1305595/hunting-titan-complete-v9-1.pdf.
Hunting Titan, Wireline Top Fire Detonator Systems, Nov. 24, 2014, 2 pgs, http://www.hunting-intl. com/titan/perforating-guns-and-setting-tools/wireline-top-fire-detonator-systems.
Hunting Titan; ControlFire; dated Jan. 5, 2017; 20 pages; http://www.hunting-intl.com/media/2666029/Hunting%20ControlFire%20Presentation_Public11.pdf.
Hunting Wireline Hardware Brochures; Exhibit No. 1025 of PGR No. 2021-00078; dated 2013; 27 pages.

(56) References Cited

OTHER PUBLICATIONS

Hunting; Payload: Preloaded Perforating Guns; 2 pages; http://www.hunting-intl.com/titan/perforating-guns/payload-preloaded-perforating-guns.
Industrial Property Office, Czech Republic; Office Action for CZ App. No. PV 2017-675; Jul. 18, 2018; 2 pages; Concise Statement of Relevance: Examiner's objection of CZ application claims 1, 7, and 16 based on US Pub No. 20050194146 alone or in combination with WO Pub No. 2001059401.
Industrial Property Office, Czech Republic; Office Action for CZ App. No. PV 2017-675; Oct. 26, 2018; 2 pages.
Industrial Property Office, Czech Republic; Office Action; CZ App. No. PV 2017-675; Dec. 17, 2018; 2 pages.
INPI Argentina; Office Action for Application No. 20190101834; dated Aug. 22, 2022; 3 pages.
INPI Argentina; Office Action for Application No. 20190101835; dated Aug. 29, 2022; 3 pages.
Instituto Nacional De La Propiedad Industrial; Office Action for AR Appl. No. 20140102653; issued May 9, 2019 (1 page).
Intellectual Property India, Office Action of IN Application No. 201647004496, dated Jun. 7, 2019, 6 pgs.
Intellectual Property India; First Examination Report for IN Application No. 201947035642; dated Nov. 27, 2020; 5 pages.
International Searching Authority, International Preliminary Report on Patentability for PCT App. No. PCT/EP2014/065752; Mar. 1, 2016, 10 pgs.
International Searching Authority, International Search and Written Opinion of International App. No. PCT/EP2020/058241, dated Aug. 10, 2020, 18 pgs.
International Searching Authority; International Preliminary Report on Patentability for International Application No. PCT/IB2019/000537; dated Dec. 10, 2020; 11 pages.
International Searching Authority; International Preliminary Report on Patentability for International Application No. PCT/IB2019/000526; dated Dec. 10, 2020; 10 pages.
International Searching Authority; International Preliminary Report on Patentability for PCT Appl. No. PCT/CA2014/050673; issued Jan. 19, 2016; 5 pages.
International Searching Authority; International Preliminary Report on Patentability International Application No. PCT/EP2019/063966; dated Dec. 10, 2020; 7 pages.
International Searching Authority; International Preliminary Report on Patentability of the International Searching Authority for PCT/EP2020/075788; mailed on Mar. 31, 2022; 10 pages.
International Searching Authority; International Search Report and Written Opinion for International Application No. PCT/US19/15255; dated Apr. 23, 2019; 12 pages.
International Searching Authority; International Search Report and Written Opinion for International Application No. PCT/US2020/032879; dated Aug. 20, 2020; 9 pages.
International Searching Authority; International Search Report and Written Opinion for PCT App. No. PCT/CA2014/050673; mailed Oct. 9, 2014; 7 pages.
International Searching Authority; International Search Report and Written Opinion for PCT App. No. PCT/EP2015/059381; Nov. 23, 2015; 14 pages.
International Searching Authority; International Search Report and Written Opinion for PCT App. No. PCT/EP2019/072064; Nov. 20, 2019; 15 pages.
International Searching Authority; International Search Report and Written Opinion for PCT App. No. PCT/US2015/018906; Jul. 10, 2015; 12 pages.
International Searching Authority; International Search Report and Written Opinion for PCT Application No. EP2020066327; mailed on Jan. 11, 2021; 17 pages.
International Searching Authority; International Search Report and Written Opinion of the International Searching Authority for PCT/EP2020/086496; mailed on Apr. 7, 2021; 10 pages.
International Searching Authority; Invitation to Pay Additional Fees with Partial International Search for Application No. PCT/EP2020/075788; Mailed on Jan. 19, 2021; 9 pages.
Isolation Sub Assembly; Exhibit No. 1027 of PGR No. 2021-00078; dated Mar. 2008; 5 pages.
Jet Research Center Inc., JRC Catalog, 2008, 36 pgs., https://www.jetresearch.com/content/dam/jrc/Documents/Books_Catalogs/06_Dets.pdf.
Jet Research Center Inc., Red RF Safe Detonators Brochure, 2008, 2 pages, www.jetresearch.com.
Jet Research Centers, Capsule Gun Perforating Systems, Alvarado, Texas, 27 pgs., Jun. 12, 2019 https://www.jetresearch.com/content/dam/jrc/Documents/Books_Catalogs/07_Cap_Gun.pdf.
Johnson, Bryce; Citation of Prior Art and Written Statements in Patent Files for U.S. Pat. No. 10,844,697; dated Apr. 29, 2021; 2 pages.
Johnson, Bryce; Rule 501 citation of prior art and written "claim scope statements" in U.S. Pat. No. 10,844,697; dated Apr. 29, 2021; 18 pages.
JPT; New Instrumented Docketing Gun System Maximizes Perforating Performance; dated Aug. 31, 2018 7 pages; https://jpt.spe.org/new-instrumented-docking-gun-system-maximizes-perforating-performance.
Lehr, Doug; Declaration of Doug Lehr in Supprt of Repeat Precision's Response Claim Construction Brief; dated Oct. 27, 2021; 35 pages.
Logan, et al.; International Patent Application No. PCT/CA2013/050986; dated Dec. 18, 2013; 54 pages.
Markel, Dan; Declaration regarding the SafeJet System for PGR2021-00097; dated Jul. 15, 2021; 21 pages.
Mcbride Michael; Declaration for IPR2021-00082; dated Oct. 20, 2020; 3 pages.
Mcnelis et al.; High-Performance Plug-and-Perf Completions in Unconventional Wells; Society of Petroleum Engineers Annual Technical Conference and Exhibition; Sep. 28, 2015.
Meehan, Nathan; Declaration of D. Nathan Meehan, Ph.D, P.E; dated Oct. 18, 2021; 86 pages.
merriam-webster.com, Insulator Definition, https://www.merriam-webster.com/dictionary/insulator, Jan. 31, 2018, 4 pages.
New Oxford American Dictionary Third Edition; Definition of "end"; dated 2010; 3 pages.
Nextier Completion Solutions Inc.; Defendant NexTier Completion Solution Inc.'s Opening Claim Construction Brief; dated Oct. 18, 2021; 26 pages.
Nextier Completion Solutions Inc.; Defendant Nextier Completion Solutions Inc.'s First Amended Answer and Counterclaims to Plaintiffs' First Amended Complaint for Civil Action No. 6:20-CV-01201; dated Jun. 28, 2021; 17 pages.
Nextier Completion Solutions Inc.; Defendant's Preliminary Invalidity Contentions for Civil Action No. 6:20-cv-01201-ADA; dated Aug. 30, 2021; 21 pages.
Nextier Completion Solutions Inc.; Exhibit A-9 Selective perforation: A Game Changer in Peforating Technology—Case Study; dated Aug. 30, 2021; 13 pages.
Nextier Completion Solutions; Plaintiffs Preliminary Invalidity Contentions for Civil Action No. 4:21-cv-01328; dated Jun. 30, 2021; 19 pages.
Vigor Petroleum; Perforating Gun Accessories Product Description; https://www.vigordrilling.com/completion-tools/perforating-gun-accessories.html; 2021; 1 page.
Wetechnologies; Downhole Connectors, High Pressure HP / HT & Medium Pressure MP /MT; dated Apr. 3, 2016; http://wetechnologies.com/products/hp-ht-downhole/; 3 pages.
Williams, John; Declaration of Dr. John Williams; dated Oct. 18, 2021; 9 pages.
WIPO, International Search Report for International Application No. PCT/CA2014/050673, mailed Oct. 9, 2014, 3 pgs.
WIPO, Written Opinion of International Searching Authority for PCT Application No. PCT/CA2014/050673, mailed Oct. 9, 2014, 4 pgs.
Wooley, Gary R.; Declaration in Support of Petition for Post Grant Review of U.S. Pat. No. 10,844,697 for PGR2021-00097; dated Jul. 17, 2021; 90 pages.

(56) References Cited

OTHER PUBLICATIONS

Wooley, Gary R; Declaration of Gary R. Wooley, PH.D. Regarding Claim Construction for Civil Action No. 6:21-cv-00225-ADA; dated Oct. 6, 2021; 67 pages.
Wooley, Gary; Declaration of Gary E. Wooley for Civil Action Nos. 6:20-cv-01110-ADA and 6:20-CV-01201-ADA; dated Oct. 18, 2021; 12 pages.
Wooley, Gary; Declaration of Gary R. Wooley for Civil Action No. 3:20-cv-00376; dated Jul. 8, 2021; 11 pages.
Wooley, Gary; Declaration of Gary R. Wooley for Civil Action No. 3:21-cv-00192-M; dated Aug. 17, 2021; 18 pages.
Wooley, Gary; Rebuttal Declaration of Gary R. Wooley, PH.D. Regarding Claim Construction; dated Nov. 10, 2021; 34 pages.
Wooley, Gary; Transcript of Gary Wooley for Civil Action No. 3:21-cv-00192-M; dated Sep. 2, 2021; 26 pages.
World Oil; DynaEnergetics expands DynaStage factory-assembled, well perforating systems; dated Mar. 14, 2017; 2 pages.
Yellow Jacket Oil Tools, LLC; Defendant Yellow Jacket Oil Tools, LLC's Answer to Plaintiffs' First Amended Complaint for Civil Action No. 6:20-cv-01110; dated Aug. 10, 2021; 13 pages.
Yellowjacket Oil Tools, LLC and G&H Diversified Manufacturing, LP; Defendants' Preliminaray Invalidity Contentions for Civil Action No. 6:20-cv-01110-ADA; dated May 6, 2021; 20 pages.
Yellowjacket Oil Tools, LLC and G&H Diversified Manufacturing, LP; Defendants' Preliminary Invalidity Contentions for Civil Action No. 6:20-cv-01110-ADA; dated Aug. 30, 2021; 21 pages.
Yellowjacket Oil Tools, LLC and G&H Diversified Manufacturing, LP; Exhibit A-9 Selective perforation: A Game Changer in Peforating Technology—Case Study; dated Aug. 30, 2021; 13 pages.
Yellowjacket, G&H and Nextier, Invalidity Chart in Litigation re Schlumberger SafeJet, dated as early as Aug. 30, 2021, 13 pgs.
Yellowjacket, G&H and Nextier, Invalidity Chart in Litigation re U.S. Pat. No. 10,844,697, "New Select-Fire System" Publication and Select-Fire System by BakerHughes vs. Asserted Claims, dated as early as Aug. 30, 2021, 33 pgs.
Yellowjacket, G&H and Nextier, Invalidity Chart in Litigation re U.S. Pat. No. 10,844,697, New Select-Fire System vs. Asserted Claims, dated as early as Aug. 30, 2021, 33 pgs.
Yellowjacket, G&H and Nextier, Invalidity Chart in Litigation re U.S. Pat. No. 10,844,697, U.S. Patent Publication No. 2013/0126237 A1 to Burton vs Asserted Claims, dated as early as Aug. 30, 2021, 3 pgs.
Yellowjacket, G&H and Nextier, Invalidity Chart in Litigation re U.S. Pat. No. 10,844,697, U.S. Patent Publication No. 2016 0084048 A1 to Harrigan et al. vs. Asserted Claims, dated as early as Aug. 30, 2021, 4 pgs.
Yellowjacket, G&H and Nextier, Invalidity Chart in Litigation re U.S. Pat. No. 10,844,697, U.S. Appl. No. 61/733,129 vs. Asserted Claims, dated as early as Aug. 30, 2021, 55 pgs.
Yellowjacket, G&H and Nextier, Invalidity Chart in Litigation re U.S. Pat. No. 10,844,697, U.S. Appl. No. 61/819,196 to Harrigan et al. vs. Asserted Claims, dated as early as Aug. 30, 2021, 26 pgs.
Yellowjacket, G&H and Nextier, Invalidity Chart in Litigation re U.S. Pat. No. 10,844,697, US Pub. No. 2012/0247771 vs. Asserted Claims, dated as early as Aug. 30, 2021, 30 pgs.
Yellowjacket, G&H and Nextier, Invalidity Chart in Litigation re U.S. Pat. No. 10,844,697, U.S. Pat. No. 10,077,641 to Rogman vs. Asserted Claims, dated as early as Aug. 30, 2021, 36 pgs.
Yellowjacket, G&H and Nextier, Invalidity Chart in Litigation re U.S. Pat. No. 10,844,697, U.S. Pat. No. 3,173,229 to Gene T. Boop vs. Asserted Claims, dated as early as Aug. 30, 2021, 12 pgs.
Yellowjacket, G&H and Nextier, Invalidity Chart in Litigation re U.S. Pat. No. 10,844,697, U.S. Pat. No. 4,457,383 to Gene T. Boop vs. Asserted Claims, dated as early as Aug. 30, 2021, 22 pgs.
Yellowjacket, G&H and Nextier, Invalidity Chart in Litigation re U.S. Pat. No. 10,844,697, U.S. Pat. No. 6,506,083 vs. Asserted Claims, dated as early as Aug. 30, 2021, 3 pgs.
Yellowjacket, G&H and Nextier, Invalidity Chart in Litigation re U.S. Pat. No. 10,844,697, U.S. Pat. No. 6,582,251 to Burke et al. vs. Asserted Claims, dated as early as Aug. 30, 2021, 3 pgs.
Yellowjacket, G&H and Nextier, Invalidity Chart in Litigation re U.S. Pat. No. 10,844,697, U.S. Pat. No. 7,226,303 to Shaikh vs. Asserted Claims, dated as early as Aug. 30, 2021, 4 pgs.
Yellowjacket, G&H and Nextier, Invalidity Chart in Litigation re U.S. Pat. No. 10,844,697, U.S. Pat. No. 7,762,331 to Goodman vs. Asserted Claims, dated as early as Aug. 30, 2021, 4 pgs.
Yellowjacket, G&H and Nextier, Invalidity Chart in Litigation re U.S. Pat. No. 10,844,697, U.S. Pat. No. 8,387,533 to Runkel vs. Asserted Claims, dated as early as Aug. 30, 2021, 5 pgs.
Yellowjacket, G&H and Nextier, Invalidity Chart in Litigation re U.S. Pat. No. 10,844,697, U.S. Pat. No. 8,943,943 to Carlos Jose Tassaroli vs. Asserted Patents, dated as early as Aug. 30, 2021, 7 pgs.
Yellowjacket, G&H and Nextier, Invalidity Chart in Litigation re U.S. Pat. No. 10,844,697, U.S. Pat. No. 9,065,201 to Borgfeld et al vs. Asserted Claims, dated as early as Aug. 30, 2021, 3 pgs.
Yellowjacket, G&H and Nextier, Invalidity Chart in Litigation re U.S. Pat. No. 10,844,697, U.S. Pat. No. 9,874,083 to Logan vs. Asserted Claims, dated as early as Aug. 30, 2021, 18 pgs.
Czech Republic Patent Office; Office Action issued for Application No. PV2022-303 dated Jan. 12, 2024, 3 pages.
AEL Intelligent Blasting, Electronic Delay Detonators, Electronic Initiators, Product Catalogue 2018, 21 pgs., https://www.aelworld.com/application/files/6915/4442/8861/ael-intelligent-blasting-differentitated-products-electronic-delay-detonators.pdf.
Albert, Larry et al.; New Perforating Switch Technology Advances Safety & Reliability for Horizontal Completions; Unconventional Resources Tech. Conference; Jul. 20-22, 2015; 7 pgs.
Amit Govil, Selective Perforation: A Game Changer in Perforating Technology—Case Study, presented at the 2012 European and West African Perforating Symposium, Schlumberger, Nov. 7-9. 2012, 14 pgs.
Austin Powder Company; A-140 F & Block, Detonator & Block Assembly; Jan. 5, 2017; 2 pgs.; https://www.austinpowder.com/wp-content/uploads/2019/01/OilStar_A140Fbk-2.pdf.
Babu et al., Programmable Electronic Delay Device for Detonator, Defence Science Journal, May 2013, 3 pages, vol. 63, No. 3, https://doaj.org/article/848a537b12ae4a8b835391bec9.
Baker Hughes, Long Gun Deployment Systems IPS-12-28; 2012 International Perforating Symposium; Apr. 26-27, 2011; 11 pages.
Baker Hughes; SurePerf Rapid Select-Fire System Perforate production zones in a single run; 2012; 2 pages.
Baumann et al.; Perforating Innovations—Shooting Holes in Performance Models; Oilfield Review, Autumn 2014, vol. 26, Issue No. 3 pp. 14-31; 18 pages.
Bear Manufacturing, LLC; Defendant Bear Manufacturing, LLC's Answer, Affirmative Defenses and Counterclaim in response to Plaintiffs' Complaint for Civil Action No. 3:21-cv-00185-M; dated Mar. 22, 2021; 14 pages.
Bear Manufacturing, LLC; Defendant's Preliminary Invalidity Contentions; dated Aug. 4, 2021; 23 pages.
Bear Manufacturing, LLC; Exhibit A1 U.S. Pat. No. 5,155,293 to Barton vs. Asserted Claims of U.S. Pat. No. 10,844,697; dated Aug. 4, 2021; 21 pages.
Bear Mfg and Oso Perf, Invalidity Contentions in Litigation re Amit Govil, "Selective Perforation: A Game Changer in Perforating Technology—Case Study," 2012 European and West African Perforating Symposium ("EWAPS") vs. Asserted Claims of U.S. Pat. No. 10,844,697, dated as early as Aug. 4, 2021, 17 pgs.
Bear Mfg and Oso Perf, Invalidity Contentions in Litigation re U.S. Pat. No. 9,175,553 to McCann, et al. vs. Asserted Claims of U.S. Pat. No. 10,844,697, dated as early as Aug. 4, 2021, 26 pgs.
Bear Mfg, Oso Perf, Horizontal Wireline and Allied Horizontal, Invalidity Chart in Litigation re U.S. Pat. No. 10,844,697, U.S. Pat. No. 6,506,083 vs. Asserted Claims, dated as early as Aug. 4, 2021, 17 pgs.
Bear Mfg, Oso Perf, Horizontal Wireline and Allied Horizontal, Invalidity Contentions in Litigation re U.S. Pat. No. 10,844,697, "New Select-Fire System" Publication and Select-Fire System by BakerHughes vs. Asserted Claims, dated as early as Aug. 4, 2021, 14 pgs.

(56) References Cited

OTHER PUBLICATIONS

Bear Mfg, Oso Perf, Horizontal Wireline and Allied Wireline, Invalidity Chart in Litigation re U.S. Pat. No. 10,844,697, US Pub. No. 2012/0247771 vs. Asserted Claims, dated as early as Aug. 4, 2021, 26 pgs.

Bear Mfg, Oso Perf, Horizontal Wireline and Allied Wireline, Invalidity Contentions in Litigation re "3.12-in Frac Gun" Publication and 3.12-in Frac Gun System by Sclumberger vs. Asserted Claims of U.S. Pat. No. 10,844,697, dated as early as Aug. 4, 2021, 26 pgs.

Bear Mfg, Oso Perf, Horizontal Wireline and Allied Wireline, Invalidity Contentions in Litigation re Schlumberger SafeJet System vs. Asserted Claims of U.S. Pat. No. 10,844,697, dated as early as Aug. 4, 2021, 26 pgs.

Bear Mfg, Oso Perf, Horizontal Wireline and Allied Wireline, Invalidity Contentions in Litigation re U.S. Publication 2012/0199352 to Lanclos vs. Asserted Claims of U.S. Pat. No. 10,844,697, dated as early as Aug. 4, 2021, 24 pgs.

Bear Mfg, Oso Perf, Horizontal Wireline and Allied Wireline, Invalidity Contentions in Litigation re U.S. Publication No. 2008/0073081 to Frazier, et al vs. Asserted Claims of U.S. Pat. No. 10,844,697, dated as early as Aug. 4, 2021, 33 pgs.

Bear Mfg, Oso Perf, Horizontal Wireline and Allied Wireline, Invalidity Contentions in Litigation re U.S. Publication No. 2016/0084048 to Harrigan, et al vs. Asserted Claims of U.S. Pat. No. 10,844,697, dated as early as Aug. 4, 2021, 14 pgs.

Bear Mfg, Oso Perf, Horizontal Wireline and Allied Wireline, Invalidity Contentions in Litigation re U.S. Publication No. 2010/0065302 to Nesbitt vs. Asserted Claims of U.S. Pat. No. 10,844,697, dated as early as Aug. 4, 2021, 15 pgs.

Bear Mfg, Oso Perf, Horizontal Wireline and Allied Wireline, Invalidity Contentions in Litigation re U.S. Pat. No. 3,173,992 to Boop vs. Asserted Claims of U.S. Pat. No. 10,844,697, dated as early as Aug. 4, 2021, 17 pgs.

Bear Mfg, Oso Perf, Horizontal Wireline and Allied Wireline, Invalidity Contentions in Litigation re U.S. Pat. No. 4,457,383 to Boop. vs. Asserted Claims of U.S. Pat. No. 10,844,697, dated as early as Aug. 4, 2021, 22 pgs.

Bear Mfg, Oso Perf, Horizontal Wireline and Allied Wireline, Invalidity Contentions in Litigation re U.S. Pat. No. 6,582,251 to Burke, et al vs. Asserted Claims of U.S. Pat. No. 10,844,697, dated as early as Aug. 4, 2021, 15 pgs.

Bear Mfg, Oso Perf, Horizontal Wireline and Allied Wireline, Invalidity Contentions in Litigation re U.S. Pat. No. 7,762,331 to Goodman vs. Asserted Claims of U.S. Pat. No. 10,844,697, dated as early as Aug. 4, 2021, 28 pgs.

Bear Mfg, Oso Perf, Horizontal Wireline and Allied Wireline, Invalidity Contentions in Litigation re U.S. Pat. No. 7,901,247 to Ring vs. Asserted Claims of U.S. Pat. No. 10,844,697, dated as early as Aug. 4, 2021, 19 pgs.

Bear Mfg, Oso Perf, Horizontal Wireline and Allied Wireline, Invalidity Contentions in Litigation re U.S. Pat. No. 8,387,533 to Runkel vs. Asserted Claims of U.S. Pat. No. 10,844,697, dated as early as Aug. 4, 2021, 16 pgs.

Bear Mfg, Oso Perf, Horizontal Wireline and Allied Wireline, Invalidity Contentions in Litigation re U.S. Pat. No. 8,869,887 to Deere, et al vs. Asserted Claims of U.S. Pat. No. 10,844,697, dated as early as Aug. 4, 2021, 10 pgs.

Bear Mfg, Oso Perf, Horizontal Wireline and Allied Wireline, Invalidity Contentions in Litigation re U.S. Pat. No. 8,943,943 to Tassaroli vs. Asserted Claims of U.S. Pat. No. 10,844,697, dated as early as Aug. 4, 2021, 7 pgs.

Bear Mfg, Oso Perf, Horizontal Wireline and Allied Wireline, Invalidity Contentions in Litigation re U.S. Pat. No. 9,065,201 to Borgfeld, et al. vs. Asserted Claims of U.S. Pat. No. 10,844,697, dated as early as Aug. 4, 2021, 14 pgs.

Bear Mfg, Oso Perf, Horizontal Wireline and Allied Wireline, Invalidity Contentions in Litigation re U.S. Pat. No. 9,145,764 to Burton, et al vs. Asserted Claims of U.S. Pat. No. 10,844,697, dated as early as Aug. 4, 2021, 18 pgs.

Bear Mfg, Oso Perf, Horizontal Wireline and Allied Wireline, Invalidity Contentions in Litigation re U.S. Pat. No. 9,689,223 to Schacherer, et al vs. Asserted Claims of U.S. Pat. No. 10,844,697, dated as early as Aug. 4, 2021, 8 pgs.

Brazilian Patent and Trademark Office; Search Report for BR Application No. BR112015033010-0; mailed May 5, 2020; (4 pages).

Brinsden, Mark; Declaration of Mark Brinsden; dated Sep. 30, 2021; 51 pages.

Buche & Associates, P.C.; Rule 501 Citation of Prior Art and Written "Claim Scope Statements" in U.S. Pat. No. 10,844,697; dated Mar. 3, 2021; 24 pages.

Burndy, Bulkhead Ground Connector, Mechanical Summary Sheet, The Grounding Superstore, Jul. 15, 2014, 1 page, https://www.burndy.com/docs/default-source/cutsheets/bulkhead-connect.

C&J Energy Services; Gamechanger Perforating System Description; 2018; 1 pages.

C&J Energy Services; Gamechanger Perforating System Press Release; 2018; 4 pages.

Canadian Intellectual Property Office, Office Action for CA App. No. 2923860 dated Jul. 14, 2017, 3 pages.

Canadian Intellectual Property Office, Office Action for CA App. No. 2923860 dated Nov. 25, 2016, 3 pages.

Canadian Intellectual Property Office; Notice of Allowance for CA Appl. No. 2,821,506; mailed Jul. 31, 2019; 1 page.

Canadian Intellectual Property Office; Notice of Allowance for CA Application No. 2,941,648; dated Feb. 2, 2022; 1 page.

Canadian Intellectual Property Office; Office Action for CA Appl. No. 2,821,506; mailed Mar. 21, 2019; 4 pages.

Canadian Intellectual Property Office; Office Action for CA Application No. 2,941,648; dated Jul. 12, 2021; 3 pages.

Canadian Intellectual Property Office; Office Action for CA Application No. 2,941,648; dated Mar. 15, 2021; 3 pages.

Canadian Intellectual Property Office; Office Action for CA Application No. 3,070, 118; dated Mar. 16, 2021; 3 pages.

Canadian Intellectual Property Office; Office Action for CA Application No. 3,070,118; dated Nov. 17, 2021; 3 pages.

Canadian Intellectual Property Office; Office Action for CA Application No. 3040648; dated Nov. 18, 2020; 4 pages.

China National Petroleum Corporation, Perforation Technology for Complex Reservoirs, Science & Technology Management Department, 2011, 21 pages.

Fayard, Alfredo; Declaration of Alfredo Fayard; dated Oct. 18, 2021; 13 pages.

Federal Institute of Industrial Property; Decision of Granting for RU Appl. No. 2016104882/03(007851); May 17, 2018; 15 pages (English translation 4 pages).

Federal Institute of Industrial Property; Decision on Granting a Patent for Invention Russian App. No 2016139136/03(062394); issued Nov. 8, 2018; 20 pages (Eng Translation 4 pages); Concise Statement of Relevance: Search Report at 17-18 of Russian-language document lists several 'A' references based on RU application claims.

Federal Institute of Industrial Property; Inquiry for RU App. No. 2016104882/03(007851); dated Feb. 1, 2018; 7 pages, English Translation 4 pages.

Federal Institute of Industrial Property; Inquiry for RU Application No. 2016110014/03(015803); issued Feb. 1, 2018; 6 pages (Eng. Translation 4 pages).

G&H Diversified Manufacturing LP; Petition for Post Grant Review PGR No. 2021-00078; dated May 10, 2021; 122 pages.

G&H Diversified Manufacturing, LP and Dynaenergetics Europe GMBH; Joint Claim Construction Statement for Civil Action No. 3:20-cv-00376; dated Jul. 8, 2021; 14 pages.

G&H Diversified Manufacturing, LP; Defendant G&H Diversified Manufacturing, LP's Answer to Counter-Claim Plaintiffs' Counter-Claims for Civil Action No. 3:20-cv-00376; dated Apr. 19, 2021; 13 pages.

G&H Diversified Manufacturing, LP; Defendant G&H Diversified Manufacturing, LP's Opening Claim Construction Brief; dated Oct. 18, 2021; 25 pages.

(56) References Cited

OTHER PUBLICATIONS

G&H Diversified Manufacturing, LP; Defendants' Preliminary Invalidity Contentions for Civil Action No. 3:20-cv-00376; dated May 6, 2021; 20 pages.
G&H Diversified Manufacturing, LP; Petitioner's Oral Argument Presentation for PGR No. PGR2021-00078; dated Jul. 26, 2022; 65 pages.
G&H Diversified Manufacturing, LP; Plaintiff and Counterclaim Defendant G&H Diversified Manufacturing, LP and Counterclaim Defendant Yellow Jacket Oil Tools, LLC's Proposed Constructions; dated Jun. 10, 2021; 7 pages.
G&H Diversified Manufacturing, LP; Plaintiff and Counterclaim Defendant G&H Diversified Manufacturing, LP and Counterclaim Defendant Yellow Jacket Oil Tools, LLC's First Supplemental Proposed Constructions; dated Jun. 24, 2021; 7 pages.
G&H Diversified Manufacturing, LP; Redated Petition for Post Grant Review for PGR2021-00078; dated May 10, 2021; 20 pages.
G&H Diversified Manufacturing, LP; Reply to Preliminary Response for PGR No. PGR2021-00078; dated Sep. 14, 2021; 18 pages.
GB Intellectual Property Office, Combined Search and Examination Report for GB App. No. 1717516.7, dated Feb. 27, 2018, 6 pgs.
GB Intellectual Property Office, Combined Search and Examination Report for GB App. No. GB1700625.5, dated Jul. 7, 2017, 5 pages.
GB Intellectual Property Office, Examination Report for GB App. No. GB1600085.3, mailed Mar. 9, 2016, 1 pg.
GB Intellectual Property Office, Search Report for App. No. GB 1700625.5; dated Jul. 7, 2017; 5 pgs.
GB Intellectual Property Office; Examination Report for GB Appl. No. 1717516.7; Apr. 13, 2018; 3 pages.
GB Intellectual Property Office; Notification of Grant for GB Appl. No. 1717516.7; Oct. 9, 2018; 2 pages.
GB Intellectual Property Office; Office Action for GB App. No. 1717516.7; dated Feb. 27, 2018; 6 pages.
GB Intellectual Property Office; Search Report for GB. Appl. No. 1700625.5; mailed Dec. 21, 2017; 5 pages.
GE Oil & Gas, Pipe Recovery Technology & Wireline Accessories, 2013, 435 pages.
Geodynamics; Perforating Catalog; dated Mar. 5, 2020; 218 pages; https://www.perf.com/hubfs/PDF%20Files/PerforatingCatalog_03272020_SMS.pdf.
German Patent Office, Office Action for German Patent Application No. 10 2013 109 227.6, which is in the same family as PCT Application No. PCT/EP2014/065752, see p. 5 for references cited, May 22, 2014, 8 pgs.
Gilliat et al.; New Select-Fire System: Improved Reliability and Safety in Select Fire Operations; 2012; 16 pgs.
Global Wireline Market; Exhibit 2010 of PGR 2020-00072; dated Oct. 15, 2019; 143 pages.
GR Energy Operating GP LLC, GR Energy Services Management, LP and GR Energy Services, LLC; Exhibit A U.S. Pat. No. 10,844,697 vs Castel; dated Aug. 30, 2021; 88 pages.
GR Energy Operating GP LLC, GR Energy Services Management, LP and GR Energy Services, LLC; Exhibit B U.S. Pat. No. 10,844,697 vs Goodman; dated Aug. 30, 2021; 36 pages.
GR Energy Operating GP LLC, GR Energy Services Management, LP and GR Energy Services, LLC; Exhibit C U.S. Pat. No. 10,844,697 vs Hromas; dated Aug. 30, 2021; 27 pages.
GR Energy Operating GP LLC, GR Energy Services Management, LP and GR Energy Services, LLC; Exhibit D U.S. Pat. No. 10,844,697 vs Boop 768; dated Aug. 30, 2021; 35 pages.
GR Energy Operating GP LLC, GR Energy Services Management, LP and GR Energy Services, LLC; Exhibit E U.S. Pat. No. 10,844,697 vs Boop 792; dated Aug. 30, 2021; 52 pages.
GR Energy Operating GP LLC, GR Energy Services Management, LP and GR Energy Services, LLC; Exhibit F U.S. Pat. No. 10,844,697 vs Boop 378; dated Aug. 30, 2021; 34 pages.
GR Energy Operating GP LLC, GR Energy Services Management, LP and GR Energy Services, LLC; Exhibit G U.S. Pat. No. 10,844,697 vs Bickford; dated Aug. 30, 2021; 7 pages.
GR Energy Operating GP LLC, GR Energy Services Management, LP and GR Energy Services, LLC; Exhibit H U.S. Pat. No. 10,844,697 vs Black; dated Aug. 30, 2021; 33 pages.
GR Energy Operating GP LLC, GR Energy Services Management, LP and GR Energy Services, LLC; Exhibit I U.S. Pat. No. 10,844,697 vs Rogman; dated Aug. 30, 2021; 59 pages.
GR Energy Operating GP LLC, GR Energy Services Management, LP and GR Energy Services, LLC; Exhibit J U.S. Pat. No. 10,844,697 vs Burton; dated Aug. 30, 2021; 57 pages.
GR Energy Operating GP LLC, GR Energy Services Management, LP and GR Energy Services, LLC; Exhibit K U.S. Pat. No. 10,844,697 vs Borgfeld; dated Aug. 30, 2021; 36 pages.
GR Energy Operating GP LLC, GR Energy Services Management, LP and GR Energy Services, LLC; Exhibit L U.S. Pat. No. 10,844,697 vs Boop '383; dated Aug. 30, 2021; 24 pages.
GR Energy Operating GP LLC, GR Energy Services Management, LP and GR Energy Services, LLC; Exhibit M U.S. Pat. No. 10,844,697 vs Boop '992; dated Aug. 30, 2021; 14 pages.
GR Energy Operating GP LLC, GR Energy Services Management, LP and GR Energy Services, LLC; Exhibit N U.S. Pat. No. 10,844,697 vs Deere; dated Aug. 30, 2021; 14 pages.
GR Energy Operating GP LLC, GR Energy Services Management, LP and GR Energy Services, LLC; Exhibit O U.S. Pat. No. 10,844,697 vs Harrigan Provisional; dated Aug. 30, 2021; 26 pages.
GR Energy Operating GP LLC, GR Energy Services Management, LP and GR Energy Services, LLC; Exhibit P U.S. Pat. No. 10,844,697 vs Burke '251; dated Aug. 30, 2021; 7 pages.
GR Energy Operating GP LLC, GR Energy Services Management, LP and GR Energy Services, LLC; Exhibit Q U.S. Pat. No. 10,844,697 vs Runkel; dated Aug. 30, 2021; 7 pages.
GR Energy Operating GP LLC, GR Energy Services Management, LP and GR Energy Services, LLC; Exhibit R U.S. Pat. No. 10,844,697 vs Tassaroli; dated Aug. 30, 2021; 10 pages.
GR Energy Operating GP LLC, GR Energy Services Management, LP and GR Energy Services, LLC; Exhibit S U.S. Pat. No. 10,844,697 vs Harrigan '048; dated Aug. 30, 2021; 7 pages.
GR Energy Operating GP LLC, GR Energy Services Management, LP and GR Energy Services, LLC; Exhibit T U.S. Pat. No. 10,844,697 vs Select-Fire System; dated Aug. 30, 2021; 36 pages.
GR Energy Operating GP LLC, GR Energy Services Management, LP and GR Energy Services, LLC; Exhibit U U.S. Pat. No. 10,844,697 vs New Select-Fire System; dated Aug. 30, 2021; 37 pages.
GR Energy Operating GP LLC, GR Energy Services Management, LP and GR Energy Services, LLC; Exhibit V U.S. Pat. No. 10,844,697 vs EWAPS; dated Aug. 30, 2021; 17 pages.
United States Patent and Trademark Office; Non-Final Office Action for U.S. Appl. No. 17/206,416; dated May 19, 2021; 10 pages.
United States Patent and Trademark Office; Non-Final Office Action for U.S. Appl. No. 17/221,219; dated Aug. 3, 2022; 8 pages.
United States Patent and Trademark Office; Non-Final Office Action for U.S. Appl. No. 17/221,219; dated Jun. 17, 2021; 10 pages.
United States Patent and Trademark Office; Non-Final Office Action for U.S. Appl. No. 17/352,728; dated Oct. 25, 2021; 9 pages.
United States Patent and Trademark Office; Non-Final Office Action for U.S. Appl. No. 17/383,816; dated Jan. 25, 2022; 23 pages.
United States Patent and Trademark Office; Non-Final Office Action for U.S. Appl. No. 17/835,468; dated Nov. 22, 2022; 16 pages.
United States Patent and Trademark Office; Non-Final Office Action of U.S. Appl. No. 15/920,800; dated Dec. 9, 2020; 6 pages.
United States Patent and Trademark Office; Notice of Allowability for U.S. Appl. No. 14/908,788; dated Dec. 27, 2017; 5 pages.
United States Patent and Trademark Office; Notice of Allowance for U.S. Appl. No. 29/733,080; dated Oct. 20, 2020; 9 pages.
United States Patent and Trademark Office; Notice of Allowance for U.S. Appl. No. 15/920,812, mailed Aug. 18, 2020; 5 pages.
United States Patent and Trademark Office; Notice of Allowance for U.S. Appl. No. 16/387,696; issued on Jan. 29, 2020; 7 pages.
United States Patent and Trademark Office; Notice of Allowance for U.S. Appl. No. 14/904,788; dated Jul. 6, 2016; 8 pages.
United States Patent and Trademark Office; Notice of Allowance for U.S. Appl. No. 15/920,812; dated Aug. 4, 2021; 5 pages.

(56) References Cited

OTHER PUBLICATIONS

United States Patent and Trademark Office; Notice of Allowance for U.S. Appl. No. 16/423,789; dated Jul. 23, 2020 7 pages.
United States Patent and Trademark Office; Notice of Allowance for U.S. Appl. No. 16/585,790, dated Aug. 5, 2020; 15 pages.
United States Patent and Trademark Office; Notice of Allowance for U.S. Appl. No. 16/809,729; dated Jan. 26, 2021; 9 pages.
United States Patent and Trademark Office; Notice of Allowance for U.S. Appl. No. 16/809,729; dated Sep. 21, 2022; 7 pages.
United States Patent and Trademark Office; Notice of Allowance for U.S. Appl. No. 16/860,269; dated Apr. 7, 2021; 9 pages.
United States Patent and Trademark Office; Notice of Allowance for U.S. Appl. No. 17/004,966; dated Nov. 8, 2021; 12 pages.
United States Patent and Trademark Office; Notice of Allowance for U.S. Appl. No. 17/007,574; dated May 21, 2021; 8 pages.
United States Patent and Trademark Office; Notice of Allowance for U.S. Appl. No. 17/007,574; dated Sep. 26, 2022; 8 pages.
United States Patent and Trademark Office; Notice of Allowance for U.S. Appl. No. 17/221,219; dated Jan. 13, 2022; 11 pages.
United States Patent and Trademark Office; Notice of Allowance for U.S. Appl. No. 17/352,728; dated Sep. 21, 2022; 8 pages.
United States Patent and Trademark Office; Notice of Allowance for US Appl. No. 17/358,101; dated Oct. 26, 2022; 8 pages.
United States Patent and Trademark Office; Notices of Allowabilty for U.S. Appl. No. 16/585,790; dated Jul. 31, 2020 and Mar. 18, 2020; Response to Office Action for U.S. Appl. No. 16/585,790; dated Nov. 12, 2019; 26 pages.
United States Patent and Trademark Office; Office Action and Response to Office Action for U.S. Appl. No. 16/585,790; dated Nov. 12, 2019 and Feb. 12, 2020; 21 pages.
United States Patent and Trademark Office; Office Action for U.S. Appl. No. 17/004,966; dated Dec. 8, 2020; 30 pages.
United States Patent and Trademark Office; Office Action in Ex Parte Reexamination for U.S. Pat. No. 10,844,697; mailed Jan. 26, 2022; 10 pages.
United States Patent and Trademark Office; Office Action of U.S. Appl. No. 16/540,484, dated Aug. 20, 2020, 10 pgs.
United States Patent and Trademark Office; Order Granting Request for Ex Parte Reexamination; dated Nov. 1, 2021; 14 pages.
United States Patent and Trademark Office; Patent Assignment for U.S. Appl. No. 61/733,129; dated Jan. 25, 2013; 2 pages.
United States Patent and Trademark Office; Patent Prosecution History of U.S. Appl. No. 61/733,129; dated Jan. 3, 2013; 22 pages.
United States Patent and Trademark Office; Requirement for Restriction/Election for U.S. Appl. No. 16/860,269; dated Jan. 19, 2021; 6 pages.
United States Patent and Trademark Office; Restriction Requirement for U.S. Appl. No. 17/007,574; dated Oct. 23, 2020; 6 pages.
United States Patent and Trademark Office; Supplemental Notice of Allowability for U.S. Appl. No. 14/904,788; dated Jul. 21, 2016; 2 pages.
U.S. Appl. No. 61/739,592; dated Dec. 19, 2012; 65 pages.
U.S. Appl. No. 62/002,559; dated May 23, 2014; 19 pages.
U.S. Appl. No. 62/002,565; dated Jun. 25, 2014; 25 pages.
U.S. Appl. No. 62/014,900; dated Jul. 7, 2014; 25 pages.
U.S. Appl. No. 62/015,014; dated Jul. 7, 2014; 21 pages.
U.S. Appl. No. 62/015,030; dated Jul. 14, 2014; 29 pages.
U.S. Appl. No. 62/112,935; dated Feb. 6, 2015; 33 pages.
U.S. Appl. No. 62/131,324; dated Mar. 24, 2015; 65 pages.
U.S. Appl. No. 62/621,999; dated Jan. 25, 2018; 42 pages.
U.S. Appl. No. 62/627,591; dated Feb. 7, 2018; 40 pages.
United States Patent and Trial Appeal Board; Final Written Decision on IPR2018-00600; issued Aug. 20, 2019; 31 pages.
United States Patent and Trial Appeal Board; Final Written Decision on PGR2021-00078; issued Oct. 28, 2022; 139 pages.
United States Patent Trial and Appeal Board; Decision Denying Institution of Post-Grant Review; PGR No. 2020-00072; dated Jan. 19, 2021; 38 pages.
United States Patent Trial and Appeal Board; Institution Decision for PGR 2020-00080; dated Feb. 12, 2021; 15 pages.
United States Patent Trial and Appeal Board; Record of Oral Hearing held Feb. 18, 2020 for IPR dated 2018-00600; dated Feb. 18, 2020; 27 pages.
Nextier Oilfield Solutions Inc; Petition for Inter Partes Review No. IPR2021-00082; dated Oct. 21, 2020; 111 pages.
Nexus Perforating LLC; Answer to DynaEnergetics Europe GMBH and DynaEnergetics US Inc/'s Complaint and Counterclaims; dated Apr. 15, 2021; 10 pages.
Nexus Perforating LLC; Complaint and Demand for Jury Trial for Civil Case No. 4:20-cv-01539; dated Apr. 30, 2020; 11 pages.
Nexus Perforating LLC; Invalidity Contentions for Civil Action No. 4:21-cv-00280; dated Jun. 30, 2021; 44 pages.
Nexus Perforating LLC; Nexus Perforating LLC's Responsive Claim Construction Brief for Civil Action No. 4:21-cv-00280; dated Nov. 3, 2021; 31 pages.
Nexus Perforating LLC; Nexus Preliminary Claim Construction and Extrinsic Evidence for Civil Action No. 4:21-cv-00280; dated Aug. 4, 2021; 6 pages.
Nexus Perforating; Double Nexus Connect (Thunder Gun System) Description; Retrieved from the internet Jan. 27, 2021; 6 pages.
Norwegian Industrial Property Office; Notice of Allowance for NO Application No. 20171759; dated Apr. 23, 2021; 2 pages.
Norwegian Industrial Property Office; Office Action and Search Report for NO App. 20160017; Jun. 15, 2017; 5 pages.
Norwegian Industrial Property Office; Office Action and Search Report for NO App. No. 20171759; Jan. 14, 2020; 6 pages.
Norwegian Industrial Property Office; Office Action for NO Appl. No. 20160017; mailed Dec. 4, 2017; 2 pages.
Norwegian Industrial Property Office; Office Action for NO Appl. No. 20171759; mailed Oct. 30, 2020; 2 pages.
Norwegian Industrial Property Office; Office Action for NO Application No. 20180507; dated Sep. 29, 2022; 2 pages.
Norwegian Industrial Property Office; Office Action for NO Application No. 20210799; dated Oct. 30, 2021; 2 pages.
Norwegian Industrial Property Office; Opinion for NO Appl. No. 20171759; mailed Apr. 5, 2019; 1 page.
Oilfield Glossary; Definition of Perforating Gun; dated Feb. 26, 2013; 2 pages.
oilgasglossary.com; Definition of "sub"; dated Nov. 20, 2008; 1 page.
Olsen, Steve; Declaration regarding the SafeJet System for PGR2021-00097; dated Jul. 16, 2021; 25 pages.
Orlca, Uni Tronic 600 Electronic Blasting System, Technical Data Sheet, Jun. 19, 2016, 2 pgs., www.oricaminingservices.com/download/file_id_19567/.
Oso Perforating, LLC; Defendant's Preliminary Invalidity Contentions for Civil Action No. 3:21-cv-00188-M; dated Aug. 4, 2021; 23 pages.
Oso Perforating, LLC; Exhibit A1 U.S. Pat. No. 5,155,293 to Barton vs. Asserted Claims of U.S. Pat. No. 10,844,697; dated Aug. 4, 2021; 21 pages.
Owen Oil Tools & Pacific Scientific; RF-Safe Green Det, Side Block for Side Initiation, Jul. 26, 2017, 2 pgs.
Owen Oil Tools, E & B Select Fire Side Port, Tandem Sub, Apr. 2010, 2 pgs., https://www.corelab.com/owen/cms/docs/Canada/10A_eandbsystem-01.0-c.pdf.
Owen Oil Tools, Expendable Perforating Guns, Jul. 2008, 7 pgs., https://www.corelab.com/owen/cms/docs/Canada/10A_erhsc-01.0-c.pdf.
Owen Oil Tools, Recommended Practice for Oilfield Explosive Safety, Presented at 2011 MENAPS Middle East and North Africa Perforating Symposium, Nov. 28-30, 2011, 6 pages.
Owen Oil Tools; CoreLab Safe Ignition System Owen Det Bodies; dated 2015; 12 pages.
Owens Oil Tools, E & B Select Fire Side Port Tandem Sub Assembly Man-30-XXX-0002-96, revised Dec. 2012, 9 pgs., https://www.corelab.com/owen/CMS/docs/Manuals/gunsys/MAN-30-XXX-0002-96-R00.pdf.
Parrot, Robert; Declaration, PGR 2020-00080; dated Aug. 11, 2020; 400 pages.
Parrott, Robert A.; Declaration in Support of PGR20201-00089; dated Jun. 1, 2021; 353 pages.

(56) References Cited

OTHER PUBLICATIONS

Parrott, Robert; Declaration for IPR2021-00082; dated Oct. 20, 2020; 110 pages.
Parrott, Robert; Declaration for PGR No. 2021-00078; dated May 10, 2021; 182 pages.
Patent Trial and Appeal Board; Decision Granting Patent Owner's Request for Rehearing and Motion to Amend for IPR2018-00600; dated Jul. 6, 2020; 27 pages.
Patent Trial and Appeals Board; Decision Granting Institution of Post Grant Review, PGR No. PGR2021-00097; dated Jan. 6, 2022; 92 pages.
PCT Search Report and Written Opinion, mailed May 4, 2015: See Search Report and Written opinion for PCT Application No. PCT/EP2014/065752, 12 pgs.
Perforating Services Catalog 2008 part 1 of 2; Exhibit 1020 of PGR No. 2021-00089 dated 2008; 282 pages.
Perforating Services Catalog 2008 part 2 of 2; Exhibit 1020 of PGR No. 2021-00089; dated 2008; 239 pages.
Perfx Wireline Services, LLC; PerfX Wireline Services, LLC's Preliminary Invalidity Contentions for Civil Action No. 1:20-CV-03665; dated Jul. 2, 2021; 4 pages.
Perfx Wireline Services, LLC; Defendant PerfX Wireline Services, LLC's Opening Claim Construction Brief; dated Oct. 18, 2021; 23 pages.
Perfx Wireline Services, LLC; Invalidity Chart for U.S. Pat. No. 10,844,697 in view of the Dynawell Gun System Exhibit A; dated Jul. 2, 2021; 42 pages.
Perfx Wireline Services, LLC; Invalidity Chart for U.S. Pat. No. 10,844,697 in view of the LRI Gun System Exhibit B; dated Jul. 2, 2021; 33 pages.
Perfx Wireline Services, LLC; Invalidity Chart for U.S. Pat. No. 10,844,697 in view of the Owen Oil Tools System Exhibit C; dated Jul. 2, 2021; 64 pages.
Perfx Wireline Services, LLC; Invalidity Chart for U.S. Pat. No. 10,844,697 in view of the Select Fire System Exhibit D; dated Jul. 2, 2021; 49 pages.
Perfx Wireline Services, LLC; Invalidity Chart for U.S. Pat. No. 10,844,697 in view of U.S. Pat. No. 10,077,641 Exhibit H; dated Jul. 2, 2021; 41 pages.
Perfx Wireline Services, LLC; Invalidity Chart for U.S. Pat. No. 10,844,697 in view of U.S. Pat. No. 4,007,796 Exhibit F; dated Jul. 2, 2021; 40 pages.
Perfx Wireline Services, LLC; Invalidity Chart for U.S. Pat. No. 10,844,697 in view of U.S. Pat. No. 5,042,594 Exhibit E; dated Jul. 2, 2021; 38 pages.
Perfx Wireline Services, LLC; Invalidity Chart for U.S. Pat. No. 10,844,697 in view of U.S. Pat. No. 9,145,764 Exhibit G; dated Jul. 2, 2021; 58 pages.
Perfx's Wireline Services, LLC; Exhibit A-1: Invalidity Chart for U.S. Pat. No. 10,844,697 in view of the Dynawell Gun System; dated Aug. 30, 2021; 30 pages.
Perfx's Wireline Services, LLC; Exhibit A-2: Invalidity Chart for U.S. Pat. No. 10,844,697 in view of the LRI Gun System; dated Aug. 30, 2021; 29 pages.
Perfx's Wireline Services, LLC; Exhibit A-3: Invalidity Chart for U.S. Pat. No. 10,844,697 in view of the Owen Oil Tools System; dated Aug. 30, 2021; 42 pages.
Perfx's Wireline Services, LLC; Exhibit A-4: Invalidity Chart for U.S. Pat. No. 10,844,697 in view of the Select Fire System; dated Aug. 30, 2021; 32 pages.
Perfx's Wireline Services, LLC; Exhibit A-5: Invalidity Chart for U.S. Pat. No. 10,844,697 in view of U.S. Pat. No. 5,042,594; dated Aug. 30, 2021; 27 pages.
Perfx's Wireline Services, LLC; Exhibit A-6: Invalidity Chart for U.S. Pat. No. 10,844,697 in view of U.S. Pat. No. 4,007,796; dated Aug. 30, 2021; 23 pages.
Perfx's Wireline Services, LLC; Exhibit A-7: Invalidity Chart for U.S. Pat. No. 10,844,697 in view of U.S. Pat. No. 9,145,764; dated Aug. 30, 2021; 36 pages.
Perfx's Wireline Services, LLC; Exhibit A-8: Invalidity Chart for U.S. Pat. No. 10,844,697 in view of U.S. Pat. No. 10,077,6414; dated Aug. 30, 2021; 29 pages.
Perfx's Wireline Services, LLC; Exhibit A-9: Invalidity Chart for U.S. Pat. No. 10,844,697 in view of the SafeJet System; dated Aug. 30, 2021; 18 pages.
Perfx's Wireline Services, LLC; Exhibit B-1: Invalidity Chart for U.S. Pat. No. D. 904,475 in view of the Dynawell Tandem Sub; dated Aug. 30, 2021; 10 pages.
Perfx's Wireline Services, LLC; Exhibit B-2: Invalidity Chart for U.S. Pat. No. D. 904,475 in view of the LRI Tandem Subassembly; dated Aug. 30, 2021; 12 pages.
Perfx's Wireline Services, LLC; Exhibit B-3: Invalidity Chart for U.S. Pat. No. D. 904,475 in view of the Owen Oil Tools Tandem Sub; dated Aug. 30, 2021; 10 pages.
Perfx's Wireline Services, LLC; Exhibit B-4: Invalidity Chart for U.S. Pat. No. D. 904,475 in view of the XConnect Tandem Sub; dated Aug. 30, 2021; 1 page.
Perfx's Wireline Services, LLC; Exhibit B-5: Invalidity Chart for U.S. Pat. No. D. 904,475 in view of the SafeJet Disposable Bulkhead; dated Aug. 30, 2021; 15 pages.
Perfx's Wireline Services, LLC; Exhibit B-6: Invalidity Chart for U.S. Pat. No. D. 904,475 in view of Chinese Patent Application No. CN110424930A; dated Aug. 30, 2021; 9 pages.
Perfx's Wireline Services, LLC; Exhibit B-7: Invalidity Chart for U.S. Pat. No. D. 904,475 in view of U.S. Patent Publication No. 2020/0308938; dated Aug. 30, 2021; 8 pages.
Perfx's Wireline Services, LLC; Xconnect, LLC's Preliminary Invalidity Contentions for Civil Action No. 6:21-cv-00371-ADA; dated Aug. 30, 2021; 7 pages.
Preiss Frank et al.; Lowering Total Cost of Operations Through Higher Perforating Efficiency while simultaneously enhancing safety; May 10, 2016; 26 pages.
Promperforator LLC, Perforating Systems Design and Manufacturing, 2014, 36 pgs., http://www.promperforator.ru/upload/file/katalog_eng_2014.pdf.
Repeat Precision, LLC; Plaintiff Repeat Precision, LLC's Responsive Claim Construction Brief for Civil Action No. 6:21-cv-104-ADA, Public Version; dated Oct. 27, 2021; 21 pages.
Robert Parrott, Case IPR2018-00600 for U.S. Pat. No. 9,581,422 B2, Declaration regarding Patent Invalidity, dated Jun. 29, 2020, 146 pages.
Rodgers, John; Claim Construction Declaration for Civil Action No. 3:21-cv-00185; dated Sep. 28, 2021; 41 pages.
Rodgers, John; Claim Construction Declaration for Civil Action No. 3:21-cv-00188; dated Sep. 28, 2021; 42 pages.
Rodgers, John; Declaration for Civil Action No. 3:20-CV-00376; dated Jul. 8, 2021; 32 pages.
Rodgers, John; Declaration for Civil Action No. 3:21-cv-00192-M; dated May 27, 2021; 42 pages.
Rodgers, John; Declaration for PGR2020-00072; dated Oct. 23, 2020; 116 pages.
Rodgers, John; Declaration for PGR2020-00080; dated Nov. 18, 2020; 142 pages.
Rodgers, John; Declaration for PGR2021-00078; dated Aug. 19, 2021; 137 pages.
Rodgers, John; Declaration of John Rodgers, Ph.D for PGR Case No. PGR2021-00097; dated Oct. 28, 2021; 124 pages.
Rodgers, John; Videotaped Deposition of John Rodgers; dated Jul. 29, 2021; 49 pages.
Salt Warren et al.; New Perforating Gun System Increases Safety and Efficiency; dated Apr. 1, 2016; 11 pages.
Salt, et al.; New Perforating Gun System Increases Saftey and Efficiency; Journal of Petroleum Technology; dated Apr. 1, 2016; Weatherford; https://jpt.spe.org/new-perforating-gun-system-increases-safety-and-efficiency; 11 pages.
Scharf Thilo; Declaration for PGR2020-00080; dated Nov. 16, 2020; 16 pages.
Scharf, Thilo; Declaration for PGR2020-00072; dated Oct. 22, 2020; 13 pages.
Schlumberger & Said Abubakr, Combining and Customizing Technologies for Perforating Horizontal Wells in Algeria, Presented at 2011 MENAPS, Nov. 28-30, 2011, 20 pages.

(56) References Cited

OTHER PUBLICATIONS

Schlumberger Technology Corporation, Defendant Schlumberger Technology Corporation's Opening Claim Construction Brief for Civil Action No. 6:21-cv-00225-ADA; dated Oct. 6, 2021; 27pages.
Schlumberger Technology Corporation; Defendant Schlumberger Technology Corporation's Reply to Plaintiffs' Responsive Claim Construction Brief; dated Nov. 10, 2021; 17 pages.
Schlumberger Technology Corporation; Petitioner's Reply to Patent Owner's Preliminary Response; dated Oct. 13, 2021; 14 pages.
Schlumberger Technology Corporation; Petiton for Post Grant Review Case No. PGR2021-00089; dated Jun. 1, 2021; 155 pages.
Schlumberger, Perforating Services Catalog, 2008, 521 pages.
Schlumberger; 3.12-in Frac Gun; dated 2007; 2 pages.
Schlumberger; Field Test Database Print Out Showing uses of the SafeJet System; dated May 11, 2015; 10 pages.
Schlumberger; Fractal Flex Multistage stimulation perforating system; dated 2018; 1 page.
Schlumberger; Lina Pradilla, Wireline Efficiency in Unconventional Plays—The Argentinean Experience, including excerpted image from slide 13; dated 2013; 16 pages http://www.perforators.org/wp-content/uploads/2015/10/SLAP_47_Wireline_Efficiency_Unconventional_Plays.pdf.
Schlumberger; Selective Perforation: A Game Changer in Perforating Technology—Case Study; issued 2012; 14 pages.
Science Direct; Perforating Gun Well-Bore Construction (Drilling and Completions); dated Jul. 20, 2021; 13 pages.
Select Fire System; Exhibit 1028 of PGR 2021-00078; dated 2012; 165 pages.
Sharma, Gaurav; Hunting Plc Is Not in a Race to the Bottom, Says Oilfield Services Firm's CEO; dated Sep. 10, 2019; retrieved on Nov. 18, 2020; 6 pages.
Shelby Sullivan; Declaration of Shelby Sullivan; dated Oct. 18, 2021; 9 pages.
SIPO, Search Report dated Mar. 29, 2017, in Chinese: See Search Report for CN App. No. 201480040456.9, 12 pgs. (English Translation 3 pgs.).
Smithson, Anthony; Declaration Declaration for IPR2021-00082; dated Oct. 16, 2020; 2 pages.
Smylie, Tom, New Safe and Secure Detonators for the Industry's consideration, presented at Explosives Safety & Security Conference, Marathon Oil Co, Houston; Feb. 23-24, 2005, 20 pages.
State Intellectual Property Office People's Republic of China; First Office Action for Chinese App. No. 201811156092.7; issued Jun. 16, 2020; 6 pages (Eng Translation 8 pages).
State Intellectual Property Office, P.R. China; First Office Action for Chinese App No. 201580011132.7; issued Jun. 27, 2018; 5 pages (Eng. Translation 9 pages).
United States Patent and Trademark Office; Non-Final Office Action issued in U.S. Appl. No. 18/327,451 dated Aug. 1, 2024; 15 pages.

\* cited by examiner

INITIATOR HEAD WITH CIRCUIT BOARD

CROSS-REFERENCE TO RELATED APPLICATIONS

This application is a continuation of U.S. application Ser. No. 17/783,065 filed Jun. 7, 2022, which is a national stage entry of International Application No. PCT/EP2020/085622 filed Dec. 10, 2020, which claims priority to U.S. Provisional Application No. 62/945,942 filed Dec. 10, 2019, U.S. Provisional Application No. 63/001,766 filed Mar. 30, 2020, and U.S. Provisional Application No. 63/003,222, filed Mar. 31, 2020, the contents of each of which are incorporated herein by reference.

BACKGROUND OF THE DISCLOSURE

Hydrocarbons, such as fossil fuels and natural gas, are extracted from underground wellbores extending deeply below the surface using complex machinery and explosive devices. Once the wellbore is established by placement of cases after drilling, a perforating gun assembly, or train or string of multiple perforating gun assemblies, is lowered into the wellbore and positioned adjacent one or more hydrocarbon reservoirs in underground formations. The perforating gun may have explosive charges which are ignited to create holes in the casing and to blast through the formation so that the hydrocarbons can flow through the casing. Once the perforating gun(s) is properly positioned, a surface signal actuates an ignition of a fuse, which in turn initiates a detonating cord, which detonates the shaped charges to penetrate/perforate the casing and thereby allow formation fluids to flow through the perforations thus formed and into a production string. The surface signal may travel from the surface along electrical wires that run from the surface to one or more initiators, such as ignitors or detonators positioned within the perforating gun assembly.

Assembly of a perforating gun requires assembly of multiple parts, which may include at least the following components: a housing or outer gun barrel within which is positioned an electrical wire for communicating from the surface to initiate ignition, of an initiator and/or a detonator, a detonating cord, one or more charges and, where necessary, one or more boosters. Assembly may include threaded insertion of one component into another by screwing or twisting the components into place, optionally by use of a tandem adapter. Since the electrical wire must extend through much of the perforating gun assembly, the wire may become easily twisted and crimped during assembly. In addition, when a wired detonator is used it must be manually connected to the electrical wire, which may lead to multiple problems. Due to the rotating assembly of parts, the wires can become torn, twisted and/or crimped/nicked, the wires may be inadvertently disconnected, or even mis-connected in error during assembly. This may lead to costly delays in extracting the hydrocarbons. Additionally, there is a significant safety risk associated with physically and manually wiring live explosives.

Accordingly, there may be a need for an initiator that would allow for reliable detonation of perforating guns without requiring physically and manually wiring live explosives.

Additionally, in certain applications, hydraulic fracturing may produce optimal results when perforations are oriented in the direction of maximum principle stress or the preferred fracture plane (PFP). Perforations oriented in the direction of the PFP create stable perforation tunnels and transverse fractures (perpendicular to the wellbore) that begin at the wellbore face and extend far into the formation. However, if fractures are not oriented in the direction of maximum stress, tortuous, non-transverse fractures may result, creating a complex near-wellbore flow path that can affect the connectivity of the fracture network, increase the chance of premature screen-out, and impede hydrocarbon flow. Accordingly, there may be a need for equipment that can allow for orientation verification of the perforating guns to ensure that perforations are formed in the preferred fracture plane.

BRIEF DESCRIPTION

An exemplary embodiment of an initiator head may include a housing extending in an axial direction, a circuit board provided in an interior space of the housing, a line-in terminal provided on a first side of the housing in the axial direction and accessible from an exterior of the housing, and a fuse displaced from the circuit board in the axial direction. A thickness direction of the circuit board may be substantially parallel with the axial direction. The line-in terminal may be in electrical communication with the circuit board. The fuse may be in electrical communication with the circuit board. The circuit board may be configured to activate the fuse in response to a control signal received at the line-in terminal.

An exemplary embodiment of an initiator may include an initiator shell extending in an axial direction and a head connected to the initiator shell at a first end of the initiator shell in the axial direction. The initiator shell may include a shell wall defining a shell interior and an explosive provided within the shell interior. The head may include a circuit board provided in an interior space of the head and a line-in terminal accessible from an exterior of the head. A thickness direction of the circuit board may be substantially parallel with the axial direction. The line-in terminal may be in electrical communication with the circuit board. The circuit board may be configured to activate the explosive in response to a control signal received at the line-in terminal.

An exemplary embodiment of an initiator system may include an initiator holder and an initiator received within the initiator holder. The initiator may include an initiator shell extending in an axial direction and a head connected to the initiator shell at a first end of the initiator shell in the axial direction. The initiator shell may include a shell wall formed in a hollow tube shape defining a shell interior and an explosive provided within the shell interior. The head may include a circuit board provided in an interior space of the head and a line-in terminal provided on a first side of the head in the axial direction and accessible from an exterior of the head. A thickness direction of the circuit board may substantially parallel with the axial direction. The line-in terminal may be in electrical communication with the circuit board. The circuit board may be configured to activate the explosive in response to a control signal received at the line-in terminal.

BRIEF DESCRIPTION OF THE DRAWINGS

A more particular description will be rendered by reference to exemplary embodiments that are illustrated in the accompanying figures. Understanding that these drawings depict exemplary embodiments and do not limit the scope of this disclosure, the exemplary embodiments will be described and explained with additional specificity and detail through the use of the accompanying drawings in which.

Figure 1:
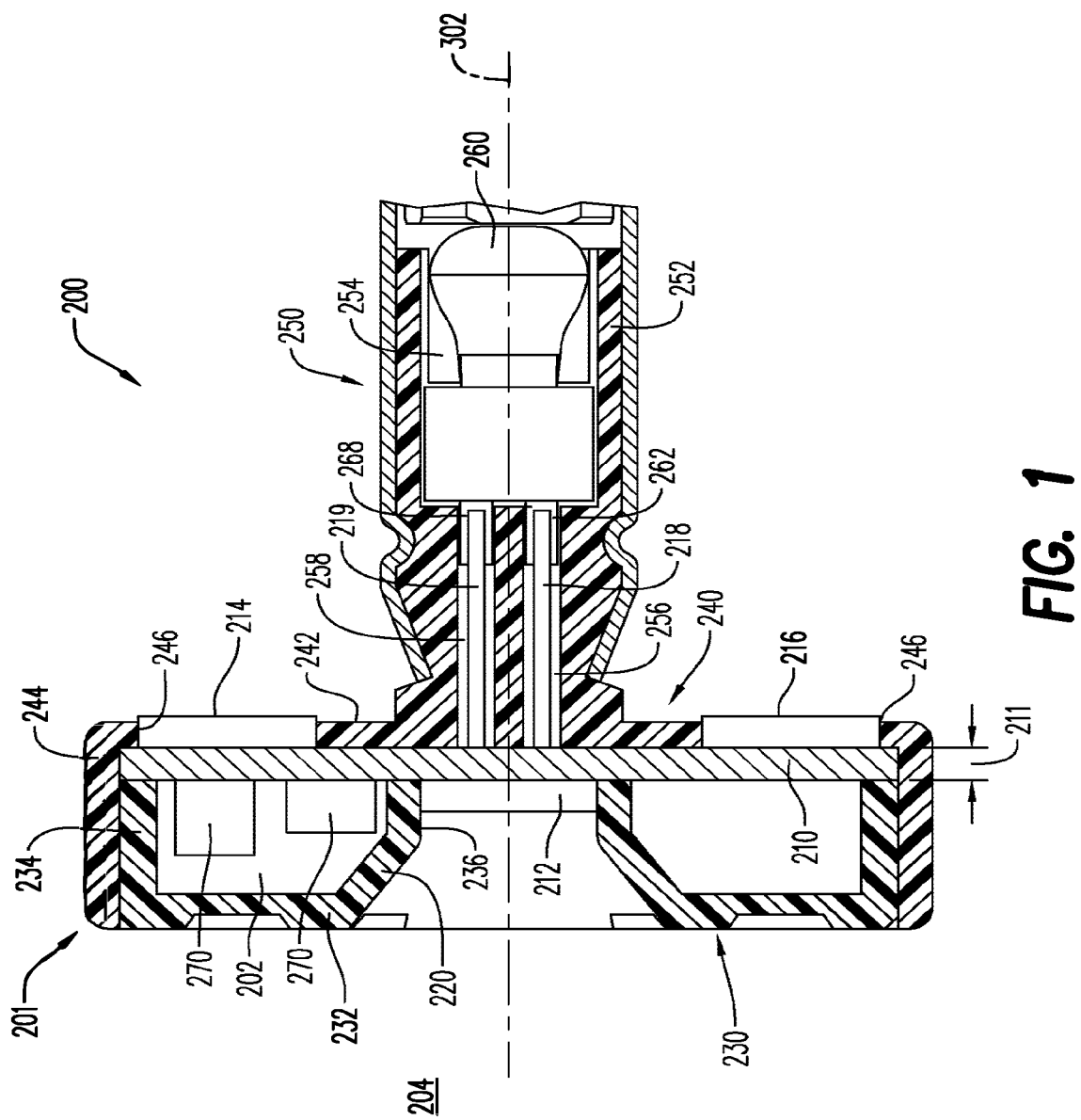
FIG. 1 is a cross section view of an initiator head according to an exemplary embodiment.

Various features, aspects, and advantages of the exemplary embodiments will become more apparent from the following detailed description, along with the accompanying drawings in which like numerals represent like components throughout the figures and detailed description. The various described features are not necessarily drawn to scale in the drawings but are drawn to emphasize specific features relevant to some embodiments.

The headings used herein are for organizational purposes only and are not meant to limit the scope of the disclosure or the claims. To facilitate understanding, reference numerals have been used, where possible, to designate like elements common to the figures.

DETAILED DESCRIPTION

Reference will now be made in detail to various embodiments. Each example is provided by way of explanation and is not meant as a limitation and does not constitute a definition of all possible embodiments.

FIGS. 1-7 show an exemplary embodiment of an initiator head 200. The initiator head may include a housing 201, a circuit board 210, a line-in terminal 212, a line-out terminal 214, a ground terminal 216, a stem 250, and a fuse 260.

As seen in FIG. 1, the housing 201 may extend in an axial direction 302 and may define an interior space 202. The housing 201 may be formed of an insulating material, and may be formed by molding, 3D-printing, additive manufacturing, subtractive manufacturing, or any other suitable method. For example, in an exemplary embodiment, the housing 201 may be formed of a non-conductive plastic material such as polyamide. The housing 201 may include a first housing piece 230 and a second housing piece 240 engaged together. Alternatively, the housing 201 may be an integral or monolithic piece molded or additively manufactured around the circuit board 210.

Figure 4:
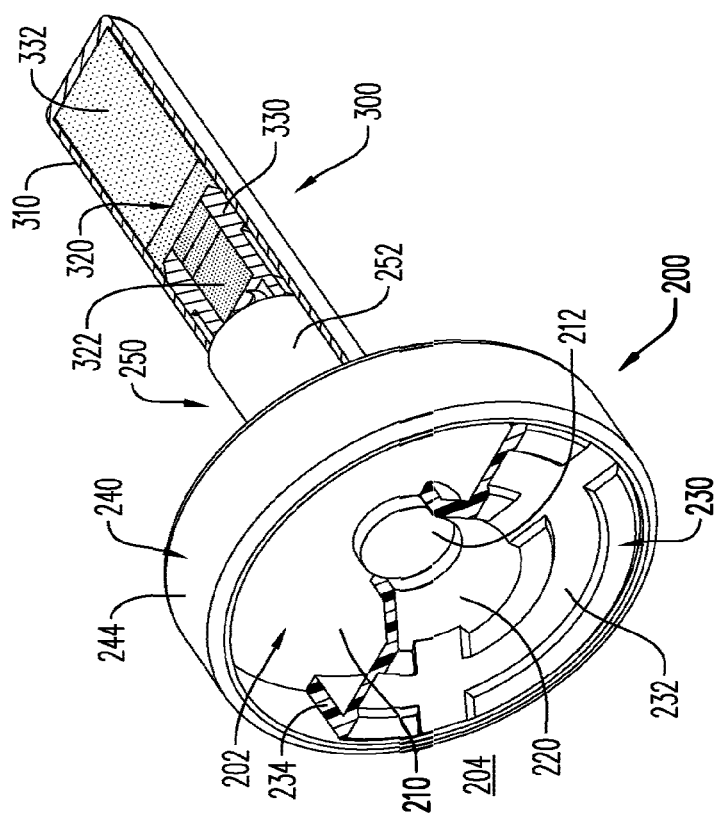
FIG. 4 is a partial, cross section view of an initiator according to an exemplary embodiment, showing a cutaway view of a head and a cross-section of an initiator shell.

FIG. 1 further shows that an exemplary embodiment of the first housing piece 230 may include a first plate 232. A thickness direction of the first plate 232 may be substantially parallel to the axial direction 302. As further seen in FIGS. 1-2, an exemplary embodiment of the first plate 232 may be shaped as an annulus having a substantially circular periphery and a substantially circular through hole 236. The through hole 236 may be structured to expose the line-in terminal 212 to an exterior 204 of the housing 201. The first plate 232 may further include a sloped wall 220 sloping from the first plate in the axial direction 302 toward the circuit board 210. The sloped wall 220 may help to guide a contact pin to contact with the line-in terminal 212. The first housing piece 230 may further include a first outer peripheral wall 234 extending from the first plate 232 in the axial direction 302. FIG. 1 and FIG. 4 show an exemplary embodiment in which the first outer peripheral wall 234 extends from an outer periphery of the first plate 232.

Figure 3:
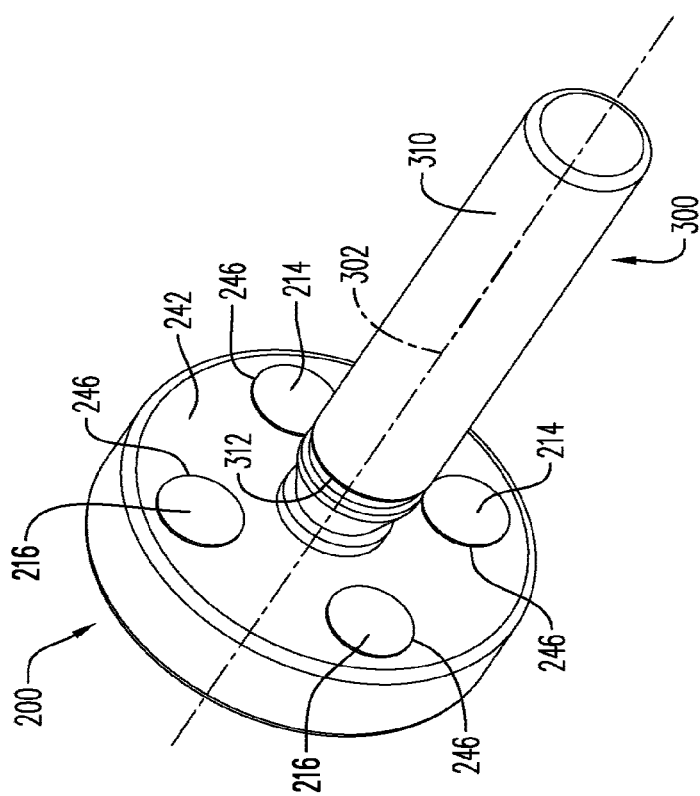
FIG. 3 is a perspective view of an initiator according to an exemplary embodiment.
Figure 2:
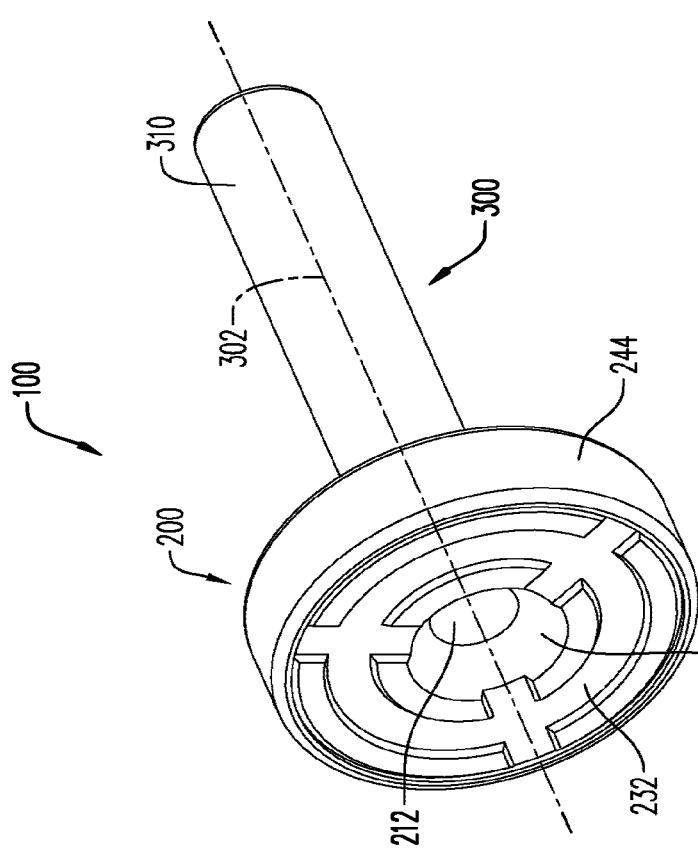
FIG. 2 is a perspective view of an initiator according to an exemplary embodiment.
Figure 5:
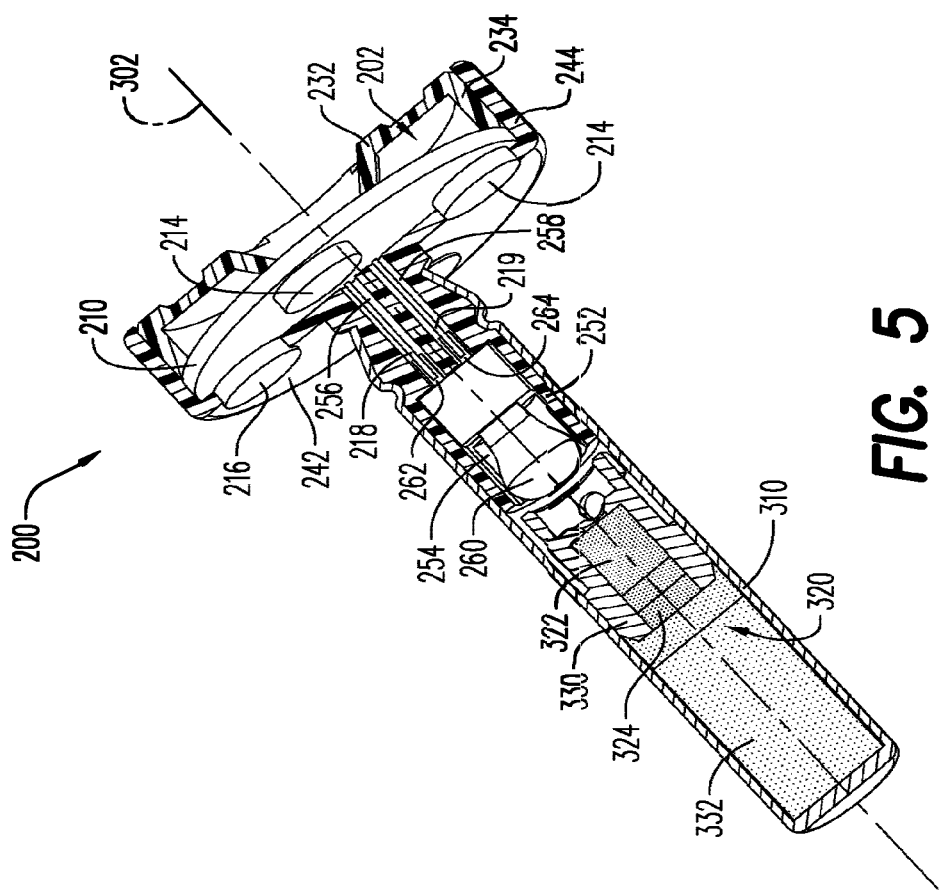
FIG. 5 is a partial cross section view of an initiator according to an exemplary embodiment, showing a cutaway view of a head and a cross-section of an initiator shell.

FIG. 1 further shows that an exemplary embodiment of the second housing piece 240 may include a second plate 242. A thickness direction of the second plate 242 may be substantially parallel to the axial direction 302. As further seen in FIG. 3, an exemplary embodiment of the second plate 242 may be substantially circular in shape. The second plate 242 may further include through holes 246 structured to expose the line-out terminal 214 and the ground terminal 216 to an exterior 204 of the housing 201. The second housing piece 240 may further include a second outer peripheral wall 244 extending from the second plate 242 in the axial direction 302. FIG. 1 and FIG. 3 show an exemplary embodiment in which the second outer peripheral wall 244 extends from an outer periphery of the second plate 242.

As further seen in FIG. 1, the first outer peripheral wall 234 and the second outer peripheral wall 244 may overlap in the axial direction, such that the interior space 202 is formed between the first plate 232 and the second plate 242 in the axial direction. In other words, the interior space 202 may be bounded by the first housing piece 230 and the second housing piece 240. In an exemplary embodiment, a first housing piece radius of the first housing piece 230 may be smaller than a second housing piece radius of the second housing piece 240. Thus, the first housing piece 230 may be received within the second housing piece 240 with the first outer peripheral wall 234 being provided between the first plate 232 and the second plate 242 in the axial direction 302. Alternatively, the first housing piece radius may be larger than the second housing piece radius, and the second housing piece 240 may be received within the first housing piece 230, with the second peripheral wall 234 being provided between the first plate 232 and the second plate 242 in the axial direction 302.

The first housing piece 230 and the second housing piece 240 may be dimensioned such that the first housing piece 230 and the second housing piece 240 fit snugly together so as not to separate under normal operating conditions. Alternatively, the first housing piece 230 and the second housing piece 240 may be provided with a coupling mechanism such as hook or protrusion and a complementary recess, so that the first housing piece 230 and the second housing piece 240 may snap together. Alternatively, the first outer peripheral wall 234 and the second outer peripheral wall 244 may be complementarily threaded so that the first housing piece 230 and the second housing piece 240 may screw together. Alternatively, the first housing piece 230 and the second housing piece 240 may be bonded together with adhesive.

FIG. 1 further shows an exemplary embodiment of a circuit board 210. A thickness direction 211 of the circuit board 210 may be substantially parallel with the axial direction 302. As explained in further detail herein, orienting the thickness direction 211 substantially parallel with the axial direction 302 allows room for larger firing capacitors and/or surface mounted components 270 to be mounted on the circuit board 210.

In an exemplary embodiment, the line-in terminal 212, the line-out terminal 214, the ground terminal 216, and the fuse 260 may be in electrical communication with the circuit board 210. The line-in terminal 212 may be provided on a first side of the circuit board 210 in the axial direction, and thereby the line-in terminal 212 may be provided on a first side of the housing 201 in the axial direction (i.e., to the left in FIG. 1). The line-out terminal 214 and the ground terminal 216 may be provided on a second side of the circuit board 210 in the axial direction opposite to the first side (i.e., to the right in FIG. 1). The line-out terminal 214 may be configured to output a signal received by the line-in terminal 212, either directly or in response to processing by the circuit board 210, as described in detail herein, by being in electrical communication with either the line-in terminal 212 or the circuit board 210.

FIG. 3 shows an exemplary embodiment in which a plurality of line-out terminals 214 and a plurality of ground terminals 216 are provided. The plurality of line-out terminals 214 and the plurality of ground terminals 216 provide a layer of redundancy to help ensure sufficient connection of the initiator head 200 to external electrical components, as explained in detail herein. Each line-out terminal 214 of the plurality of line-out terminals 214 may be directly connected to each other within the housing 201 or on the circuit board 210. In other words, if one line-out terminal 214 is in electrical communication with the circuit board 210, then each line-out terminal 214 of the plurality of line-out terminals 214 may be in electrical communication with the circuit board 210. Similarly, if one line-out terminal 214 becomes in electrical communication with the line-in terminal 212, then each line-out terminal 214 of the plurality of line-out terminals may be in electrical communication with the line-in terminal 212. Similarly, if one ground terminal 216 is in electrical communication with the circuit board 210, then each ground terminal 216 of the plurality of ground terminals 216 may be in electrical communication with the circuit board 210.

Figure 7:
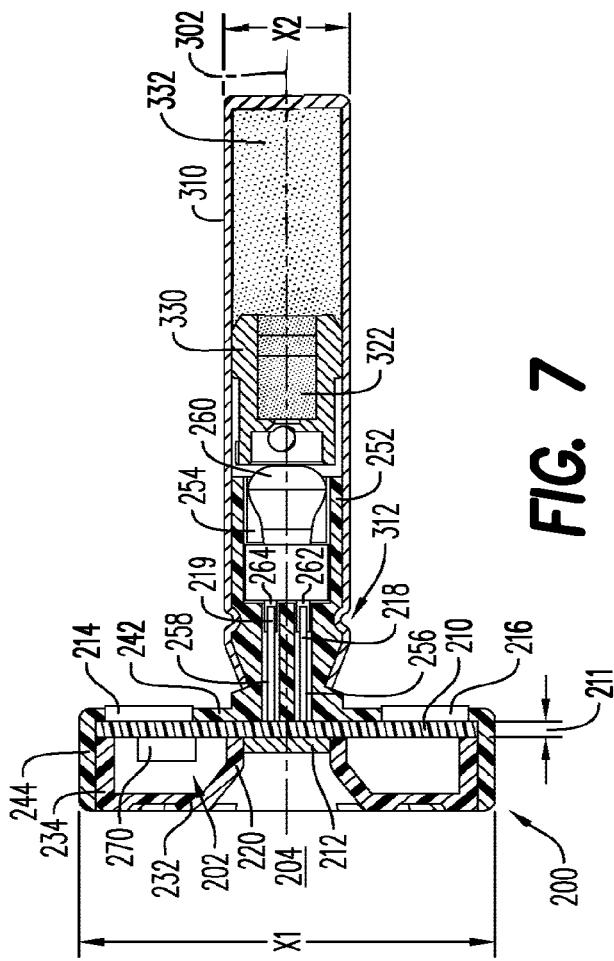
FIG. 7 is a cross section view of an initiator according to an exemplary embodiment.

As further seen in FIG. 1 and FIG. 7, the circuit board 210 may be a printed circuit board and/or may include one or more surface mounted components 270. The arrangement of the circuit board 210 and the shape of the initiator head 200 may provide sufficient space in the interior space 202 to accommodate a variety of surface mounted components 270. In an exemplary embodiment, the surface mounted component 270 of the circuit board 210 may be an integrated circuit (IC) with a dedicated function, a programmable IC, or a microprocessor IC. The circuit board 210 may be configured to activate the fuse 260 in response to a control signal received at the line-in terminal 212. For example, a user may send a firing signal via a firing panel. The firing signal may be received at the line-in terminal 212, and the circuit board 210, through ICs provided on the circuit board 210, may process the firing signal and activate the fuse 260. Additionally, the circuit board 210 may include a switch circuit configured to establish electrical communication between the line-out terminal 214 and the line-in terminal 212 in response to a predetermined switch signal. The line-out terminal 214 may be in electrical communication with subsequent initiator heads 200 provided downstream in a string of connected perforating guns, thereby allowing a user to send switch signals to toggle which initiator head is active to receive a firing command.

In an exemplary embodiment, one of the surface mounted components 270 may be one selected from a group consisting of a temperature sensor, an orientation sensor, a safety circuit, and a capacitor. Readings from one of these components may be used by a microprocessor on circuit board 210 to determine when it is appropriate to activate the fuse 260. The temperature sensor may be configured to measure temperature of the wellbore environment and provide a signal corresponding to the temperature to the circuit board 210. The orientation sensor may include, but is not limited to, an accelerometer, a gyroscope, and/or a magnetometer. The orientation sensor may be configured to determine an orientation of the initiator head 200 within the wellbore, which, if the orientation of the initiator head is fixed relative to a charge holder, can be used to determine an orientation of the charge(s) in the perforating gun. In an exemplary embodiment, the orientation sensor may determine an orientation of the initiator head 200 relative to gravity. Alternatively, the orientation sensor may determine an orientation of the initiator head relative an ambient magnetic field. The safety circuit may provide additional safety precautions to prevent unintentional activation of the initiator 100. The capacitor may be used to store a voltage to activate the fuse 260. The size of the interior space 202 may allow for a larger capacity capacitor to be used. This allows a larger discharge voltage for activating the fuse 260, which may help to ensure more reliable activation of the fuse 260.

FIG. 1 and FIGS. 4-7 further show an exemplary embodiment of the stem 250. The stem 250 may extend in the axial direction 302 from the housing 201. In an exemplary embodiment, the stem 250 may be formed of the same material as the second housing piece 240 and may be integrally and/or monolithically formed with the second plate 242. Alternatively, the stem may be formed as a separate piece and mechanically connected to the second housing piece via clips or mated structures such as protrusions and recesses, or adhesively connected using an adhesive.

As seen in FIG. 1, the stem 250 may include a stem outer peripheral wall 252. The stem outer peripheral wall 252 may define a stem cavity 254 provided radially inward from the stem outer peripheral wall 252. A first discharge channel 256 and a second discharge channel 258 may connect the stem cavity 254 and the interior space 202 of the housing 201. The first discharge channel 256 may accommodate therein a first discharge terminal 218 in electrical communication with the circuit board 210. In other words, the first discharge terminal 218 may extend from the circuit board 210 into the first discharge channel 256. Similarly, the second discharge channel 256 may accommodate therein a second discharge terminal 219 in electrical communication with the circuit board 210. In other words, the second discharge terminal 219 may extend from the circuit board 210 into the second discharge channel 258.

FIG. 1 further shows that, in an exemplary embodiment, the fuse 260 may be provided within the stem cavity 254. A first end of a first fuse terminal 262 may be in electrical communication with the first discharge terminal 218 within the first discharge channel 256, and a second end of the first fuse terminal may be proximate to the fuse 260. A first end of a second fuse terminal 264 may be in electrical communication with the second discharge terminal 219 within the second discharge channel 258, and a second end of the second fuse terminal 264 may be proximate to the fuse 260 and the second end of the first fuse terminal 262. The circuit board 210 may be configured to activate the fuse 260 in response to a control signal by discharging a stored voltage across the first fuse terminal 262 and the second fuse terminal 264. The store voltage may be stored in a capacitor in electrical communication with the circuit board 210. In an exemplary embodiment, the capacitor may be one of the surface mounted components 270 provided on the circuit board 210. The proximity of the second end of the first fuse terminal 262 and the second end of the second fuse terminal 264 may allow for the generation of a spark when the stored voltage is discharged, thereby activating the fuse 260. In an exemplary embodiment, activating the fuse 260 may include igniting or detonating the fuse 260.

Figure 6:
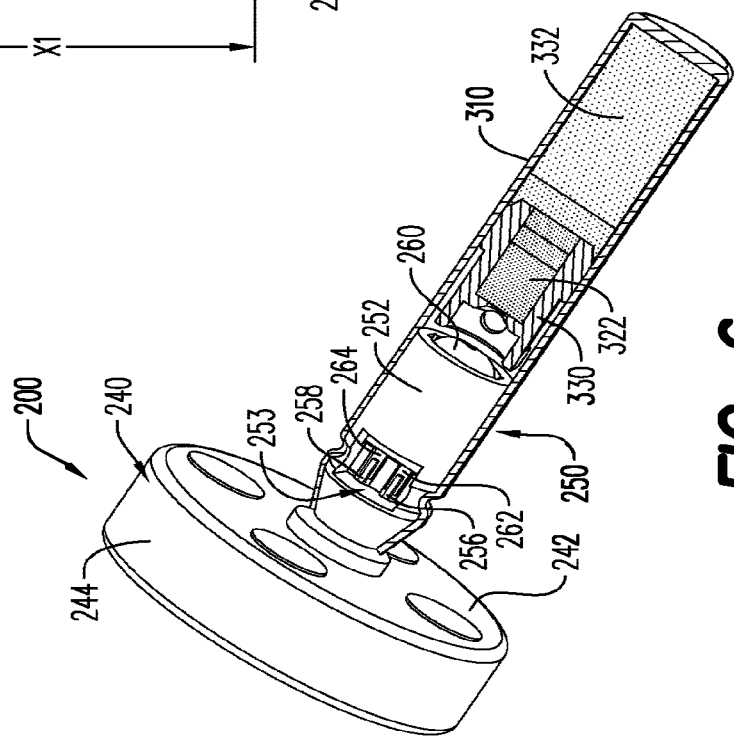
FIG. 6 is a partial, cross section view of an initiator, illustrating contents of an initiator shell according to an exemplary embodiment.

As seen in FIG. 6, an exemplary embodiment of the stem 250 may include a window 253 cut through the stem outer peripheral wall 252. The window 253 may allow access for a user to connect the first discharge terminal 218 to the first fuse terminal 262 and the second discharge terminal 219 to the second fuse terminal 264, such as by soldering, during assembly of the initiator head 200.

Figure 14:
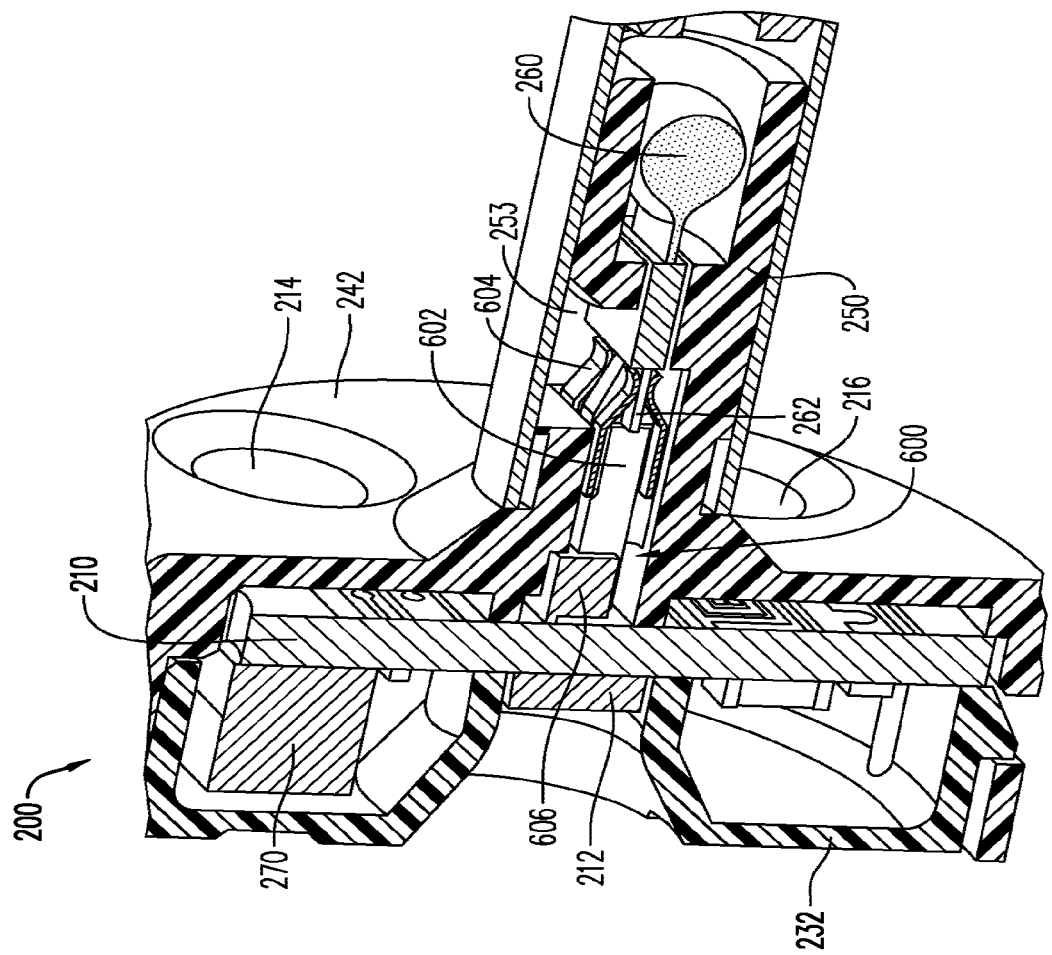
FIG. 14 is a cutaway perspective view of an initiator head according to an exemplary embodiment.

FIGS. 14-19 show exemplary embodiments in which the circuit board 210 is in electrical communication with the fuse 260 via direct physical contact, so as to streamline the manufacturing process by eliminating soldering between the circuit board 210 and the fuse 260. For example, FIG. 14 shows an exemplary embodiment in which the circuit board 210 is in electrical communication with the fuse 260 via a fuse connector assembly 600. The fuse connector assembly 600 may include a first discharge connector 602 configured to receive and make direct electrical contact with the first fuse terminal 262 and a second discharge connector 604 configured to receive and make direct electrical contact with the second fuse terminal 264 (not shown in FIG. 14).

The fuse connector assembly 600 may include a mounting block 606, the first discharge connector 602 extending through the mounting block 606, and the second discharge connector 604 extending through the mounting block 606. The mounting block 606 may be formed of an insulating material and may facilitate connection and/or fastening of the fuse connector assembly 600 to the circuit board 210. Further, the mounting block 606 may provide mechanical strength and support for the fuse connector assembly 600. When the fuse connector assembly 600 is connected to the circuit board 210, the first discharge connector 602 and the second discharge connector 604 may extend from the circuit board 210 into the stem 250.

Figure 15:
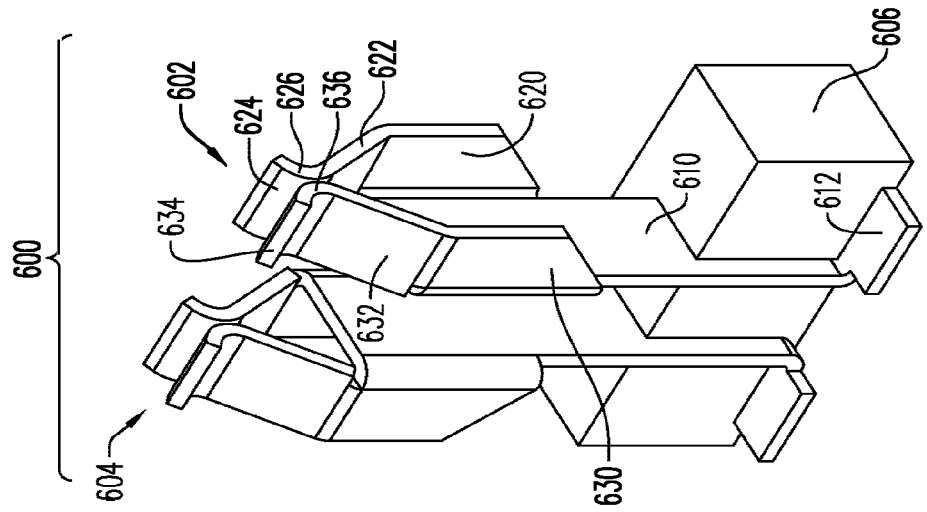
FIG. 15 is a perspective view of a fuse connector assembly according to an exemplary embodiment.

FIG. 15 further shows an exemplary embodiment of the first discharge connector 602. For simplicity, only the first discharge connector 602 is described in detail herein; it will be understood from FIG. 15 that the second discharge connector 604 may be substantially similar to the first discharge connector 602 in terms of structure. The first discharge connector 602 may be formed of an electrically conductive material. The first discharge connector 602 may include a first body portion 610, and a first board connector terminal 612 may be provided at a first end of the first body portion 610. The first board connector terminal 612 may connect to the circuit board 210.

The first discharge connector 602 may further include a first base portion 620 and a second base portion 630 extending from the first body portion 610 at a second end of the first body portion 610. The first discharge connector 602 may further include a first arm portion 622 extending from the first base portion 620 and a second arm portion 632 extending from the second base portion 630. The first arm portion 622 may be bent or inclined in a direction toward the second arm portion 632. Similarly, the second arm portion 632 may be bent or inclined in a direction toward the first arm portion 622. The first discharge connector 602 may further include a first tip portion 624 at an end of the first arm portion 622 and a second tip portion 634 at an end of the second arm portion 632. The first tip portion 624 may be bent or inclined in a direction away from the second tip portion 634. Similarly, the second tip portion 634 may be bent or inclined in a direction away from the first tip portion 624.

A first contact portion 626 may be formed between the first arm portion 622 and the first tip portion 624, and a second contact portion 636 may be formed between the second arm portion 632 and the second tip portion 634. The first contact portion 626 may be resiliently biased toward the second contact portion 636 based on the connection between the first base portion 620 and the first arm portion 622. Similarly, the second contact portion 636 may be resiliently biased toward the first contact portion 626 based on the connection between the second base portion 630 and the second arm portion 632. The first contact portion 626 may be in contact with the second contact portion 636. Alternatively, there may be a gap between the first contact portion 626 and the second contact portion 636. In an exemplary embodiment, a size of the gap may be less than a thickness of the first fuse terminal 262.

The first discharge connector 602 may be configured to receive, and make electrical contact with, the first fuse terminal 262. Similarly, the second discharge connector 604 may be configured to receive, and make electrical contact with, the second fuse terminal 264. For example, during assembly of the initiator head 200, the circuit board 210 and the fuse 260 may be pushed together in the axial direction 302, thereby bringing the first fuse terminal 262 into contact with the first tip portion 624 and the second tip portion 634. Further relative motion between the fuse 260 and the circuit board 210 may cause the first fuse terminal 262 to deflect the first tip portion 624 and the second tip portion 634 away from each other. The first fuse terminal 262 may then be in contact with the first contact portion 626 and the second contact portion 636, i.e., sandwiched between the first contact portion 626 and the second contact portion 636. The resilient bias of the first contact portion 626 and the second contact portion 636 may help to maintain contact, and thus electrical communication, between the first contact portion 626, the second contact portion 636, and the first fuse terminal 262. It will be understood that contact between the second discharge connector 604 and the second fuse terminal 264 may be achieved in a similar way. The window 253 may allow for visual confirmation of the connection between the first discharge connector 602 and the first fuse terminal 262 and between the second discharge connector 604 and the second fuse terminal 264.

Figure 16:
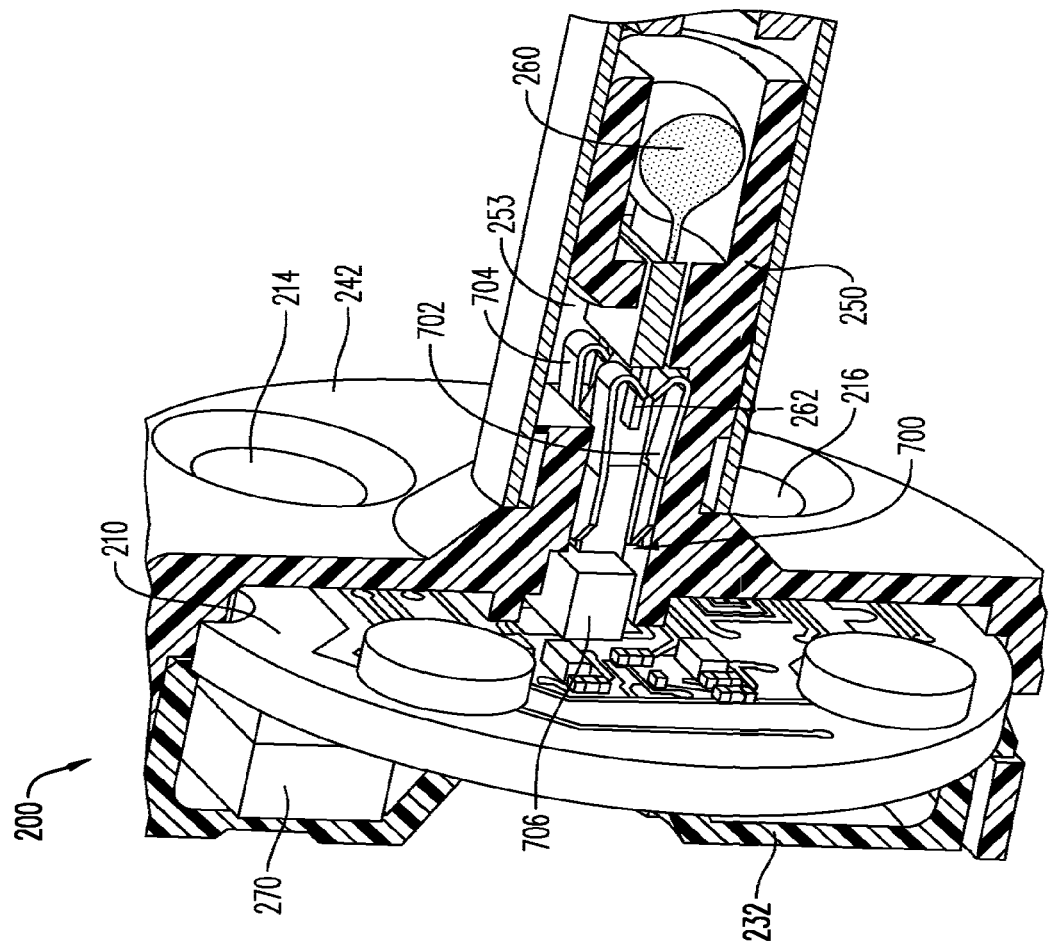
FIG. 16 is a cutaway perspective view of an initiator head according to an exemplary embodiment.

FIG. 16 shows an exemplary embodiment in which the circuit board 210 is in electrical communication with the fuse 260 via a fuse connector assembly 700. The fuse connector assembly 700 may include a first discharge connector 702 configured to receive and make direct electrical contact with the first fuse terminal 262 and a second discharge connector 704 configured to receive and make direct electrical contact with the second fuse terminal 264 (not shown in FIG. 16).

The fuse connector assembly 700 may include a mounting block 706, the first discharge connector 702 extending through the mounting block 706, and the second discharge connector 704 extending through the mounting block 706. The mounting block 706 may be formed of an insulating material and may facilitate connection and/or fastening of the fuse connector assembly 700 to the circuit board 210. Further, the mounting block 706 may provide mechanical strength and support for the fuse connector assembly 700. When the fuse connector assembly 700 is connected to the circuit board 210, the first discharge connector 702 and the second discharge connector 704 may extend from the circuit board 210 into the stem 250.

Figure 17:
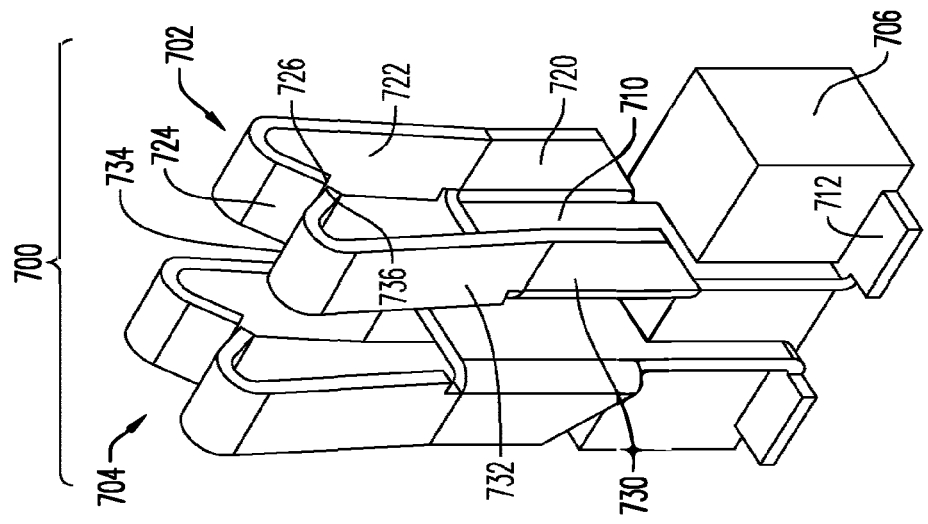
FIG. 17 is a perspective view of a fuse connector assembly according to an exemplary embodiment.

FIG. 17 further shows an exemplary embodiment of the first discharge connector 702. For simplicity, only the first discharge connector 702 is described in detail herein; it will be understood from FIG. 17 that the second discharge connector 704 may be substantially similar to the first discharge connector 702 in terms of structure. The first discharge connector 702 may be formed of an electrically conductive material. The first discharge connector 702 may include a first body portion 710, and a first board connector terminal 712 may be provided at a first end of the first body portion 710. The first board connector terminal 712 may connect to the circuit board 210.

The first discharge connector 702 may further include a first base portion 720 and a second base portion 730 extending from the first body portion 710 at a second end of the first body portion 710. The first discharge connector 702 may further include a first arm portion 722 extending from the first base portion 720 and a second arm portion 732 extending from the second base portion 730. The first arm portion 722 may be bent or inclined in a direction away from the second arm portion 732. Similarly, the second arm portion 732 may be bent or inclined in a direction away from the first arm portion 722. The first discharge connector 702 may further include a first tip portion 724 at an end of the first arm portion 722 and a second tip portion 734 at an end of the second arm portion 732. The first tip portion 724 may be bent or inclined in a direction toward the second tip portion 734 and back toward the first body portion 710. Similarly, the second tip portion 734 may be bent or inclined in a direction toward the first tip portion 724 and back toward the first body portion 710.

A first contact portion 726 may be formed at an end of the first tip portion 724, and a second contact portion 736 may be formed at an end of the second tip portion 734. The first contact portion 726 may be resiliently biased toward the second contact portion 736 based on the connection between the first base portion 720 and the first arm portion 722. Similarly, the second contact portion 736 may be resiliently biased toward the first contact portion 726 based on the connection between the second base portion 730 and the second arm portion 732. The first contact portion 726 may be in contact with the second contact portion 736. Alternatively, there may be a gap between the first contact portion 726 and the second contact portion 736. In an exemplary embodiment, a size of the gap may be less than a thickness of the first fuse terminal 262.

The first discharge connector 702 may be configured to receive, and make electrical contact with, the first fuse terminal 262. Similarly, the second discharge connector 704 may be configured to receive, and make electrical contact with, the second fuse terminal 264. For example, during assembly of the initiator head 200, the circuit board 210 and the fuse 260 may be pushed together in the axial direction 302, thereby bringing the first fuse terminal 262 into contact with the first tip portion 724 and the second tip portion 734. Further relative motion between the fuse 260 and the circuit board 210 may cause the first fuse terminal 262 to deflect the first tip portion 724 and the second tip portion 734 away from each other. The first fuse terminal 262 may then be in contact with the first contact portion 726 and the second contact portion 736, i.e., sandwiched between the first contact portion 726 and the second contact portion 736. The resilient bias of the first contact portion 726 and the second contact portion 736 may help to maintain contact, and thus electrical communication, between the first contact portion 726, the second contact portion 736, and the first fuse terminal 262. It will be understood that contact between the second discharge connector 704 and the second fuse terminal 264 may be achieved in a similar way. The window 253 may allow for visual confirmation of the connection between the first discharge connector 702 and the first fuse terminal 262 and between the second discharge connector 704 and the second fuse terminal 264.

Figure 19:
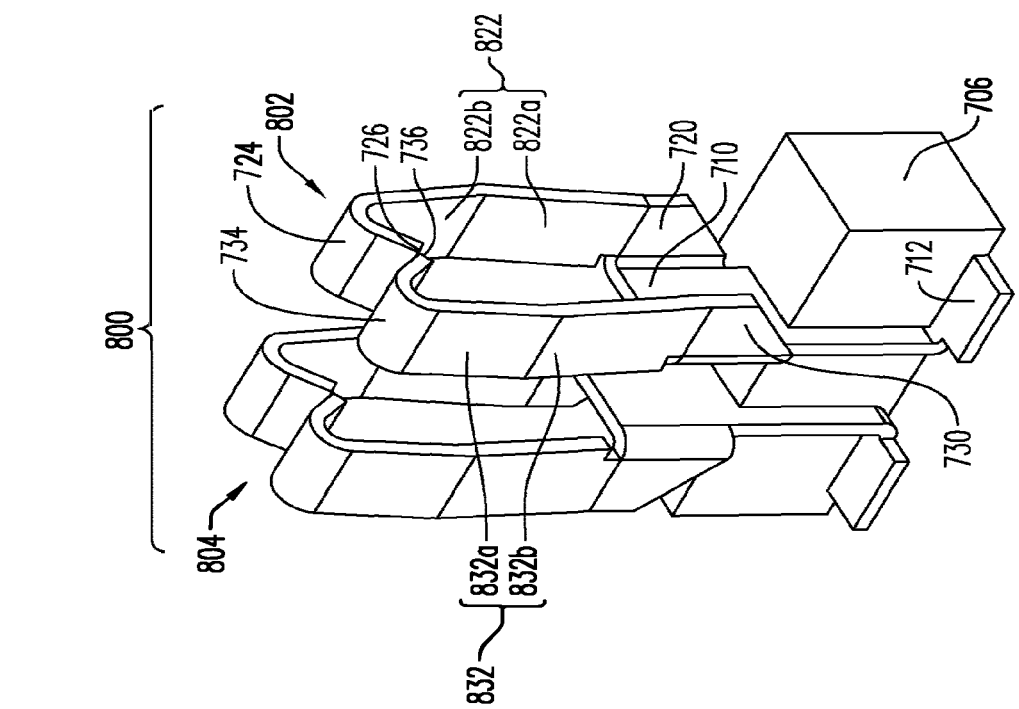
FIG. 19 is a perspective view of a fuse connector assembly according to an exemplary embodiment.
Figure 18:
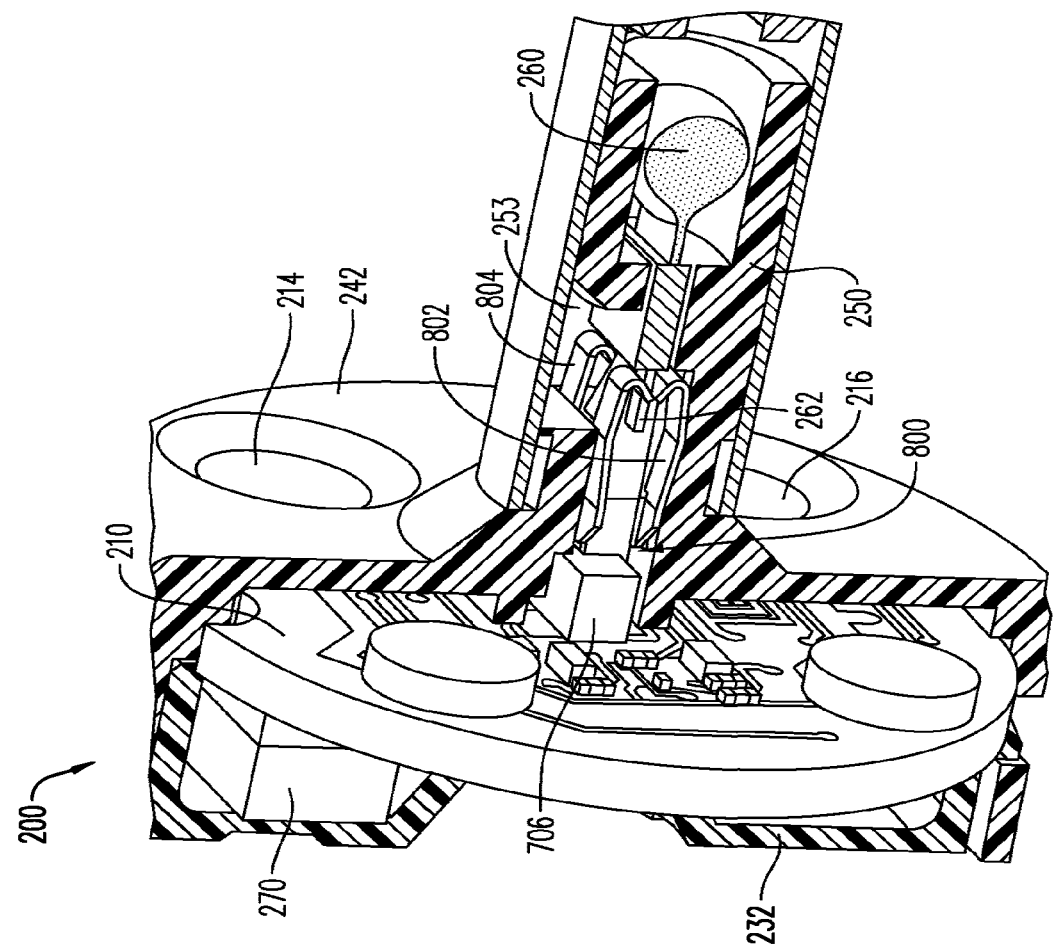
FIG. 18 is a cutaway perspective view of an initiator head according to an exemplary embodiment.

FIGS. 18-19 show an exemplary embodiment in which the circuit board 210 is in electrical communication with the fuse 260 via a fuse connector assembly 800. The fuse connector assembly 800 is similar in many aspects to the fuse connector assembly 700; similar structures will be indicated with the same reference numerals, and detailed descriptions of these similar structures will be omitted. In the fuse connector assembly 800, the first arm portion 822 may include a first arm part 822a extending from the first base portion 720 and a second arm part 822b extending from the first arm part 822a. The second arm portion 832 may include a third arm part 832a extending from the first base portion 730 and a fourth arm part 832b extending from the first arm part 832a. Each of the first art part 822a and the third arm part 832a may be bent or inclined in a direction away from each other. Each of the second arm part 822b and the fourth arm part 832b may be bent or inclined in a direction toward each other.

FIGS. 2-7 shows an exemplary embodiment of an initiator 100. The initiator 100 may include an initiator head 200 and an initiator shell 300. The initiator head 200 may be similar in structure and function as described in detail above. The initiator shell 300 may be coaxial with the initiator head 200. In an exemplary embodiment, a head dimension X1 of the head 200 in a first direction perpendicular to the axial direction 302 may be larger than a shell dimension X2 in the first direction. According to an aspect, the initiator may be configured as an ignitor or a detonator, depending on the needs of the application.

In an exemplary embodiment, the initiator shell 300 may include a shell wall 310 and a shell crimp 312 crimped around the stem 250. The shell wall 310 may extend in the axial direction 302 and may be formed of a deep-drawn metal. Non-limiting examples of the metal used for the shell wall 310 may include aluminum, copper, steel, tin, or brass. Plastics may also be used a material for the shell wall 310. The shell wall 310 may define a shell interior 320. A primary explosive 322 may be provided within the shell interior 320. In an exemplary embodiment, the circuit board 210 may be configured to activate the primary explosive 322, and in some embodiments the primary explosive 322 and the secondary explosive 324, in response to a control signal received at the line-in terminal 212. For example, the primary explosive 322 may be arranged such that the fuse 260 is within an operable distance of the primary explosive 322. Being within an operable distance means that the fuse 260 is provided close enough to the primary explosive 322 that the primary explosive 322 is ignited and/or detonated when the fuse 260 is activated. In other words, by activating the fuse 260 in response to a control signal, the circuit board 210 may activate the primary explosive 322.

The secondary explosive 324 may abut the primary explosive 322 and seal the primary explosive 322 within a non-mass explosive (NME) body 330. The primary explosive 322 and the secondary explosive 324 may have a total thickness of about 3 mm to about 30 mm in an exemplary embodiment. Alternatively, the total thickness may be about 3 mm to about 10 mm. The secondary explosive 324 may be configured as a layer of an explosive material. According to an exemplary embodiment, the primary explosive 322 may include at least one of lead azide, silver azide, lead styphnate, tetracene, nitrocellulose, BAX, and a lead azide free primary explosive as described in USPGP 2019/0256438, herein incorporated by reference.

Each of the primary explosive 322 and the secondary explosive 324 may have a safe temperature rating of above 150° C. (with the exception of PETN, which has a rating of approximately 120° C.). The secondary explosive 324 may include a material that is less sensitive to initiation, as compared to the primary explosive 322. The secondary explosive 324 may include at least one of PETN, RDX, HMX, HNS and PYX. In an embodiment, the secondary explosive 324 may be less sensitive to initiation than PETN.

The primary explosive 322 and the secondary explosive 324 may be provided within the NME body 330. The NME body 330 may help to avoid an unintentional initiation of the primary explosive 322 or the main load explosive 332 by an external mechanical force. The NME body 330 may be composed of an electrically conductive, electrically dissipative or electrostatic discharge (ESD) safe synthetic material. According to an exemplary embodiment, the non-mass-explosive body 330 may be formed of a metal, such as cast-iron, zinc, machinable steel or aluminum. Alternatively, the NME body 330 may be formed from a plastic material. While the NME body 330 may be made using various processes, the selected process utilized for making the NME body 330 is based, at least in part, by the type of material from which it is made. For instance, when the NME body 330 is made from a plastic material, the selected process may include an injection molding process. When the NME body 330 is made from a metallic material, the NME body 330 may be formed using any conventional CNC machining or metal casting processes.

The initiator shell 300 may further include a main load explosive 332 provided adjacent the primary explosive 322, and in embodiment including a secondary explosive 324, adjacent the secondary explosive 324. The main load explosive 332 includes compressed secondary explosive materials. According to an aspect, the main load explosive 332 may include one or more of cyclotrimethylenetrinitramine (RDX), octogen/cyclotetramethylenetetranitramine (HMX), hexanitrostilbene (HNS), pentaerythritol tetranitrate (PETN), 2,6-Bis(picrylamino)-3,5-dinitropyridine (PYX), and 1,3,5-triaminio-2,4,6-trinitobenzene (TATB). The type of explosive material used may be based at least in part on the operational conditions in the wellbore and the temperature downhole to which the explosive may be exposed.

Figure 11:
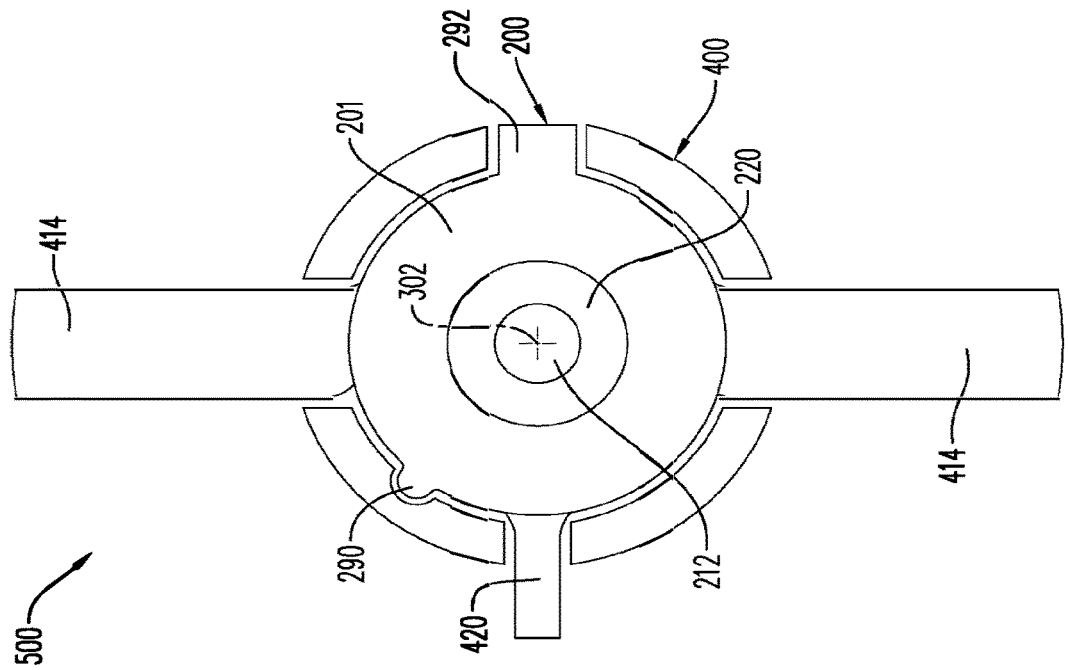
FIG. 11 is a plan view of an initiator head and initiator holder according to an exemplary embodiment.
Figure 13:
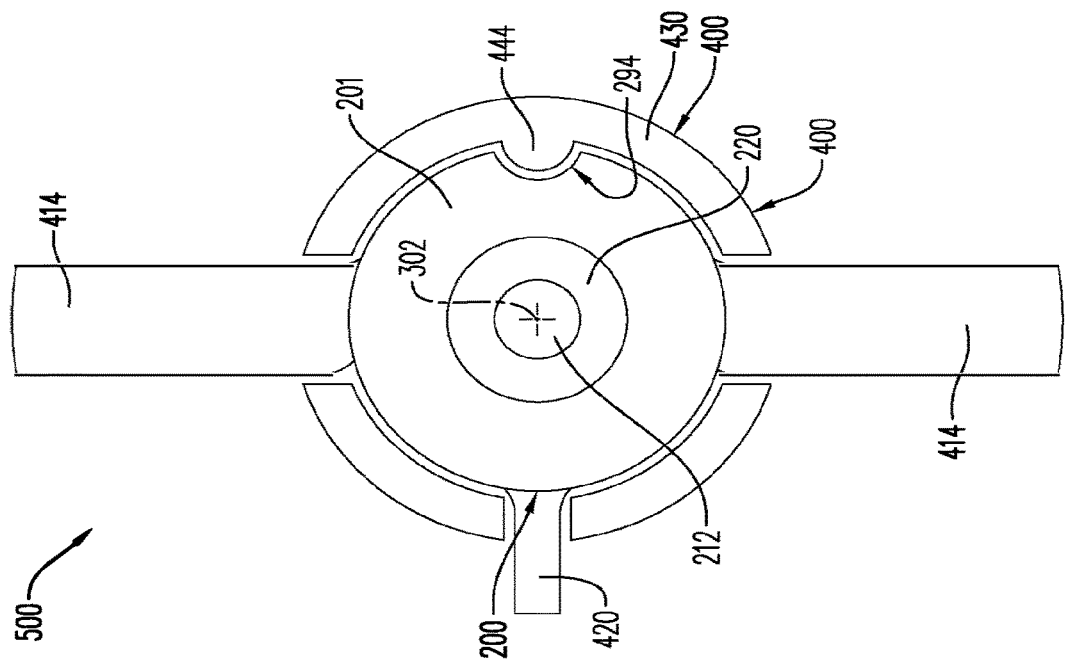
FIG. 13 is a plan view of an initiator head an initiator holder according to an exemplary embodiment.
Figure 12:
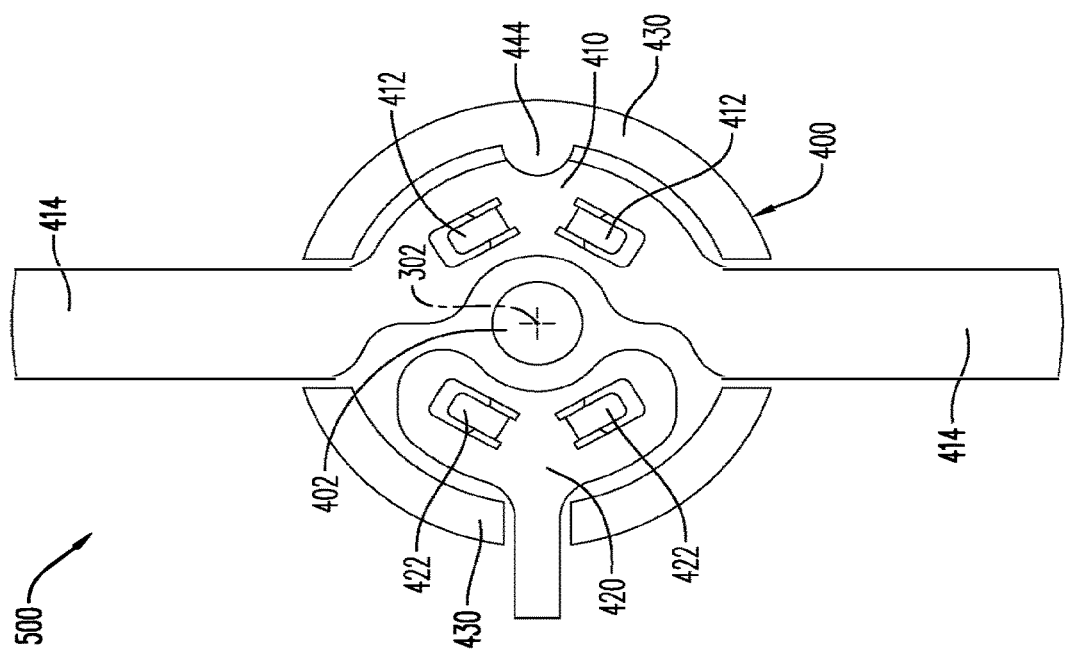
FIG. 12 is a plan view of an initiator holder and terminals according to an exemplary embodiment.

In an exemplary embodiment shown in FIGS. 11-13, an exterior shape of the housing 201 may be rotationally asymmetric with respect to the axial direction 302. In other words, when looking along the axial direction 302, a periphery of the housing 201 may be shaped such that an orientation of the housing 201 is unique for each angle around the axial direction. For example, FIG. 11 shows that a key protrusion 290 or a key protrusion 292 may be formed on a periphery of the housing 201, and FIG. 13 shows that a key recess 294 may be formed on a periphery of the housing 201. As is clear from FIG. 11 and FIG. 13, there are no possible rotations of the housing 201 where the housing 201 has a matching profile. In other words, an exterior profile of housing 201 is unique for each possible rotation angle. It will be understood that the size, shape, and/or number of key protrusions and/or key recesses is not limited to what is shown in FIG. 11 and FIG. 13, as long as they create a rotational asymmetry in the shape of housing 201. Additionally, key protrusions and key recesses may be combined together on a single housing 201.

FIGS. 8-13 illustrate an exemplary embodiments of an initiator system 500. The initiator system 500 may include an initiator holder 400 (see FIGS. 10-13) and an initiator 100 received within the initiator holder 400.

Figure 9:
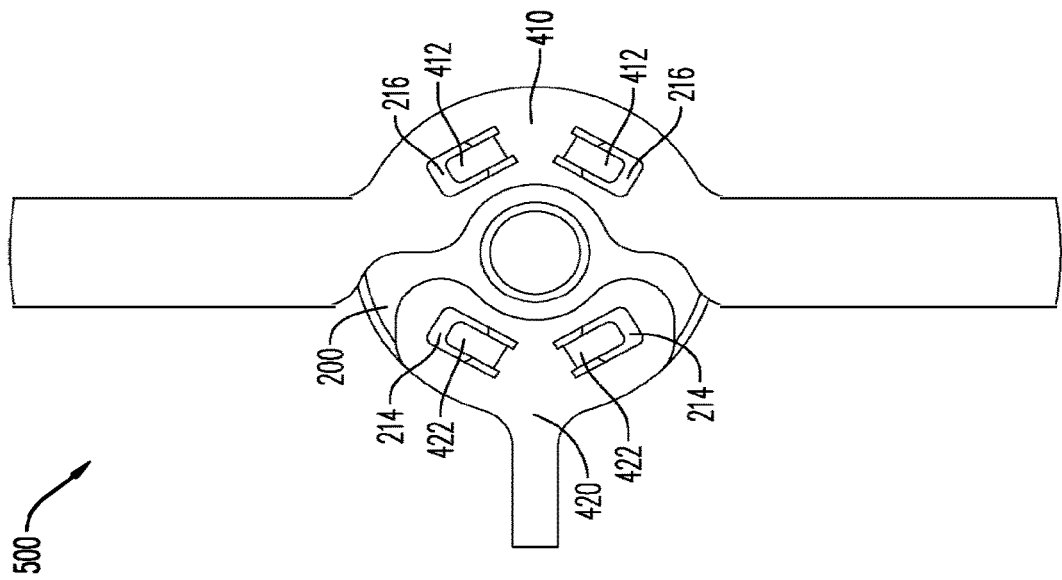
FIG. 9 is a bottom up view of an initiator engaged with terminals according to an exemplary embodiment.
Figure 8:
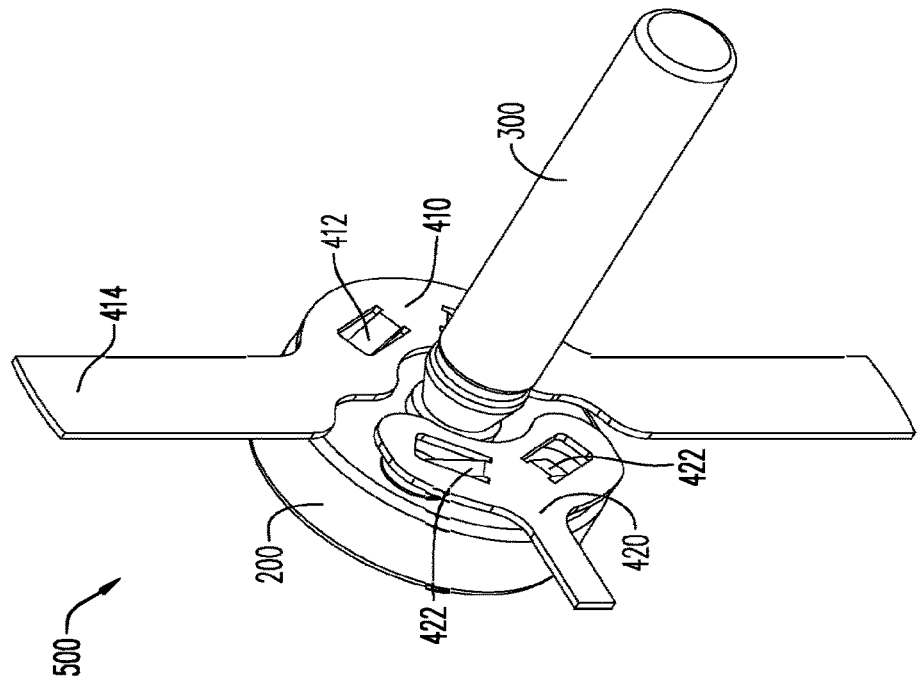
FIG. 8 is a perspective view of an initiator engaged with terminals according to an exemplary embodiment.
Figure 10:
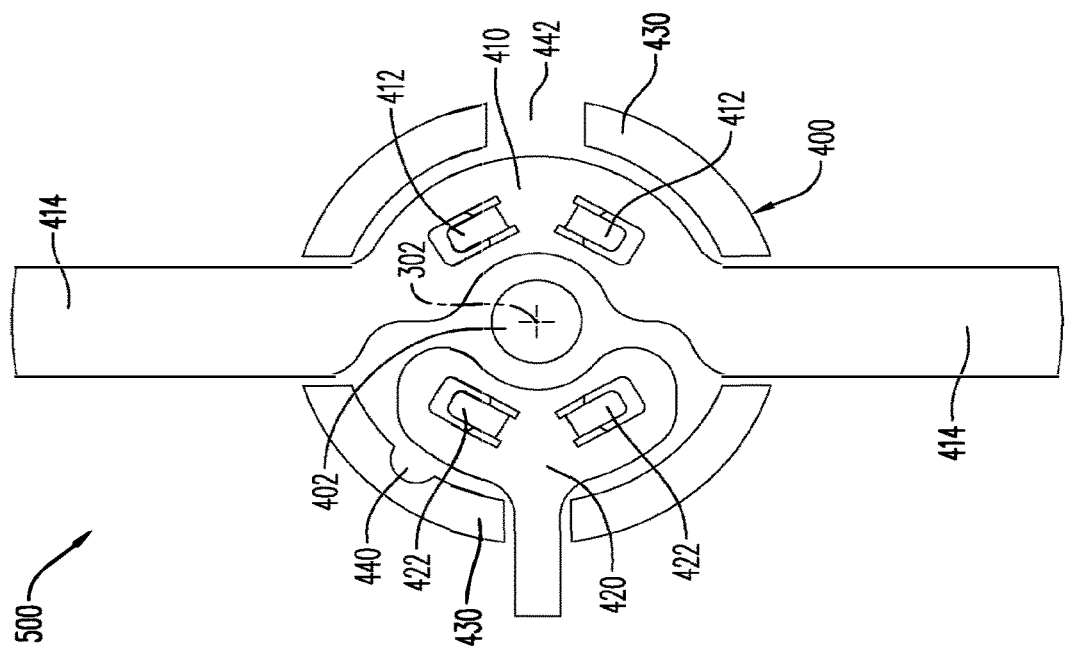
FIG. 10 is a plan view of an initiator holder and terminals according to an exemplary embodiment.

As seen in FIGS. 8-10, an exemplary embodiment of the initiator holder 400 may include a holder ground terminal 410. The holder ground terminal 410 may include a holder ground contact 412. In an exemplary embodiment shown in FIGS. 8-9, the holder ground contact 412 may be punched from the material of the holder ground terminal 410 and then bent to a side of the holder ground terminal 410. This may help to impart a spring-loaded action to the holder ground contact 412 and bias the holder ground contact 412 in a direction toward the initiator head 200, thereby helping to ensure a more secure electrical contact between the ground terminal 216 and the holder ground contact 412. In other words, when the initiator 100 is positioned within the initiator holder 400, the holder ground contact 412 may be in electrical communication with the ground terminal 216 (see FIG. 9) via contact.

FIGS. 8-10, and FIG. 12 show that, in an exemplary embodiment of the holder ground terminal 410, the holder ground contact 412 may be one of a plurality of holder ground contacts 412. As seen in FIG. 9, if the initiator head 200 includes a plurality of ground terminals 216, then the plurality of holder ground contacts 412 provided a layer of redundancy for establishing a connection to ground. For example, even of one pair the ground terminals 216 and the holder ground contacts 412 fails to establish a secure electrical connection, a second pair of the ground terminals 216 and the holder ground contacts 412 may form a secure electrical connection.

As further seen in FIGS. 10-13, the initiator holder 400 may further include a holder ground bar 414 extending from the holder ground terminal 410. The holder ground bar 414 may contact a ground when the initiator holder 400 is received within a perforating gun. In other words, the holder ground terminal 410 may be in electrical communication with ground, for example through the holder ground bar 414.

As further seen in the exemplary embodiment of FIG. 10, the initiator holder 400 may include a through-wire terminal 420. The through-wire terminal 420 may include a through-wire contact 422. In an exemplary embodiment shown in FIGS. 8-9, the through wire contact 422 may be punched from the material of the through-wire terminal 420 and then bent to a side of the through-wire terminal 420. This may help to impart a spring-loaded action to the through-wire contact 422 and bias the through-wire contact 422 in a direction toward the initiator head 200, thereby helping to ensure a more secure electrical contact between the through-wire terminal 214 and the through-wire contact 414. In other words, when the initiator 100 is positioned within the initiator holder 400, the through-wire contact 422 may be in electrical communication with the through-wire terminal 214 via contact.

FIGS. 8-9, FIG. 10, and FIG. 12 show that, in an exemplary embodiment of the through-wire terminal 420, the through-wire contact 422 may be one of a plurality of through-wire contacts 422. As seen in FIG. 9, if the initiator head 200 includes a plurality of through-wire terminals 214, then the plurality of through-wire contacts 422 provided a layer of redundancy for establishing an electrical connection. For example, even of one pair the through-wire terminals 214 and the through-wire contacts 422 fails to establish a secure electrical connection, a second pair of the through-wire terminals 214 and the through-wire contacts 412 may form a secure electrical connection.

FIGS. 10-13 show exemplary embodiments of an initiator system 500 comprising a key system configured to ensure a correct alignment between the initiator 100 and the initiator holder 400. For example, when an initiator 100 is received into holder hole 402, the initiator 100 may rotate around the axial direction 302. This could create a misalignment between the through-line terminal(s) 214 and the ground terminal(s) 216 of the initiator head 200 and the through-line contact(s) 422 and holder ground contact(s) 412 of the holder 400. Accordingly, a key system may be configured to rotationally fix the initiator head 200 relative to the holder 400, thereby helping to ensure a correct alignment between the initiator 100 and the initiator 400. In this context, a correct alignment may be an alignment in which the through-line terminal(s) 214 and the ground terminal(s) 216 of the initiator head 200 are correspondingly aligned with the through-line contact(s) 422 and holder ground contact(s) 412 of the holder 400.

FIGS. 10-11 show an exemplary embodiment in which recesses 440, 442 may be formed in an outer peripheral wall 430 of the holder 400. For example, a first holder recess 440 may be formed partially through the outer peripheral wall 430. Alternatively or additionally, a second holder recess 442 may be formed through the entire thickness of the outer peripheral wall 430. As seen in FIG. 11, an exemplary embodiment of the housing 201 of the initiator head 200 may include a first key protrusion 290 formed on an outer periphery of housing 201. The first key protrusion 290 may be shaped and sized to fit within the first holder recess 440. Alternatively or additionally, a second key protrusion 292 may be formed on an outer periphery of the housing 201. The second key protrusion 292 may be shaped and sized to fit within the second holder recess 442.

FIGS. 12-13 show an exemplary embodiment in which protrusions may be formed in the outer peripheral wall 430 of the holder 400. For example, a holder protrusion 444 may extend radially inwardly from the outer peripheral wall 430. As seen in FIG. 13, an exemplary embodiment of the housing 201 of the initiator head 200 may include a housing recess 294 corresponding to the holder protrusion 444.

It will be understood from the exemplary embodiments shown in FIGS. 10-13 that the number, size, and shape of recesses and protrusions may be varied to achieve the same effect, as long as the recesses and their corresponding protrusions are rotationally asymmetric around the longitudinal axis. For example, a single recess and a single protrusion may be sufficient to achieve rotational asymmetry. Alternatively, a plurality of recesses of corresponding protrusions may be used. Further, it will be understood that recesses and protrusions may be mixed on a single piece. For example, an exemplary embodiment of the housing 201 may include both a protrusion and a recess, corresponding to a complementary recess and protrusion on the initiator holder 400.

This disclosure, in various embodiments, configurations and aspects, includes components, methods, processes, systems, and/or apparatuses as depicted and described herein, including various embodiments, sub-combinations, and subsets thereof. This disclosure contemplates, in various embodiments, configurations and aspects, the actual or optional use or inclusion of, e.g., components or processes as may be well-known or understood in the art and consistent with this disclosure though not depicted and/or described herein.

The phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together.

In this specification and the claims that follow, reference will be made to a number of terms that have the following meanings. The terms "a" (or "an") and "the" refer to one or more of that entity, thereby including plural referents unless the context clearly dictates otherwise. As such, the terms "a" (or "an"), "one or more" and "at least one" can be used interchangeably herein. Furthermore, references to "one embodiment", "some embodiments", "an embodiment" and the like are not intended to be interpreted as excluding the existence of additional embodiments that also incorporate the recited features. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Terms such as "first," "second," "upper," "lower," etc. are used to identify one element from another, and unless otherwise specified are not meant to refer to a particular order or number of elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

As used in the claims, the word "comprises" and its grammatical variants logically also subtend and include phrases of varying and differing extent such as for example, but not limited thereto, "consisting essentially of" and "consisting of." Where necessary, ranges have been supplied, and those ranges are inclusive of all sub-ranges therebetween. It is to be expected that the appended claims should cover variations in the ranges except where this disclosure makes clear the use of a particular range in certain embodiments.

The terms "determine," "calculate," and "compute," and variations thereof, as used herein, are used interchangeably and include any type of methodology, process, mathematical operation or technique.

This disclosure is presented for purposes of illustration and description. This disclosure is not limited to the form or forms disclosed herein. In the Detailed Description of this disclosure, for example, various features of some exemplary embodiments are grouped together to representatively describe those and other contemplated embodiments, configurations, and aspects, to the extent that including in this disclosure a description of every potential embodiment, variant, and combination of features is not feasible. Thus, the features of the disclosed embodiments, configurations, and aspects may be combined in alternate embodiments, configurations, and aspects not expressly discussed above. For example, the features recited in the following claims lie in less than all features of a single disclosed embodiment, configuration, or aspect. Thus, the following claims are hereby incorporated into this Detailed Description, with each claim standing on its own as a separate embodiment of this disclosure.

Advances in science and technology may provide variations that are not necessarily express in the terminology of this disclosure although the claims would not necessarily exclude these variations.

What is claimed is:

1. An initiator head comprising:
  a housing extending in an axial direction;
  a circuit board provided in an interior space of the housing, a thickness direction of the circuit board being substantially parallel with the axial direction;
  a line-in terminal provided on a first side of the housing in the axial direction and accessible from an exterior of the housing, the line-in terminal being in electrical communication with the circuit board; and
  a fuse displaced from the circuit board in the axial direction, the fuse being in electrical communication with the circuit board; wherein
  the circuit board is configured to activate the fuse in response to a control signal received at the line-in terminal.

2. The initiator head of claim 1, further comprising:
  a line-out terminal provided on a second side of the housing in the axial direction opposite to the first side;
  wherein the line-out terminal is in electrical communication with the circuit board.

3. The initiator head of claim 2, wherein:
  the line-out terminal is one of a plurality of line-out terminals; and
  each line-out terminal of the plurality of line-out terminals is in electrical communication with the circuit board.

4. The initiator head of claim 1, further comprising:
  a ground terminal provided on a second side of the housing in the axial direction opposite to the first side;
  wherein the ground terminal is in electrical communication with the circuit board.

5. The initiator head of claim 4, wherein:
  the ground terminal is one of a plurality of ground terminals; and
  each ground terminal of the plurality of ground terminals is in electrical communication with the circuit board.

6. The initiator head of claim 1, further comprising a key protrusion extending radially outward from the housing.

7. The initiator head of claim 1, wherein the housing comprises:
  a first housing piece comprising:
    a first plate; and
    a first outer peripheral wall extending from the first plate in the axial direction;
  a second housing piece comprising:
    a second plate; and
    a second outer peripheral wall extending from the second plate in the axial direction;
  wherein the first outer peripheral wall and the second outer peripheral wall overlap in the axial direction; and
  the circuit board is provided between the first plate and the second plate in the axial direction.

8. The initiator head of claim 7, wherein first plate comprises a sloped wall that slopes toward the circuit board.

9. The initiator head of claim 8, wherein:
  a first housing piece radius of the first housing piece is smaller than a second housing piece radius of a second housing piece;
  the first housing piece is received within the second housing piece with the first outer peripheral wall being provided between the first plate and the second plate in the axial direction, thereby forming the interior space between the first plate and the second plate in the axial direction.

10. The initiator head of claim 1, wherein the housing further comprises:
  a stem extending in the axial direction, the stem comprising;
    a stem outer peripheral wall;
    a stem cavity provided radially inward from the stem outer peripheral wall;
    a first discharge channel connecting the stem cavity and the interior space of the housing; and
    a second discharge channel connecting the stem cavity and the interior space of the housing.

11. The initiator head of claim 10, further comprising:
  a first discharge terminal in electrical communication with the circuit board and extending into the first discharge channel;
  a second discharge terminal in electrical communication with the circuit board and extending into the second discharge channel; wherein
  the fuse comprises:
    a first fuse terminal in electrical communication with the first discharge terminal; and
    a second fuse terminal in electrical communication with the second discharge terminal; and
  the circuit board is configured to activate the fuse in response to the control signal by discharging a stored voltage across the first fuse terminal and the second fuse terminal.

12. The initiator head of claim 1, further comprising a surface mounted component mounted on the circuit board.

13. An initiator comprising:
  an initiator shell extending in an axial direction, the initiator shell comprising:
    a shell wall defining a shell interior; and
    an explosive provided within the shell interior; and
  a head connected to the initiator shell at a first end of the initiator shell in the axial direction, the head comprising:
    a housing extending in the axial direction;
    a circuit board provided in an interior space of the housing, a thickness direction of the circuit board being substantially parallel with the axial direction; and a line-in terminal accessible from an exterior of the housing, the line-in terminal being in electrical communication with the circuit board;

wherein the circuit board is configured to activate the explosive in response to a control signal received at the line-in terminal.

14. The initiator of claim 13, wherein the head further comprises:
a stem extending in the axial direction, the stem comprising;
a stem outer peripheral wall;
a stem cavity provided radially inward from the stem outer peripheral wall;
a first discharge channel connecting the stem cavity and the interior space of the head; and
a second discharge channel connecting the stem cavity and the interior space of the head; and
a fuse provided in the stem cavity and in electrical communication with the circuit board, the fuse being within an operable distance of the explosive.

15. An initiator system comprising:
an initiator holder; and
an initiator received within the initiator holder; the initiator comprising:
an initiator shell extending in an axial direction, the initiator comprising:
a shell wall formed in a hollow tube shape defining a shell interior; and
an explosive provided within the shell interior;
a head connected to the initiator shell at a first end of the initiator shell in the axial direction, the head comprising:
a housing extending in the axial direction;
a circuit board provided in an interior space of the housing, a thickness direction of the circuit board being substantially parallel with the axial direction; and
a line-in terminal provided on a first side of the housing in the axial direction and accessible from an exterior of the housing, the line-in terminal being in electrical communication with the circuit board;

wherein the circuit board is configured to activate the explosive in response to a control signal received at the line-in terminal.

16. The initiator system of claim 15, further comprising:
a line-out terminal provided on a second side of the head in the axial direction opposite to the first side; and
a head ground terminal provided on the second side of the head;
wherein the line-out terminal is in electrical communication with the circuit board; and
the head ground terminal is in electrical communication with the circuit board.

17. The initiator system of claim 16, wherein the initiator holder comprises:
a holder ground bar comprising a holder ground contact; and
a through-wire terminal comprising a through-wire contact; wherein
when the initiator is positioned within the initiator holder, the holder ground contact is in electrical communication with the head ground terminal; and
when the initiator is positioned within the initiator holder, the through-wire contact is in electrical communication with the line-out terminal.

18. The initiator system of claim 17, wherein:
the holder ground contact is a spring-loaded holder ground contact biased toward the head of the initiator; and
the through-wire contact is a spring-loaded through-wire contact biased toward the head of the initiator.

19. The initiator system of claim 15, further comprising a key system configured to ensure a correct alignment between the initiator and the initiator holder.

20. The initiator system of claim 19, wherein the key system comprises a key protrusion provided on the head and a key recess provided on the initiator holder.

* * * * *